United States Patent
Sundaresan et al.

(10) Patent No.: US 12,432,949 B2
(45) Date of Patent: Sep. 30, 2025

(54) MANUFACTURE OF POWER MOSFETs

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSic Semiconductor Inc., Dulles, VA (US)

( * ) Notice: Subject to any disclaimer, the term of this patent is extended or adjusted under 35 U.S.C. 154(b) by 0 days.

(21) Appl. No.: 18/398,575

(22) Filed: Dec. 28, 2023

(65) Prior Publication Data

US 2024/0128348 A1 Apr. 18, 2024

Related U.S. Application Data

(60) Continuation of application No. 17/342,761, filed on Jun. 9, 2021, now Pat. No. 11,901,432, which is a
(Continued)

(51) Int. Cl.
*H10D 62/832* (2025.01)
*H01L 21/04* (2006.01)
(Continued)

(52) U.S. Cl.
CPC ....... *H10D 12/031* (2025.01); *H01L 21/0465* (2013.01); *H01L 21/0475* (2013.01); *H01L 21/0485* (2013.01); *H01L 21/049* (2013.01); *H10D 30/0295* (2025.01); *H10D 30/66* (2025.01); *H10D 62/155* (2025.01); *H10D 62/393* (2025.01); *H10D 62/8325* (2025.01); *H10D 64/01* (2025.01);
(Continued)

(58) Field of Classification Search
CPC .......... H01L 29/66068; H01L 29/1095; H01L 29/1608; H01L 29/401; H01L 29/41741; H01L 29/45; H01L 29/4916; H01L 29/66727; H01L 29/7802
See application file for complete search history.

(56) References Cited

U.S. PATENT DOCUMENTS

| 2003/0068864 A1* | 4/2003 | Il-Yong | H01L 29/7813 |
| | | | 438/243 |
| 2014/0183622 A1* | 7/2014 | Lin | H01L 29/0878 |
| | | | 438/237 |

(Continued)

*Primary Examiner* — Samuel A Gebremariam
(74) *Attorney, Agent, or Firm* — FisherBroyles, LLP

(57) ABSTRACT

An embodiment relates to a method obtaining a silicon carbide wafer comprising a first conductivity type substrate and a first conductivity type drift layer, forming a second conductivity type first well region within the first conductivity type drift layer, forming a first conductivity type source region within the second conductivity type first well region, forming a second conductivity type plug region under the first conductivity type source region, forming a gate oxide layer, forming a patterned gate metal layer, depositing an interlevel dielectric (ILD) layer, forming a first patterned mask layer on top of the ILD layer, and etching the ILD layer and the first conductivity type source region using the first patterned mask layer, and forming a silicide layer, wherein the silicide layer is in contact with a vertical sidewall of the first conductivity type source region and at-least one second conductivity type region.

9 Claims, 47 Drawing Sheets

Related U.S. Application Data division of application No. 16/431,655, filed on Jun. 4, 2019, now Pat. No. 11,075,277.

(51) Int. Cl.
*H10D 12/01* (2025.01)
*H10D 30/01* (2025.01)
*H10D 30/66* (2025.01)
*H10D 62/13* (2025.01)
*H10D 62/17* (2025.01)
*H10D 64/01* (2025.01)
*H10D 64/23* (2025.01)
*H10D 64/62* (2025.01)
*H10D 64/66* (2025.01)

(52) U.S. Cl.
CPC ........... *H10D 64/252* (2025.01); *H10D 64/62* (2025.01); *H10D 64/661* (2025.01)

(56) References Cited

U.S. PATENT DOCUMENTS

| | | |
|---|---|---|
| 2015/0001553 A1 | 1/2015 | Kudou et al. |
| 2015/0084120 A1* | 3/2015 | Weber ................ H01L 29/7811 |
| | | 257/329 |
| 2016/0118258 A1 | 4/2016 | Stum et al. |
| 2017/0236914 A1* | 8/2017 | Fujimoto ................ H01L 29/78 |
| | | 257/77 |
| 2018/0350943 A1 | 12/2018 | Bartolf et al. |

* cited by examiner

MANUFACTURE OF POWER MOSFETs

RELATED APPLICATION

This application is a continuation application of U.S. patent application Ser. No. 17/342,761, filed Jun. 9, 2021, titled "DESIGN AND MANUFACTURE OF SELF-ALIGNED POWER DEVICES," which is a divisional application of U.S. patent application Ser. No. 16/431,655, filed Jun. 4, 2019 (now U.S. Pat. No. 11,075,277, issued on Jul. 27, 2021), entitled "DESIGN AND MANUFACTURE OF SELF-ALIGNED POWER DEVICES", which is incorporated herein by reference in its entirety.

FIELD OF THE INVENTION

This invention relates to power semiconductor devices using a vertical silicon carbide (SiC) double-implantation metal oxide semiconductor field-effect transistor (DMOSFET). A power metal oxide semiconductor field-effect transistor (MOSFET) is a specific type of MOSFET designed to handle significant power levels.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV) and hence, SiC has a higher blocking voltage than Si. SiC has a higher breakdown electric field ($3 \times 10^6$ V/cm to $5 \times 10^6$ V/cm) compared to Si (breakdown electric field for Si is $0.3 \times 10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial market place, several key reliability issues have not been fully resolved." [source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst]

Due to the limited (10-25 cm2/Vs) MOS channel mobility achievable on the state-of-the-art SiC planar DMOSFETs, it is necessary to form MOS channels with sub-micron channel lengths so that the overall ON resistance of the power MOSFET is not significantly degraded. "[I]f the p-well regions and N+ source regions were formed using different masks, the misalignment of two masks would result in a different channel length on each side of the cell. To avoid the decrease of threshold voltage (Vth) and degrade the breakdown voltage (Vbr), the N+ mask is in a self-aligned fashion with respect to the P-well." [source: Design and Fabrication of 1.2 kV 4H-SiC DMOSFET by R. Huang et al. published in 2016 13th China International Forum on Solid State Lighting: International Forum on Wide Bandgap Semiconductors China (SSLChina: IFWS)]. The MOSFET channel region is formed as a result of the offset between the p-well and the N+ source regions in a DMOSFET structure. If the p-well and N+ source regions are formed by two separate masking steps, there will inevitably be a certain amount of lithographic misalignment between these levels, resulting in different (or asymmetric) MOS channel lengths on the two sides of the unit cell. The lithographic misalignment between two masking levels using projection lithography techniques typically used in high-volume semiconductor manufacturing can range from +/−0.05 µm to +/−0.2 µm or greater, which sets a lower limit on the practically realizable MOS channel lengths without significant asymmetry. For a target channel length of 0.5 µm, a +/−0.2 µm mis-alignment between the N+ source and p-well masking steps can result in a MOS channel length of 0.3 µm on one side of the unit cell and a MOS channel length of 0.7 µm on the other side of the unit cell. While the ON resistance of the MOSFET is increased at higher MOS channel lengths, lower than optimal MOS channel lengths can result in undesirable effects such as gate threshold voltage (Vth) degradation and other short-channel effects such as drain-induced barrier lowering (DIBL).

Self-aligned techniques for eliminating the misalignment between p-well and N+ source regions have been proposed in the literature. Self-aligned MOS channel formation with channel length defined by sidewall spacer deposition and etching is one such technique. FIG. 1 is the prior art process flow of self-aligned implantation technique with channel length defined by sidewall spacer deposition and etching as reported by R. Huang et al. in "Design and Fabrication of 1.2 kV 4H-SiC DMOSFET".

SUMMARY OF INVENTION

An embodiment relates to a method comprising: obtaining a SiC substrate comprising a N+ substrate and a N− drift layer; depositing a first hard mask layer on the SiC substrate and patterning the first hard mask layer; performing a p-type implant to form a first p-well region; depositing a second hard mask layer on top of the first hard mask layer; performing an etch back of at least a portion of the second hard mask layer to form a sidewall spacer; implanting N type ions to form a N+ source region that is self-aligned; and forming a MOSFET.

The method further comprises removing the first hard mask layer and the second hard mask layer; depositing a third hard mask layer on the SiC substrate and patterning the third hard mask layer; etching into the SiC substrate to form recessed source trench region within the SiC substrate which removes a part or entire N+ source region.

The method further comprises performing a p-type implant to form a P+ plug regions; wherein a combination of an appropriately located source trench and the P+ plug region enables proper grounding of the first p-well region within the MOSFET and removal of a parasitic N+ source region located in a peripheral region of the MOSFET and from under a gate pad region.

The method further comprises forming a P+ plug layer by a p-type implantation of a buried layer placed under a N+ source region; and dry etching a N+ source trench.

The method further comprises annealing, gate oxidation, depositing and patterning of a doped polysilicon layer to form a gate electrode, forming and patterning an interlevel dielectric layer, forming a nickel silicide formation for source or drain ohmic contacts, and forming a thick pad metal formation.

The method further comprises depositing a third hard mask layer and patterning of the third hard mask layer without removing the sidewall spacer; wherein the depositing and the patterning of the third mask layer is interspersed between performing the etch back of the at least the second hard mask layer to form the sidewall spacer and before the implanting the N type ions to form the N+ source region to prevent formation of the N+ source region in peripheral regions of the MOSFET.

The method further comprises forming a second p-well region using the same masking step used for the N+ source implant; and removing the first and second and third hard mask layer; wherein the second p-well region is deeper than the first p-well region.

The method further comprises depositing and patterning a fourth hard mask layer and performing p-type implant to form a P+ plug region in both an active region and a peripheral region of the device; and removing the fourth hard mask layer.

The method further comprises annealing, gate oxidation, depositing and patterning of a doped polysilicon layer to form a gate electrode, forming and patterning an interlevel dielectric layer.

The method further comprises patterning and etching an interlevel dielectric layer; etching a gate oxide layer; etching the SiC substrate; and forming a recessed source trench region within the SiC substrate at discrete locations in an active region of the MOSFET using a dual-purpose hard mask is used for both the patterning of the interlayer dielectric layer (ILD) layer and the forming the recessed source trench region.

The method further comprises forming a nickel silicide formation for source or drain ohmic contacts and forming a thick pad metal formation.

The method further comprises depositing a third hard mask layer and patterning of the third hard mask layer without removing the sidewall spacer; and removing the first, second and third hard mask layer; wherein the depositing and patterning of the third mask layer is interspersed between performing the etch back of the at least the second hard mask layer to form the sidewall spacer and before the implanting the N type ions to form the N+ source region to prevent formation of the N+ source region in peripheral regions of the MOSFET and prevent implantation of N+ source region in selected regions in active areas of device to enable ohmic contact to the first p-well region or a P+ plug region without the intervening N+ source region.

The method further comprises depositing and patterning a fourth mask layer; performing a p-type implant to form a P+ plug region in both an active region of the MOSFET and a peripheral region of the MOSFET.

The method further comprises annealing, gate oxidation, depositing and patterning of a doped polysilicon layer to form a gate electrode, forming and patterning an interlevel dielectric layer; forming a nickel silicide formation for source or drain ohmic contacts, and forming a thick pad metal formation.

The method further comprises depositing a third hard mask layer and patterning of the third hard mask layer without removing the sidewall spacer; and removing the first, second and third hard mask layer; wherein the depositing and patterning of the third mask layer is interspersed between performing the etch back of the at least the second hard mask layer to form the sidewall spacer and before the implanting the N type ions to form the N+ source region to prevent formation of the N+ source region in peripheral regions of the MOSFET and prevent implantation of N+ source region in selected regions in active areas of device to enable ohmic contact to the first p-well region or a P+ plug region without the intervening N+ source region.

The method further comprises depositing and patterning a fourth mask layer; performing a p-type implant to form a P+ plug region in both an active region of the MOSFET and a peripheral region of the MOSFET.

The method further comprises annealing, gate oxidation, depositing and patterning of a doped polysilicon layer to form a gate electrode, forming and patterning an interlevel dielectric layer; forming a nickel silicide formation for source or drain ohmic contacts, and forming a thick pad metal formation.

A method comprising: obtaining a SiC substrate comprising a N+ substrate and a N-drift layer; depositing a first hard mask layer on the SiC substrate and patterning the first hard mask layer; subsequently implanting N type ions to form a N+ source region that is self-aligned; performing an etch back of at least the first hard mask layer to form a P-well region; and forming a MOSFET.

The method further comprises depositing a third hard mask layer on the SiC substrate and patterning the third hard mask layer; etching the SiC substrate to form a recessed source trench region within the SiC substrate, wherein the recessed source trench region removes a part or an entire N+ source region.

The method further comprises performing a p-type implant to form P+ plug regions; wherein a combination of the appropriately located source trench and the P+ plug region enables proper grounding of the p-well region within the MOSFET and removal of a parasitic N+ source region located in a peripheral region of the MOSFET and from under a gate pad region.

Additional embodiments relate to the MOSFET devices made in accordance with the abovementioned process steps.

An embodiment relates to a MOSFET device comprising: a SiC substrate comprising a N+ substrate and an N− drift layer; a first p-well region; a sidewall spacer; a N+ source region that is self-aligned; and a lower gate capacitance.

The MOSFET device further comprises a highly doped P+ plug region in a periphery of the MOSFET device, including under a gate pad and a gate bus region.

In an embodiment, the MOSFET device is configured to suppress a false turn-on of the MOSFET device during a switching transition due to lowering of a threshold voltage caused by a body biasing effect.

In an embodiment, the MOSFET device has a maximum dV/dt rating that is higher than that of a comparative MOSFET device that does not have the highly doped P+ plug region in the periphery of the MOSFET device.

DETAILED DESCRIPTION

Definitions and General Techniques

Figure 1:
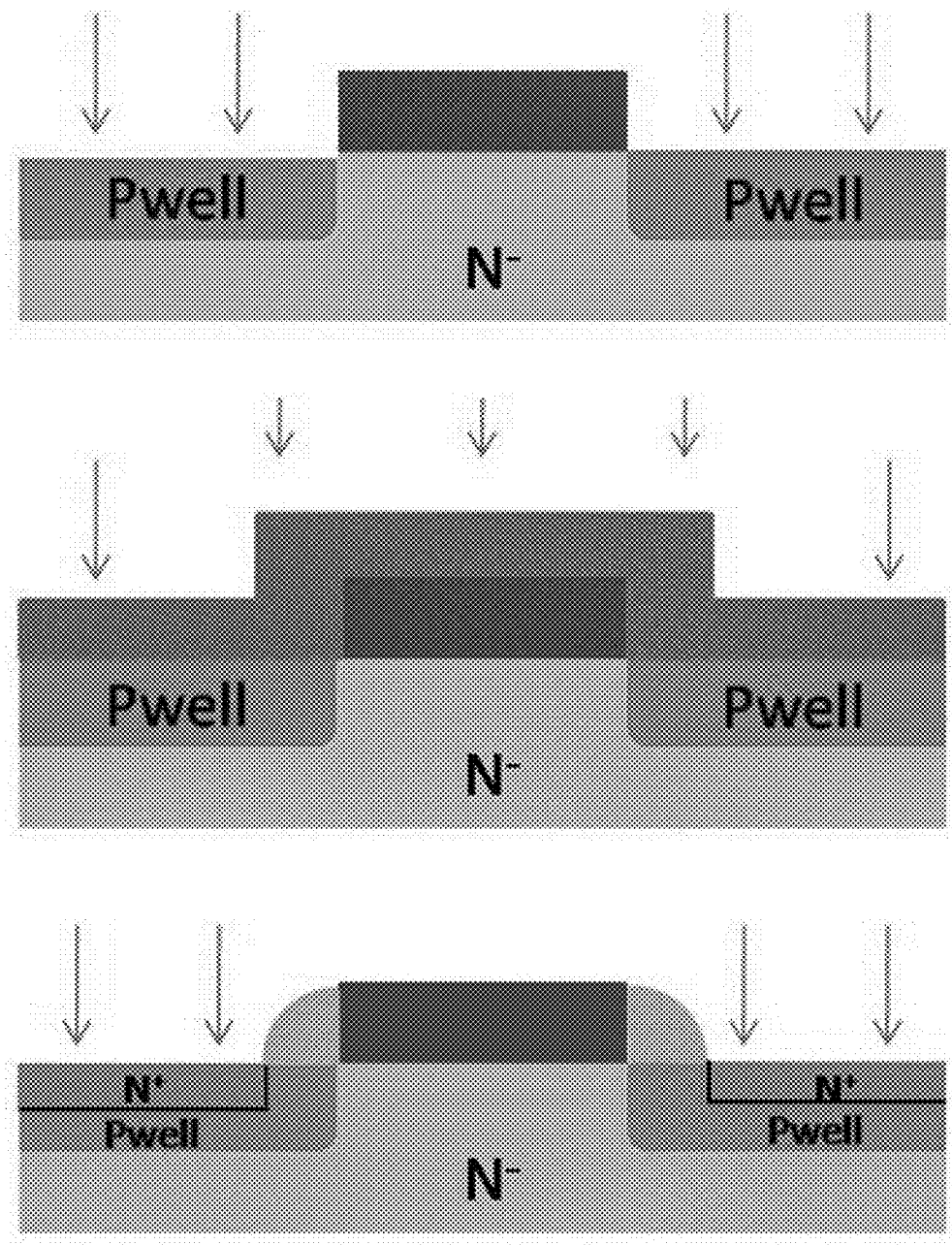
FIG. 1 shows the prior art SiC DMOSFET process flow for self-aligned MOS channel formation.

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C-SiC, 4H-SiC, 6H-SiC. Presently 4H-SiC is used in power device manufacturing.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four-terminal device with source (S), gate (G), drain (D) and body (B) terminals. The body of the MOSFET is frequently connected to the source terminal so making it a three-terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor, The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "die" as used herein refers to a tiny piece of semiconductor material, separated from a semiconductor slice, on which one or more active electronic components are formed. It is sometimes called a chip.

The term "sinker" as used herein refers to deep implanted regions at key locations within the DMOSFET structure The term "plug" as used herein refers to the structure used to ground the well and the source contact.

The term "drift layer" as used herein refers to lightly doped region to support the high voltage in power MOSFET The term "well" used herein refers to certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "source interconnect metallization" as used herein refers to interconnection metallization that interconnects many MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a non-conductor of electricity, otherwise known as an insulator.

The term "mobility" as used herein refers to the facility with which carriers move through a semiconductor when subjected to an applied electric field. Electrons and holes typically have different mobilities in the same semiconductor.

The term "RIE" as used herein refers to reactive ion etching which is an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it.

The term "ILD" as used herein refers to interlayer dielectric a dielectric material used to electrically separate closely spaced interconnect lines arranged in several levels (multilevel metallization) in an advanced integrated circuit.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

The term "LPCVD" as used herein refers to low pressure chemical vapor deposition technology that uses heat to initiate a reaction of a precursor gas on the solid substrate. This reaction at the surface is what forms the solid phase material.

The term "DIBL" as used herein refers to drain induced barrier lowering and is a short-channel effect in MOSFETs referring originally to a reduction of threshold voltage of the transistor at higher drain voltages. In a classic planar field-effect transistor with a long channel, the bottleneck in channel formation occurs far enough from the drain contact that it is electrostatically shielded from the drain potential by the combination of the substrate and gate, and so classically the threshold voltage was independent of drain voltage. In short-channel devices this is no longer true: The drain potential can gate the channel, and so a high drain voltage can open the bottleneck and turn on the transistor prematurely.

Embodiments relate to SiC DMOSFET power devices that can be used for fabricating self-aligned power MOSFETs.

An embodiment relates to increasing MOS channel density.

An embodiment relates to increasing effective field-effect mobility.

An embodiment relates to improved device reliability.

An embodiment relates to reducing ON resistance for a given chip size.

An embodiment relates to design and manufacturing of self-aligned power devices.

An embodiment relates to design and manufacturing MOS channels with sub-micron channel lengths.

An embodiment relates to removal of the parasitic N+ source region inadvertently formed in the periphery of the device.

An embodiment relates to proper grounding of the p-well region with the source ohmic contact in the active region of the device An embodiment relates to removal of the parasitic NPN transistor formed in active and peripheral regions of self-aligned power devices.

An embodiment relates to a combination of an appropriately located source trench and ion-implanted P+ plug region to enable proper grounding of the p-well region in the main active MOSFET region and removal of a parasitic N+ source region formed in the periphery of the MOSFET An embodiment relates to the formation of highly doped P+ plug regions in the periphery of the MOSFET, especially under the gate pad and gate bus regions.

An embodiment relates to the suppression of false turn-on of the MOSFET during fast switching transitions, at vulnerable locations, due to threshold voltage lowering by the body bias effect.

An embodiment relates to the improvement of the maximum dV/dt rating of the MOSFET.

An embodiment relates to the improvement of the maximum avalanche energy rating of the MOSFET.

An embodiment relates to a dedicated process step being utilized for masking the implantation of the N+ source region in the device periphery. The P+ plug region is formed first in this embodiment, while the source trench is created later on in the process at the ILD etch step.

An embodiment relates to a dedicated hard mask applied after the sidewall spacer is formed and before the N+ source implantation. This layer prevents the formation of the N+ source region in the device periphery and hence parasitic NPN structures in the device periphery are avoided.

An embodiment relates to a p-well region (P-Well #2) placed under the N+ source region and electrically connected to the main p-well region. The P-Well #2 provides additional electrical dose under the N+ source implant, to prevent reach-through breakdown, especially after the source trench formation.

An embodiment relates to a dedicated process step is utilized for masking the implantation of the N+ source region in the device periphery as well as the N+ source region in the middle of the unit cell in the active region to enable ohmic contact to the p-well region.

An embodiment relates to the formation of the segmented polysilicon gate metallization in the periphery of the device instead of a contiguous gate bus which will decrease the gate-body capacitance of the MOSFET.

An embodiment relates to the decrease of the gate capacitance of the MOSFET.

An embodiment relates to the increase of the switching speed of the MOSFET.

The embodiments described herein show novel techniques for design and manufacture of self-aligned SiC DMOSFET power devices. Due to limited mobility achievable on SiC planar DMOSFET it is necessary to form n-well channels that are submicron length, so that the overall power and ON resistance of the MOSFET are not degraded.

In a MOSFET, the channel region is formed due to the offset between the p-well and the N+ source region. If the p-well and the N+ source regions are formed by two separate masking steps, there can be lithographic misalignment, which will result in asymmetric MOSFET channel lengths on the two sides of a unit cell. In the embodiments described herein, to minimize this asymmetry in the MOS channel length, the p-well and the N+ source implant are done in a self-aligned fashion. There are several techniques proposed in the literature for achieving self-aligned MOSFET, including ones that use an oxide spacer approach to form self-aligned p-well and N+ source regions, with the N+ source implant under p-well implant.

The embodiments herein describe several innovative techniques during self-aligned channel formation that not only allow for the elimination of the misalignment error during manufacturing of SiC MOSFETs, but also allow the possibility of reducing the channel length. The channel lengths can be made smaller with narrow spacers. While the self-aligning process does provide the benefits of making an arbitrarily short channel length as well as eliminating misalignment, it does create some other problems with respect to the structure of the device outside the unit cells, because n+ regions are co-incident with the p-well regions.

In a conventional MOSFET where the p-well and the N+ source regions are not self-aligned there is a dedicated masking step that will be used for forming the N+ source implant. In the embodiments described herein, in a self-aligned process, there is no dedicated masking step performing the N+ source implant. There is a dedicated masking step performing the p-well implant and followed by depositing the spacer, then etching the spacer followed by implantation for realizing the N+ source region. Everywhere there is a p-well region, there will be N+ source implant as well. It is not desirable to have N+ source implant at the periphery of the device. It is important to terminate the device with just the p-type implant. The various embodiments described herein introduce techniques in which one can get rid of the N+ source implants in the periphery of the device and replace it with some other regions.

The active region of the MOSFET is where the current conduction happens while the periphery region of the MOSFET is where the edge termination of the device is provided to block any voltage. The gate pad and gate bus regions are also considered to be part of the peripheral regions of the MOSFET, for the purposes of describing the innovations in this document. In an embodiment described herein, a combination of an appropriately located source trench and ion-implanted P+ plug region enables proper grounding of the p-well region in the main active MOSFET region and removal of a parasitic N+ source region formed in the periphery of the MOSFET.

In a conventional MOSFET where there is no self-alignment, one can put the source implant wherever needed and then create a region for grounding the p-well. In a self-aligned DMOSFET since the source implant is self-aligned to the p-well, one would have not only the p-well extending all the way to the periphery but also have the N+ source region extend all the way to the periphery.

A parasitic NPN transistor exists in the active region of the MOSFET unit cell, formed by the N+ source region which acts like the N+ emitter, the p-well region which forms the P-base and the N+ source ohmic contact. In the periphery of the device and also under the gate pad metallization, there is no N+ source ohmic contact, and as a result, the emitter and base regions of the parasitic NPN transistor are not shorted in this region. The parasitic NPN transistor will not be activated under normal DC or switching operation of the MOSFET, but operating the device under extreme conditions can cause the triggering of the parasitic NPN transistor.

In the active region, by creating the source trench one has shorted the emitter and the base of this parasitic NPN transistor and ensured that in the active region of the device, this parasitic transistor will not turn ON. In the periphery of the device without a source trench, the parasitic NPN transistor exists even though it is shorted in the active region. It is possible that the parasitic NPN transistor may turn on in the peripheral region and it is not desirable.

In the embodiment herein, by creating a source trench in the periphery of the device and by providing a p-type implanted plug region, it is ensured that the parasitic NPN transistor is completely removed. Since the emitter of this transistor has been completely removed there is no chance for any kind of parasitic BJT structure. Typically, a separate masking step is carried out for masking the N+ source region from being formed at these locations, but in the embodiment herein, the source trench can be advantageously used for removing the parasitic N+ source regions and replacing them with a P+ plug region, which is self-aligned with the source trench and electrically connected to the p-well region.

The doping concentration of the P+ plug region to be placed in the device periphery can be advantageously made very high. In doing so, another parasitic device effect described here can be avoided. In a typical power MOSFET device structure, moderately doped P-well regions exist in the device periphery with or without a parasitic N+ Source region, as described above. If the N+ Source region is co-incident with the p-well region in the device periphery (i.e. the n+ source region is not deliberately masked from the peripheral region), this results in a partial compensation of the p-type electrical dose of the p-well region. In either case, the p-well regions in the device periphery can be extremely resistive from an electrical standpoint. During switching of the power MOSFET from off- to on-state or vice-versa, the extremely high rate of change of drain voltage (or dV/dt) can result in capacitive current flow through this resistive peripheral p-well regions, which are only collected by the Source ohmic contact in the active region of the MOSFET. In other words, the capacitive current caused by the high dV/dt during device switching has to traverse an extremely long distance from the device periphery to the Source ohmic contact in the active region. The high resistivity of p-well regions in prior art MOSFETs can result in a significant body bias effect, which has the result of lowering the device threshold voltage in those regions. So, these portions of the device can exhibit a false turn-on, which can result in device failure/destruction. The highly doped P+ plug regions in this embodiment can alleviate the aforementioned effect by reducing the amount of body bias developed in the peripheral regions of the MOSFET, which makes the MOSFET described in this embodiment more resilient to dV/dt induced failure. In other words, the MOSFET structure described in this embodiment will have a higher dV/dt rating than prior art MOSFETs. This reduces the switching losses and increases the circuit efficiency.

In an embodiment herein, a dedicated process step is utilized for masking the implantation of the N+ source region in the device periphery. The P+ plug region is formed first in this embodiment, while the source trench is created later on in the process at the ILD etch step.

In the embodiment herein, there is a source trench in the active region of the device but there is no source trench in the periphery of the device. A dedicated masking step is interspersed between the formation of the sidewall spacer after the p-well implant and before the N+ source implant to mask the N+ source implant from the peripheral regions of the MOSFET. The masking layer protects the periphery of the device from the source implanted region. A second deeper p-well region (P-Well #2) is formed using the same masking step used for the N+ source implant. P+ plug regions are formed in a later step in both the active regions of the device as well as the device periphery. A trench is later etched through the N+ source regions at discrete locations in the active region to contact the P+ plug regions, which get shorted to the N+ source region by the ohmic or silicide metallization.

In an embodiment herein, the source region implantation is masked from the periphery of the device. A dedicated process step is utilized for masking the implantation of the N+ source region in the device periphery as well as the N+ source region in the middle of the unit cell in the active region to enable ohmic contact to the p-well region.

In an embodiment herein, the polysilicon metallization has been segmented in the periphery of the device and is not one continuous layer as commonly seen. There is a dedicated masking step interspersed between formation of the sidewall spacer, after the p-well implant and before the implementation of the N+ source implant, to mask the N+ source region, from both the peripheral regions of the device as well as the selected areas in the active region.

In an embodiment herein segmenting the polysilicon metallization reduces the parasitic gate to body or gate to source capacitance which are parasitic capacitances. The islands of polysilicon are not disconnected but are connected at a position orthogonal to the plane of the drawing. Reducing the parasitic capacitance will enable the device to switch faster, which will increase the circuit efficiency by reducing the switching losses.

Figure 2:
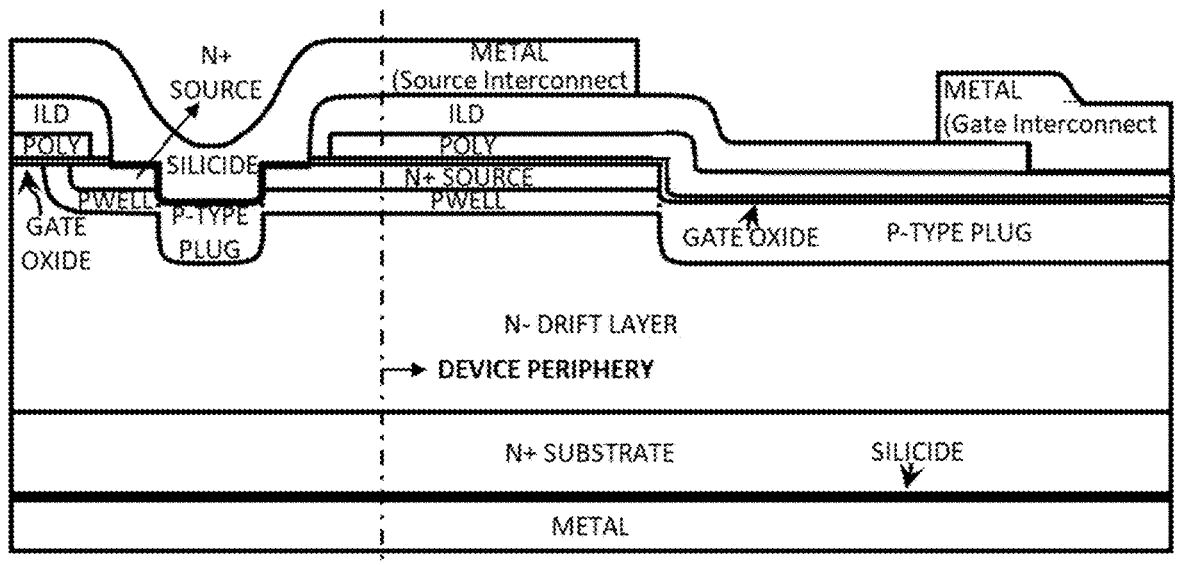
FIG. 2 shows an embodiment of a SiC DMOSFET structure for removal of a parasitic N+ source region formed in the periphery.

An embodiment shown in FIG. 2 is the unit cell and the device periphery of a cross-sectional structure of a SiC DMOSFET. The key regions of this device are a p-well region 203, which is formed by ion-implantation or epitaxial re-growth of a p-type species such as aluminum or boron. There is an N+ source region 204, N− drift layer 202, and an N+ substrate 201. In the ON state when a gate voltage is applied to the polysilicon gate 208 the current flows vertically from the drain 201, through the inversion layer which is formed at the top of the p-well layer 203, through the N+ source region 204, and out through the source metallization 211. In the OFF state or the blocking state, a voltage is supported across the p-well 203, N− drift layer 202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction gate field-effect transistor (JFET) region or the JFET gap and the thickness of the gate oxide 207. Another feature is an ILD layer 209 which is used to insulate the source interconnect metallization 211 from the polysilicon gate 208.

Source trench regions 205 are realized by dry etching through the N+ source layer at selected locations of the device, followed by a p-type ion-implantation step to realize P+ plug regions 206 under the source trench. At the very center of the unit cell, there is a P+ plug layer 206 which is grounded with the N+ source metallization. The purpose of the P+ plug in SiC DMOSFET is to ground the p-well region with the N+ source contact.

The formation of the source trench 205 device structure enables proper grounding of the p-well region in the main active MOSFET region and removal of a parasitic N+ source region 204 formed in the periphery of the MOSFET. When the N+ source region is formed in a self-aligned fashion with the p-well region, the formation of the source trench after the N+ source region formation removes parasitic N+ source regions from the device periphery of the chip and from under the gate pad region.

In the embodiment herein, combination of the source trench and the ion-implanted P+ plug region provides three important functions. First it provides proper grounding of the p-well region with the source ohmic contact in the active region of the device and second it helps in the removal of the parasitic N+ source region inadvertently formed in the periphery of the device. Third, the highly doped P+ plug region increases the dV/dt rating of the MOSFET. In the embodiment herein both of the above ensures the removal of the parasitic NPN transistor that would be otherwise formed in those regions.

While a parasitic NPN transistor also exists within the MOSFET unit cell, the N+ emitter (formed by the N+ source region) and the P-base (formed by the p-well region) are shorted by the N+ source ohmic contact. However, in the periphery of the device and also under the gate pad metallization, there is no N+ source ohmic contact, and as a result, the Emitter and Base regions of the parasitic NPN transistor are not shorted in this region. While this parasitic NPN transistor will not be activated under normal DC or switching operation of the MOSFET, operation of the device under extreme conditions like short-circuit or avalanche-mode results in the simultaneous presence of extremely high junction temperatures, high dV/dt and high current densities, which can cause the triggering of the parasitic NPN transistor. Typically, a separate masking step is carried out for masking the N+ source region from being formed at these locations. But in the embodiment herein, the source trench can be advantageously used for removing the parasitic N+ source regions and replacing them with a P+ plug region, which is self-aligned with the source trench and electrically connected to the p-well region.

Figure 3A:
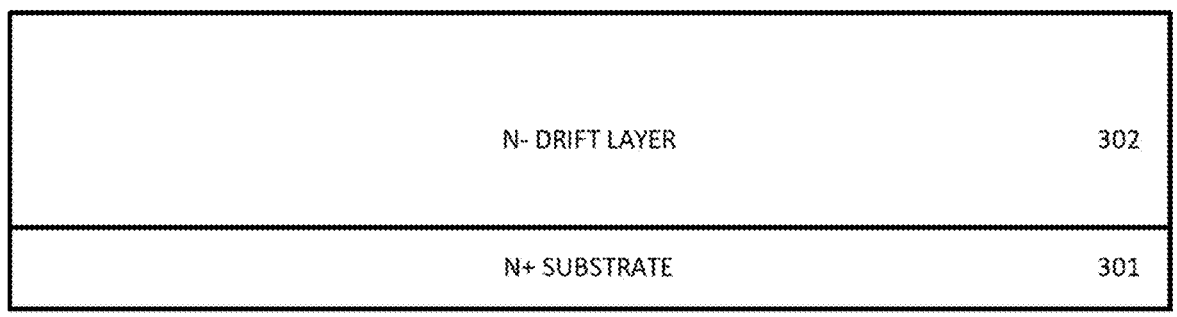
FIG. 3a to FIG. 3gg are cross sectional views showing the process steps for manufacturing the SiC DMOSFET structure in FIG. 2.
Figure 3B:
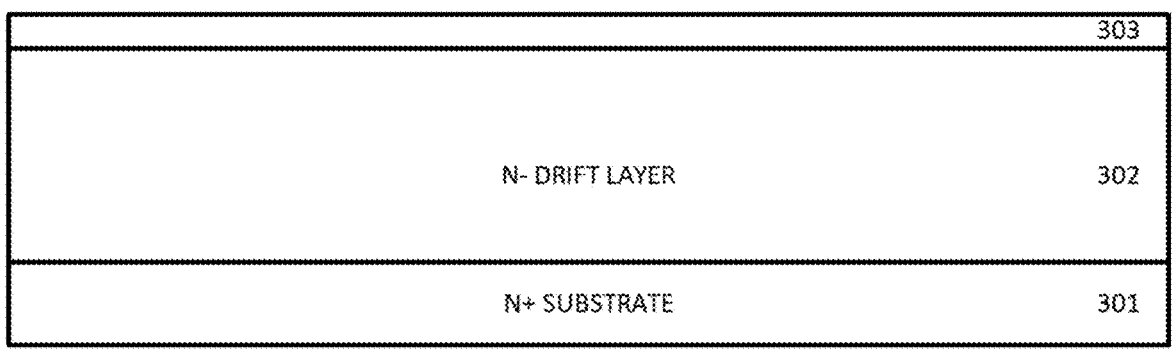
Figure 3C:
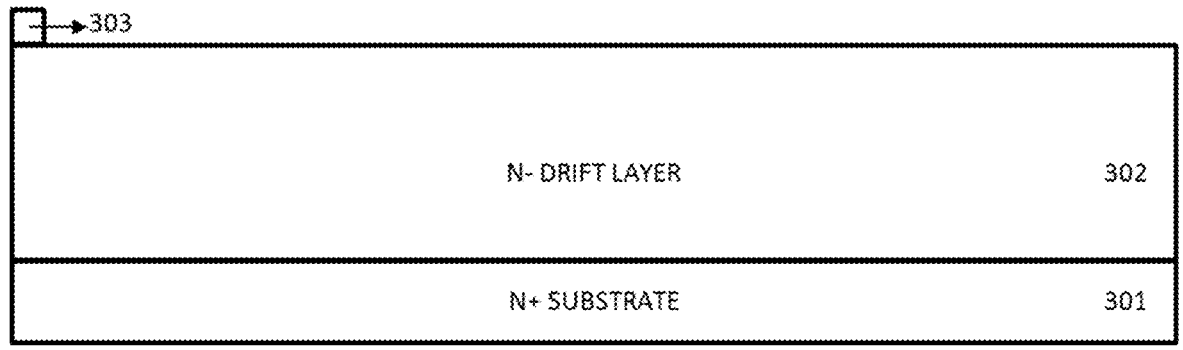
Figure 3D:
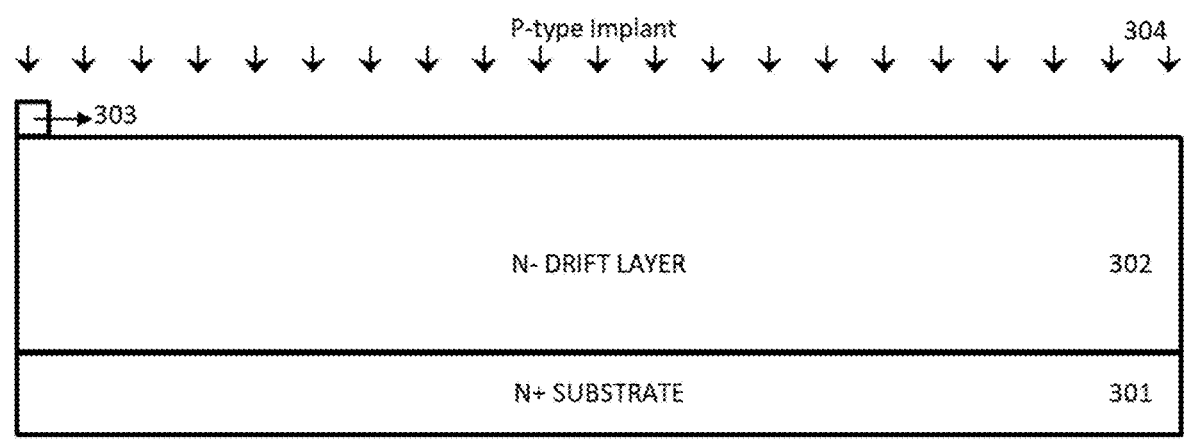
Figure 3E:
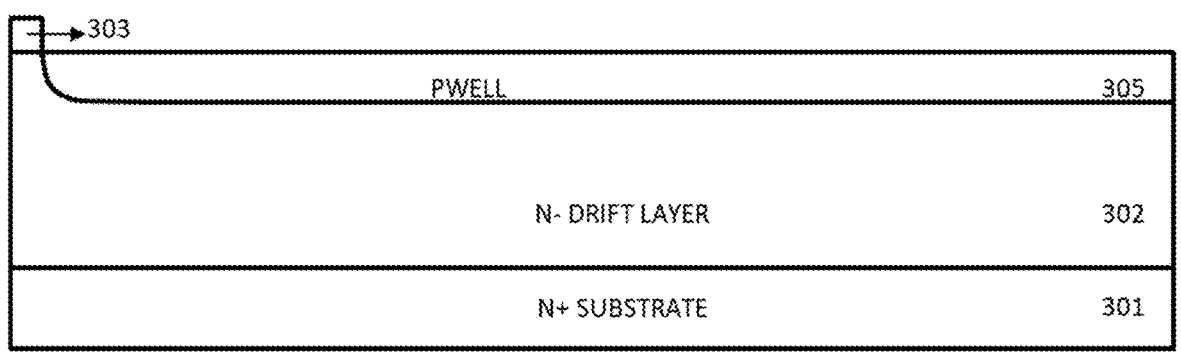

FIG. 3a to FIG. 3ff describes the process of manufacturing the structure shown in FIG. 2. The manufacturing process for a SiC DMOSFET is on a SiC substrate 301 and starts with using a 4H-SiC Si-face epi-wafer with suitable doping ($10^{14}$-$10^{18}$ cm$^{-3}$) and thickness (1 μm to 300 μm) for the epilayer 302 shown in FIG. 3a. A blanket hard mask 303 comprising a chemical vapor deposition (CVD) deposited layer of silicon dioxide, silicon nitride, silicon oxynitride, or a metallic layer such as nickel, with thickness ranging from 50 nm to 5 μm is deposited in FIG. 3b and then patterned using photolithography followed by a dry etch using reactive ion etching (RIE) for example as shown in FIG. 3c. Then p-well region is first formed by ion-implantation or epitaxial growth using aluminum or boron as the p-type impurity. A p-type implantation 304 comprising boron or aluminum, at energies ranging from 10 keV to 800 keV, at implant doses ranging from $10^{12}$ cm$^{-2}$ to $10^{15}$ cm$^{-2}$ in FIG. 3d is performed to create a p-well 305 in FIG. 3e.

Figure 3F:
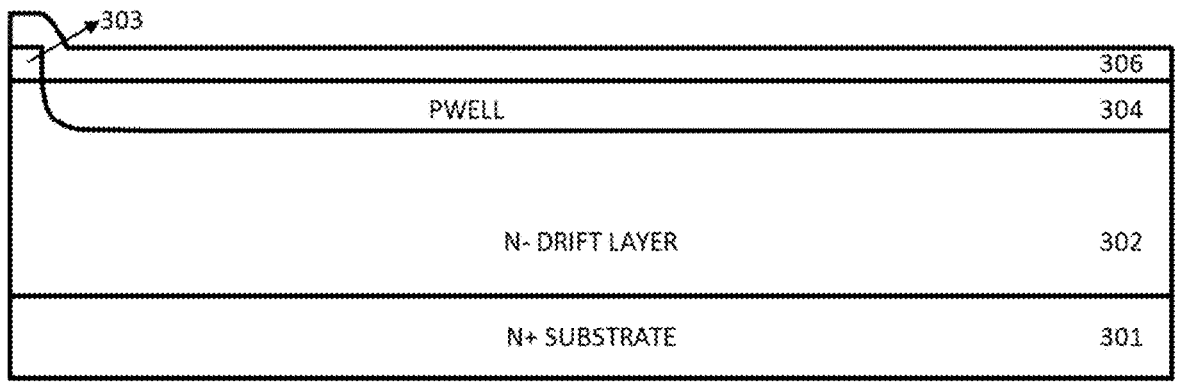
Figure 3G:
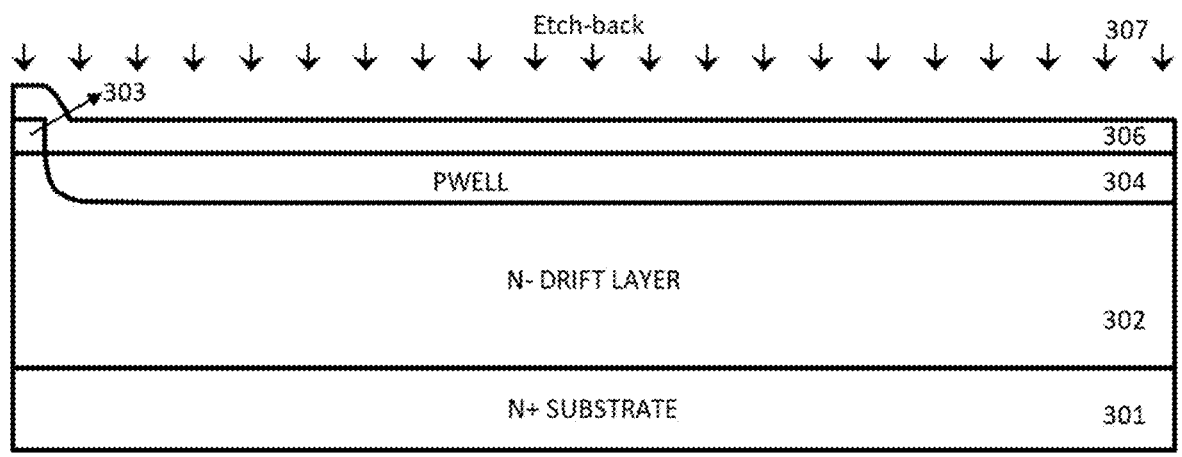
Figure 3H:
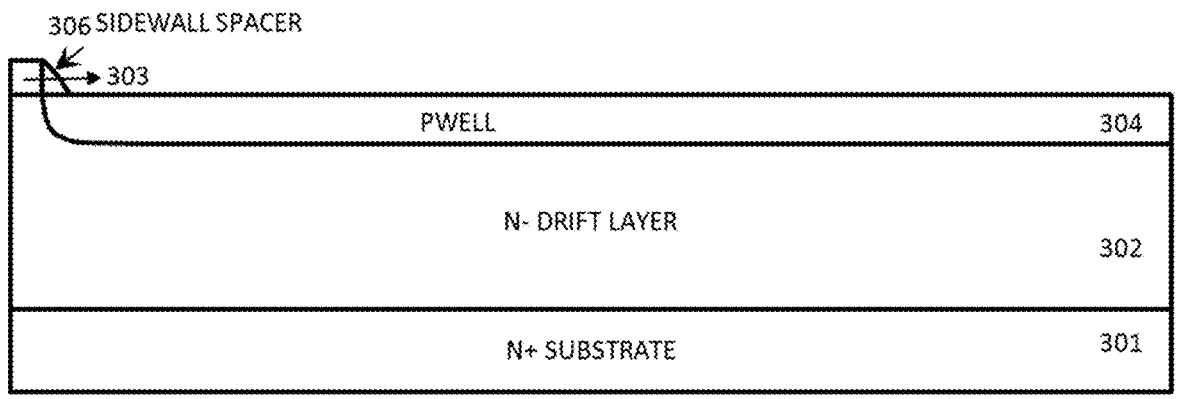

A second hard mask layer 306 is deposited by a CVD deposited layer of silicon dioxide, silicon nitride, silicon oxynitride, or a metallic layer such as nickel, with thickness ranging from 50 nm to 5 μm in FIG. 3f on top of the patterned first hard mask layer 303. This is followed by an anisotropic etching 307 in FIG. 3g to form a sidewall spacer 306 as shown in FIG. 3h.

Figure 3I:
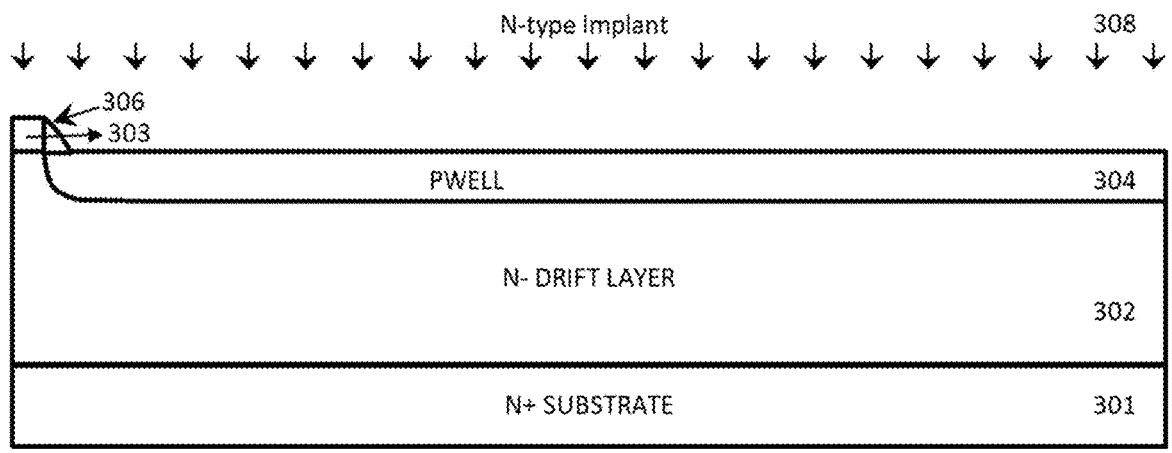
Figure 3J:
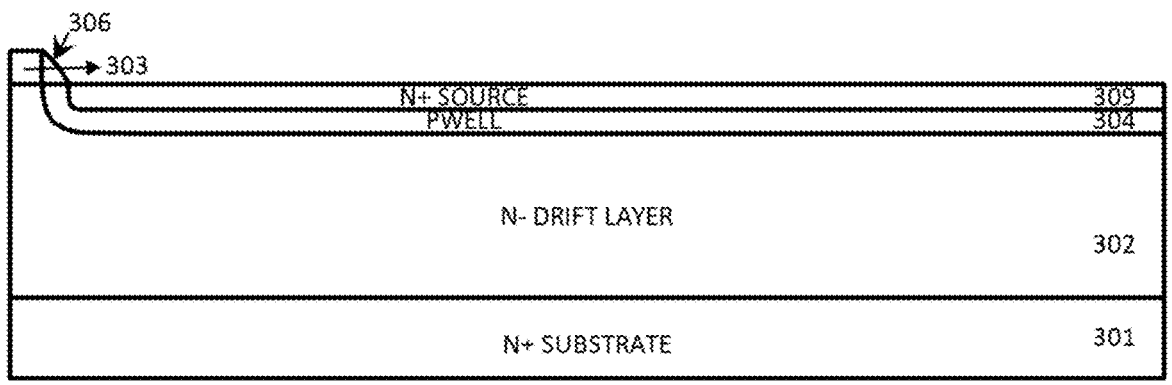
Figure 3K:
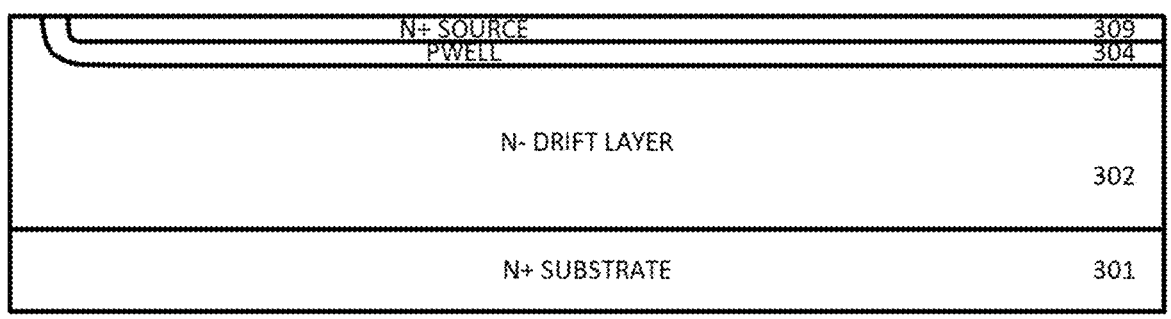

An n-type implant 308 is done in FIG. 3i for creating a N+ source region 309 in FIG. 3j. A N+ source region is formed by ion-implantation or by epitaxial re-growth by an n-type impurity such as nitrogen or phosphorus. Thus, the source region 309 is formed in a self-aligned fashion with the p-well region 304. The first and second hard mask layers 303 and 306 respectively, are removed in FIG. 3k. While the aforementioned sequence of process steps constitutes one method to form self-aligned p-well and N+ source region, other methods may be employed to achieve the same result. For example, the N+ source region 309 may first be formed after deposition and patterning of a first hard mask layer, followed by further etch back of the first hard mask layer to then form the p-well region 304.

Figure 3L:
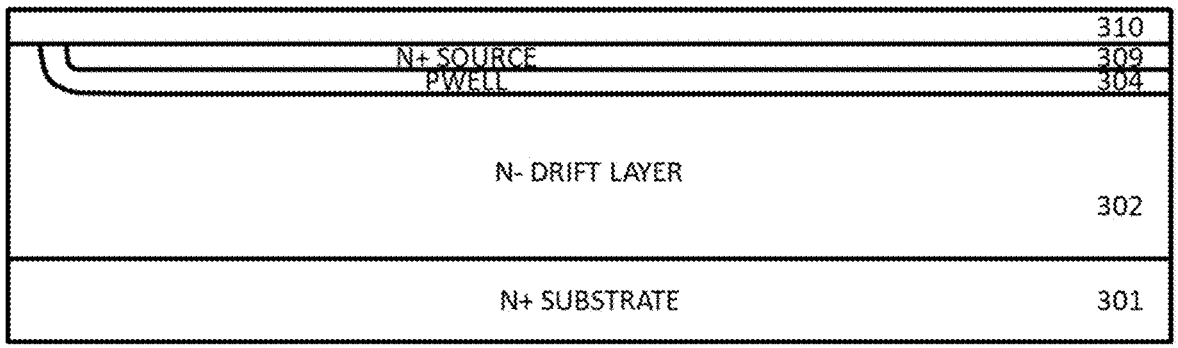
Figure 3M:
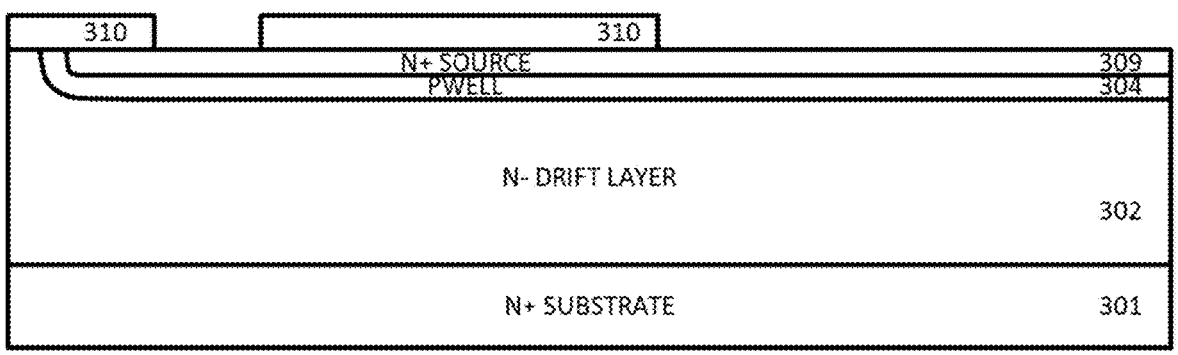
Figure 3N:
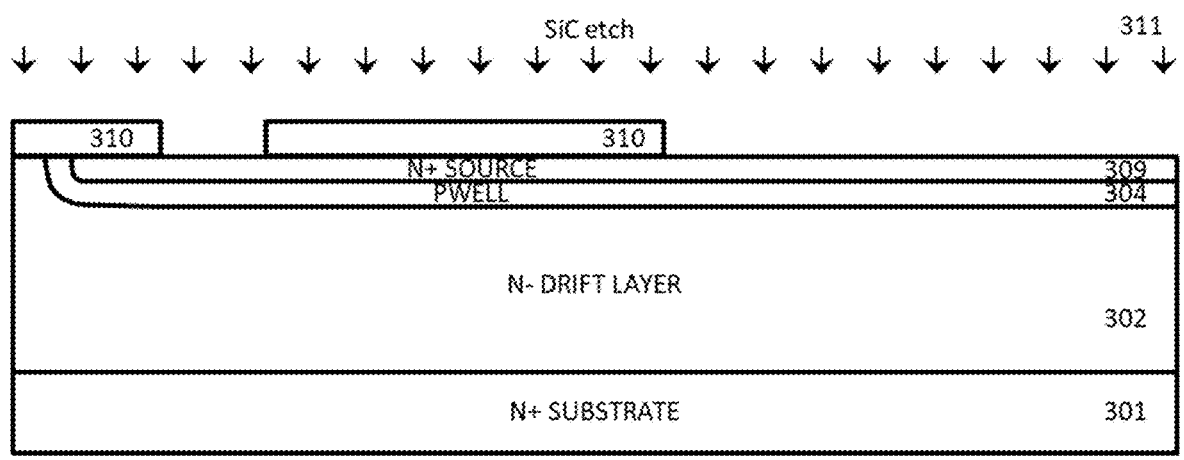
Figure 3O:
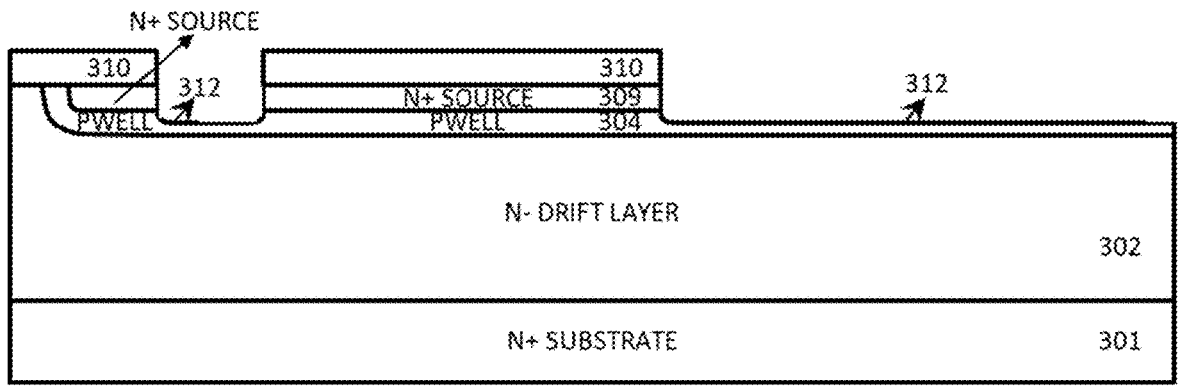
Figure 3P:
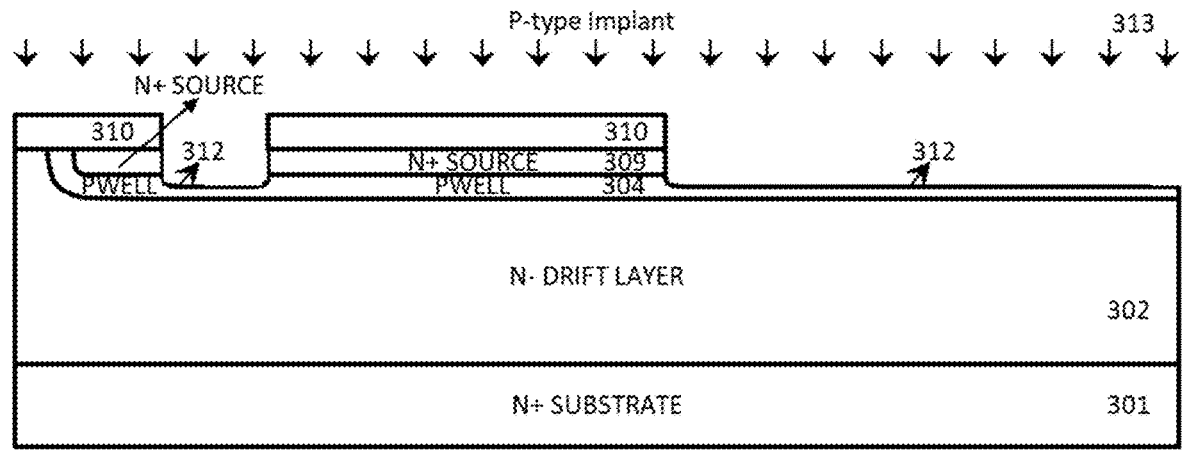
Figure 3Q:
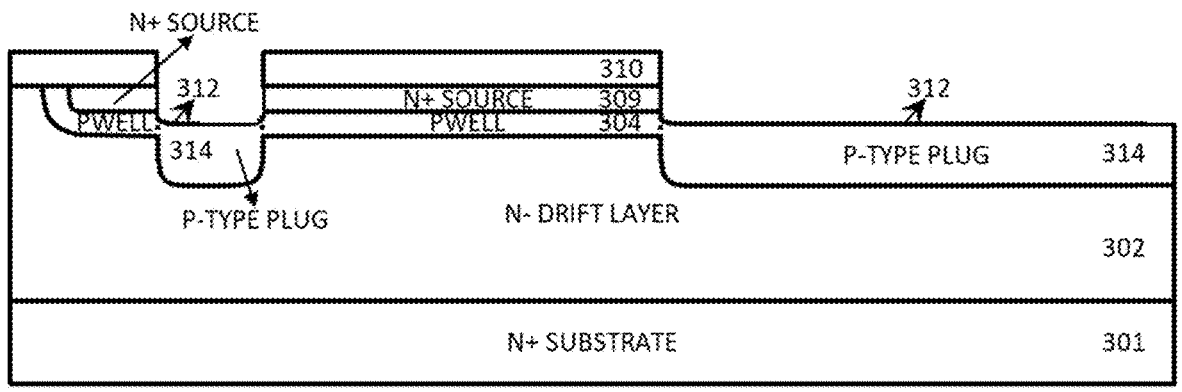
Figure 3R:
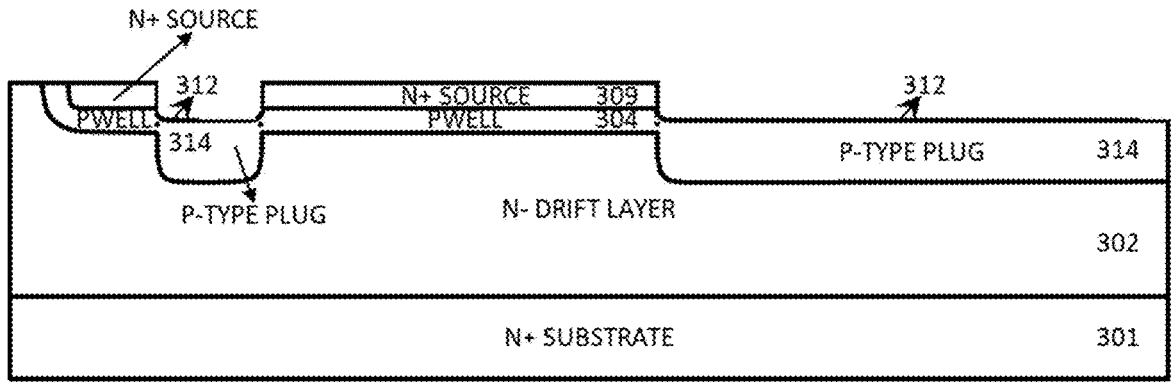

Another mask layer 310 is deposited by a CVD deposited layer of silicon dioxide, silicon nitride, silicon oxynitride, or a metallic layer such as nickel, with thickness ranging from 50 nm to 5 μm on the top in FIG. 3l. The mask layer 310 is patterned in FIG. 3m. The pattered mask 310 is used to etch into the substrate 311 in FIG. 3n using dry etch method to create a recessed region within the SIC. The recessed region is the source trench 312 formed in the substrate by penetrating the source region in FIG. 3o. The entire N+ source region is removed by dry etching at these selected locations of the device. Using the same hard mask 310, by implantation of a controlled dose of a p-type impurity 313 such as aluminum or boron in FIG. 3p a P+ plug layer is formed in FIG. 3q. The depth of the P+ plug layer 314 may preferably exceed the depth of the N+ source implant and may even exceed the depth of the p-well region, in a particular implementation. A p-type implantation comprising boron or aluminum, at energies ranging from 10 keV to 800 keV, at implant doses ranging from $10^{13}$ cm$^{-2}$ to $10^{17}$ cm$^{-2}$ in FIG. 3d is performed to create a P+ plug region. The P+ plug region 314 is realized under the source trench 312, which is electrically connected to the p-well region 304. The mask layers are removed in FIG. 3r. The wafer is annealed for activating the implanted impurities.

Figure 3S:
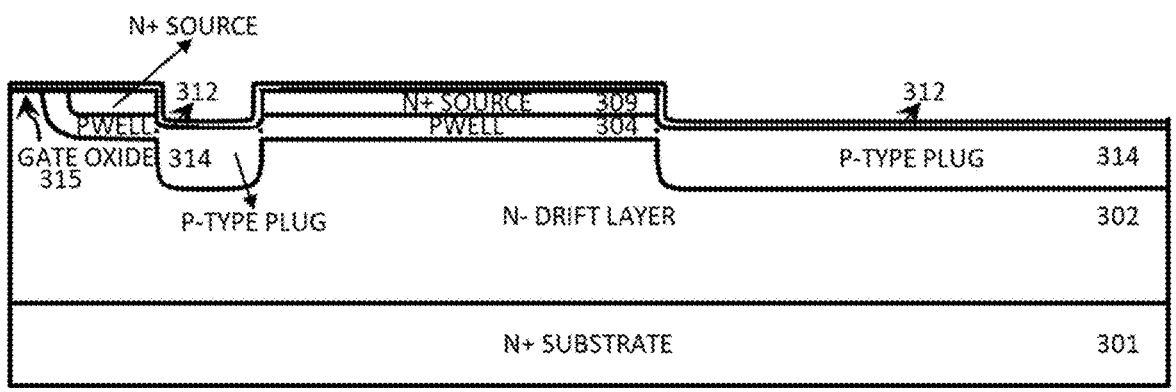
Figure 3T:
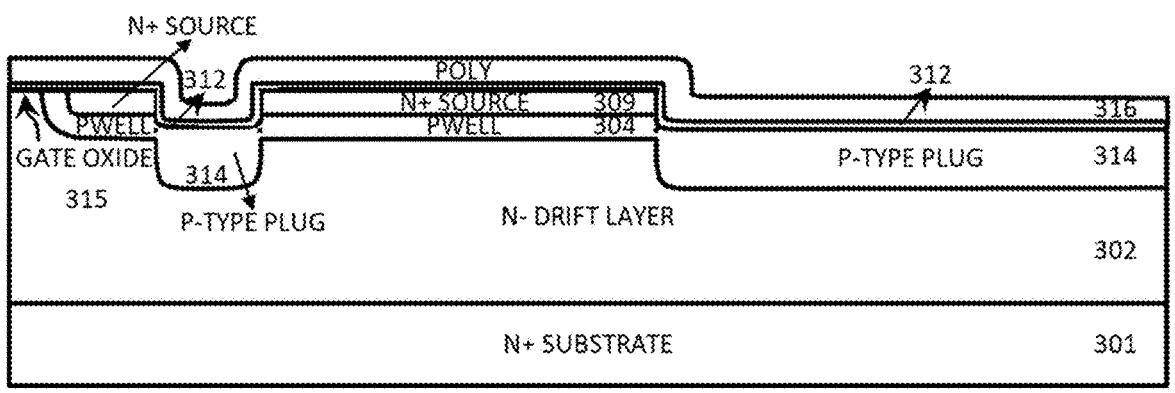
Figure 3U:
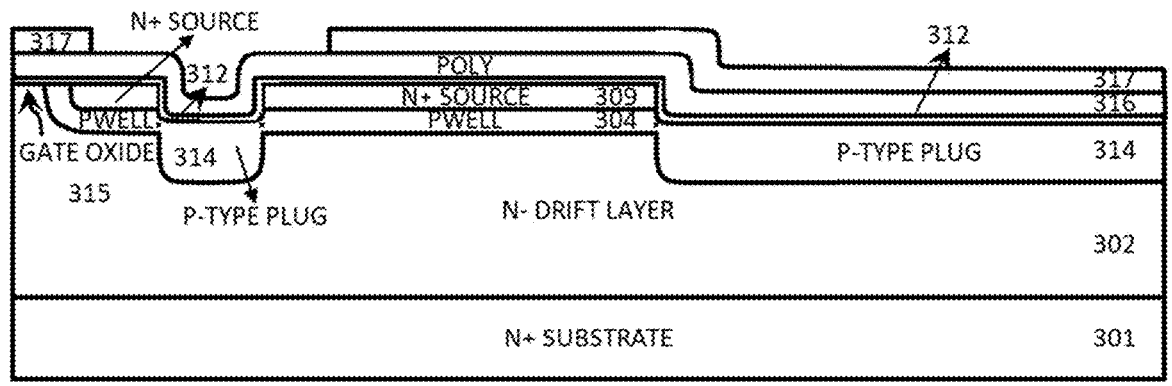
Figure 3V:
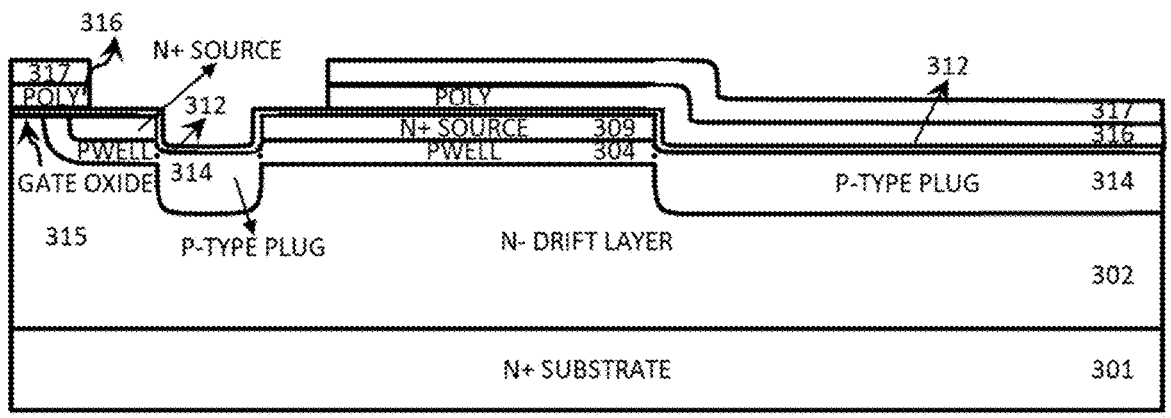
Figure 3W:
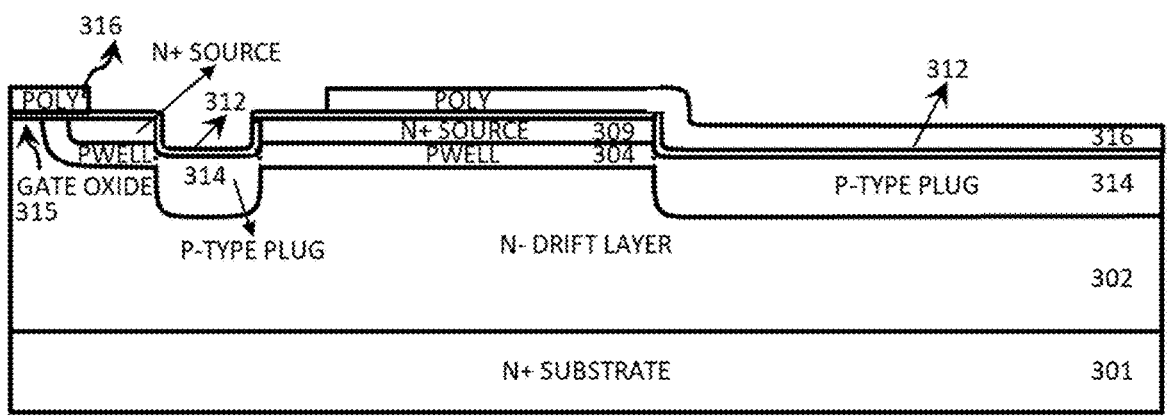
Figure 3X:
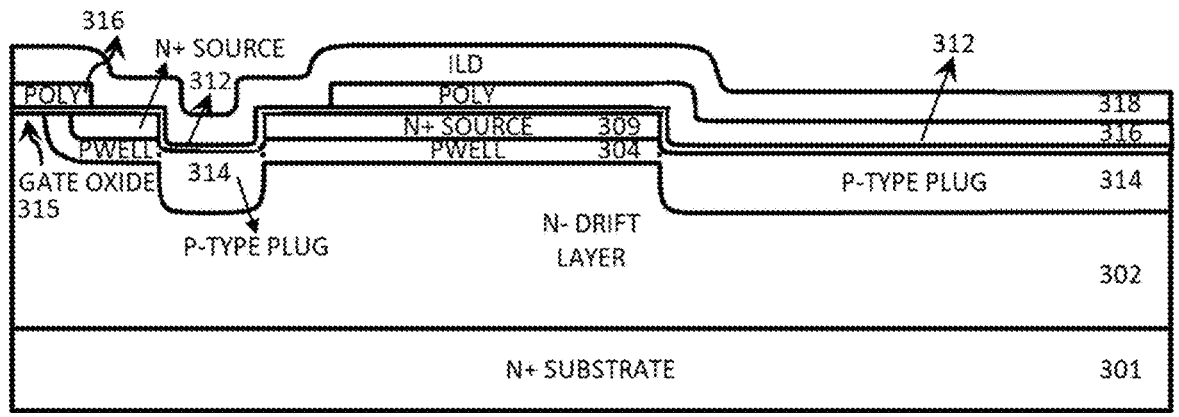

The oxide layer 315, which is the gate oxide, is formed by thermal oxidation or using CVD of a dielectric layer such as silicon dioxide, silicon nitride, silicon oxynitride, etc. in FIG. 3s. The thickness of the gate oxide could range from 5 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer 316 is then deposited in FIG. 3t. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 600-900° C. A hard mask 317 is deposited by a CVD deposited layer of silicon dioxide, silicon nitride, silicon oxynitride, or a metallic layer such as nickel, with thickness ranging from 50 nm to 5 μm on the top on top and patterned as shown in FIG. 3u. The polysilicon layer 316 is etched by using the patterned mask layer 317 in FIG. 3v. The mask layer 317 is then removed in FIG. 3w. An ILD layer 318 comprising 50 nm-1000 nm thick silicon dioxide, silicon nitride, silicon oxynitride layers or a stacked combination thereof is deposited on the wafer in FIG. 3x.

Figure 3Y:
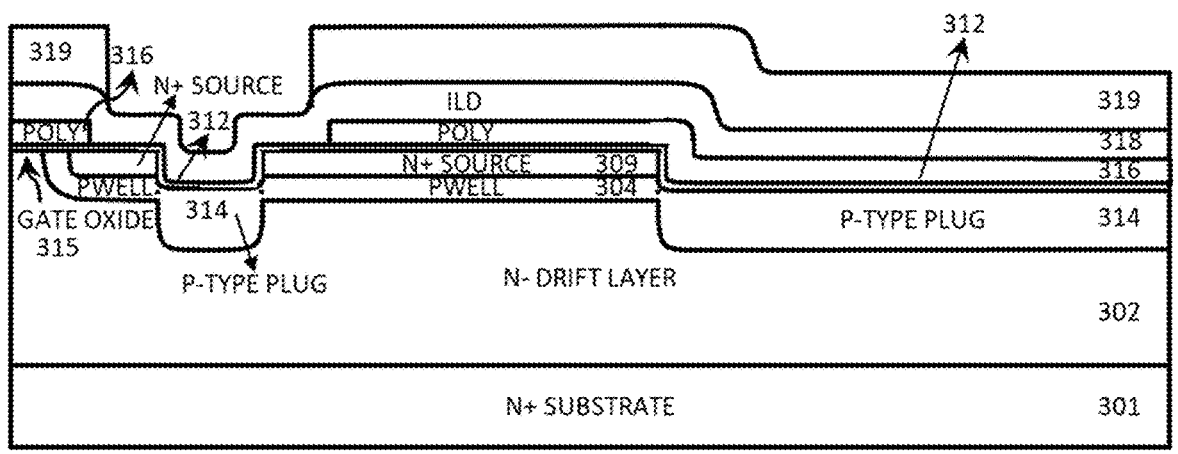
Figure 3Z:
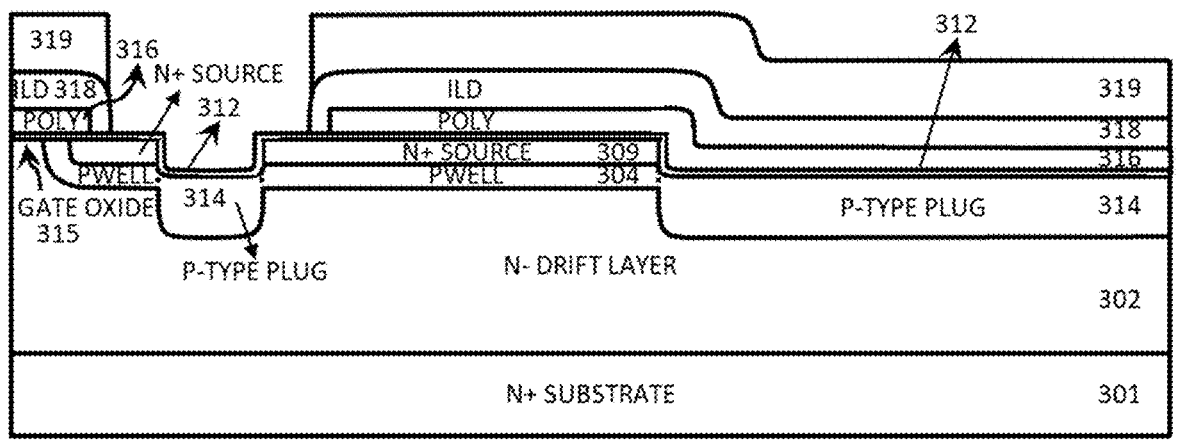
Figure 3A:
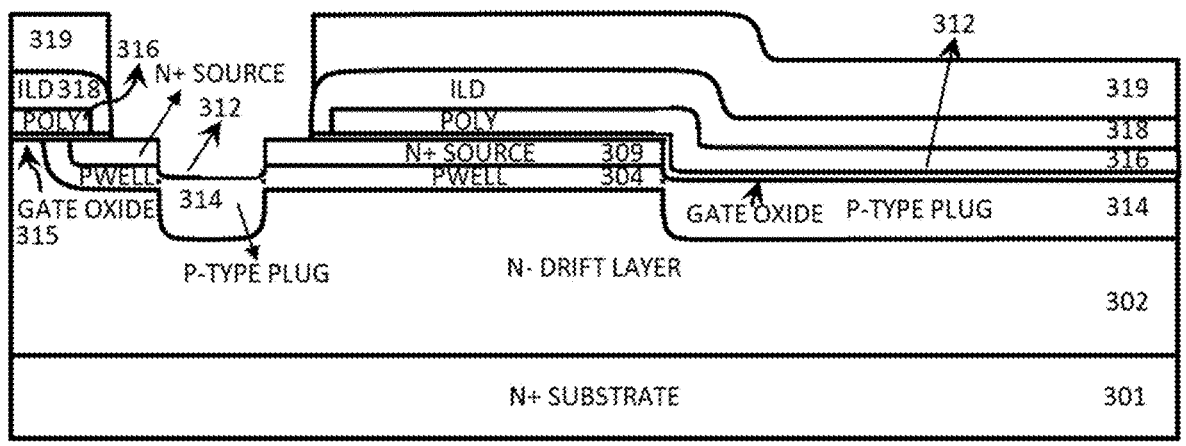
Figure 3B:
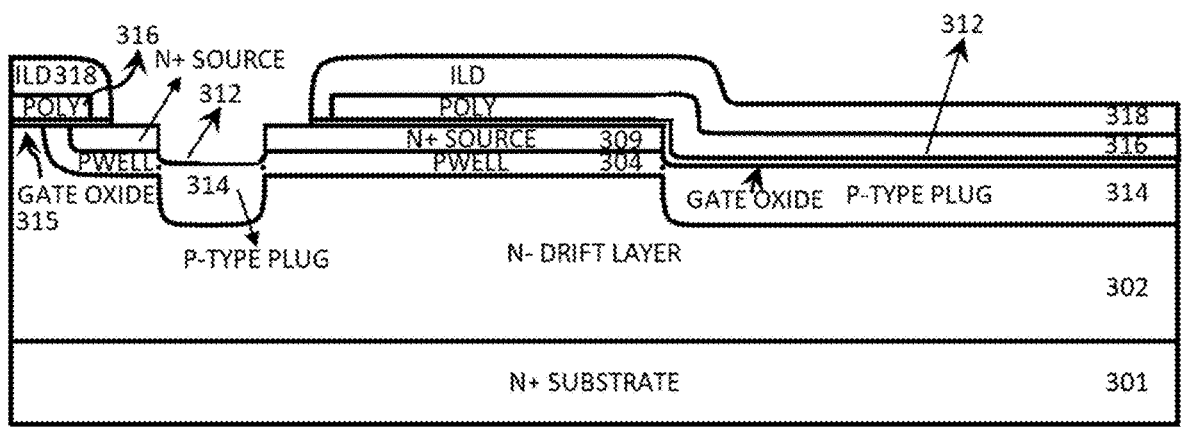
Figure 3C:
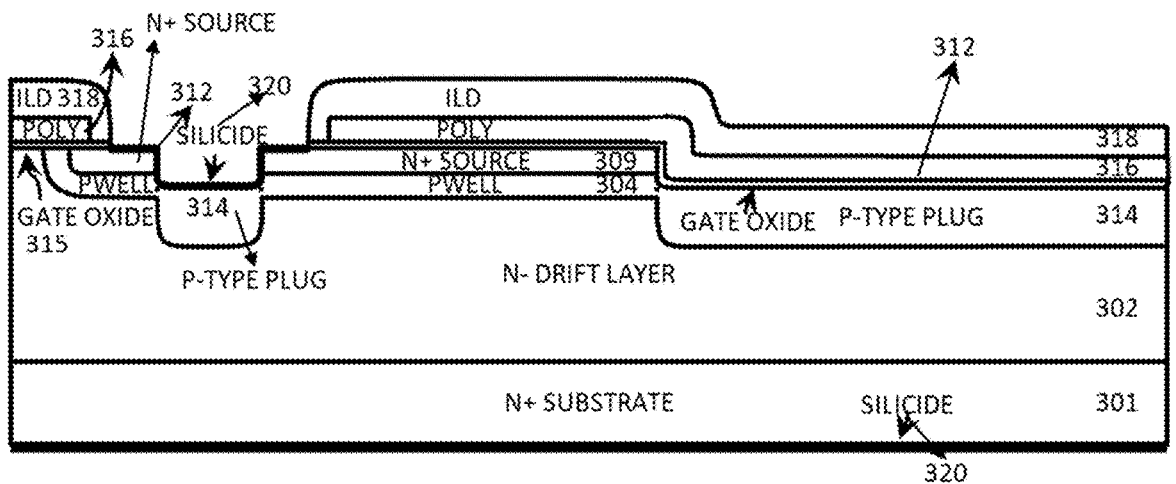
Figure 3D:
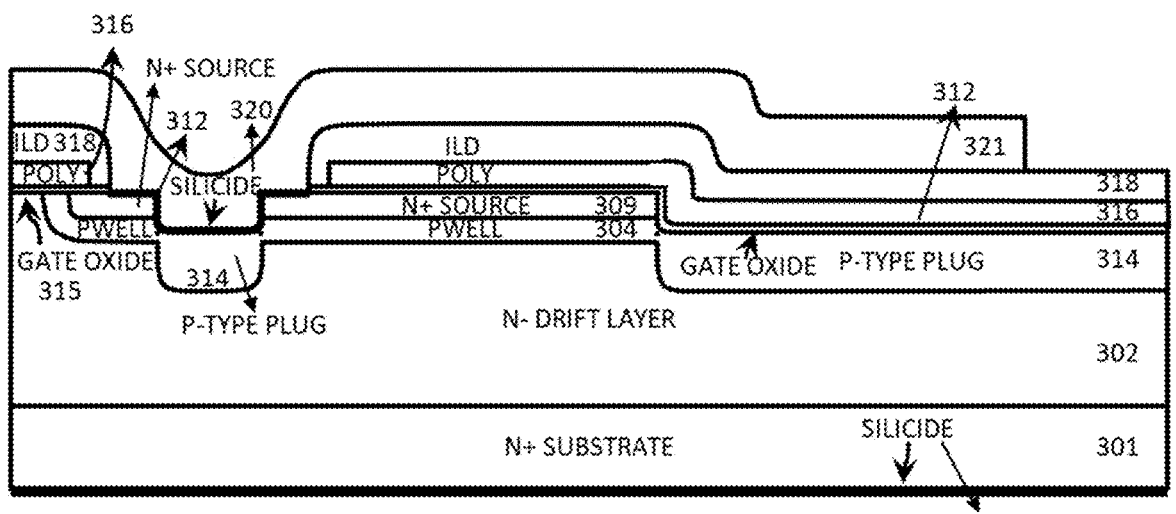
Figure 3E:
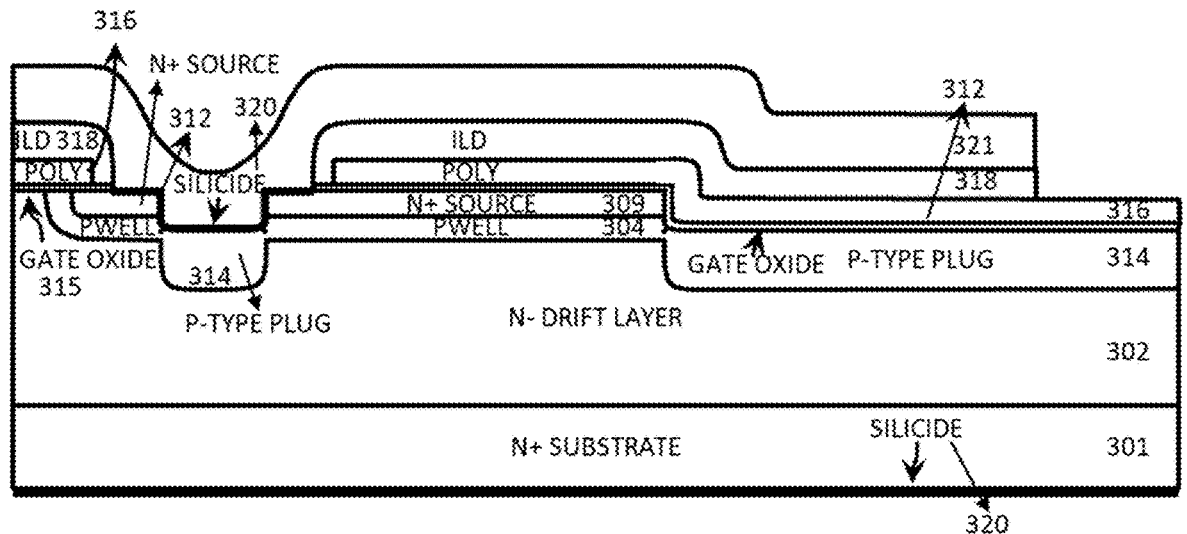
Figure 3F:
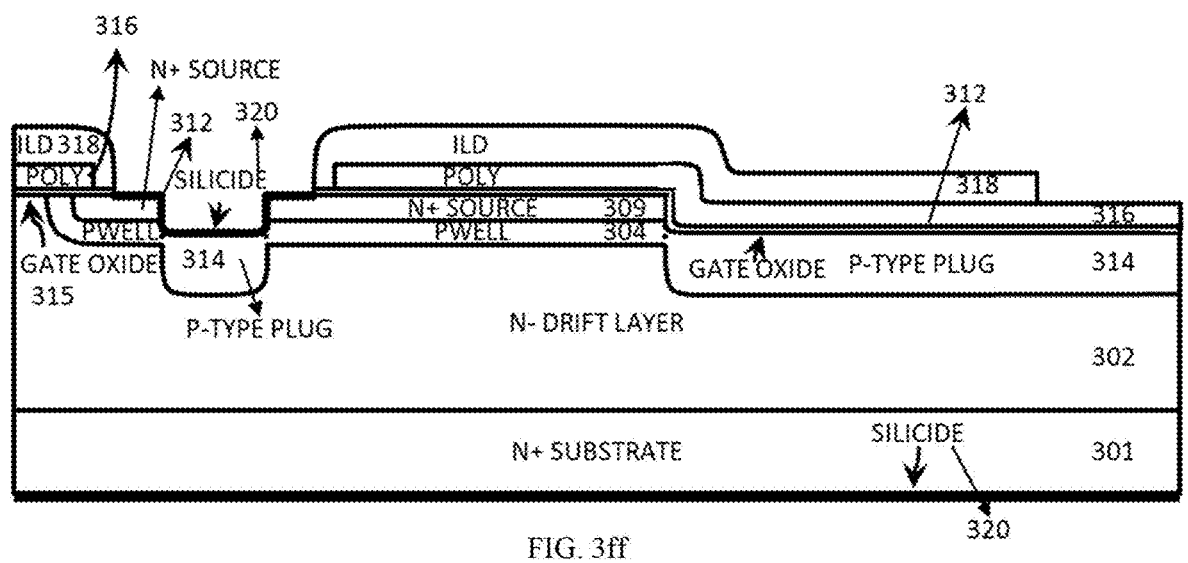
Figure 3G:
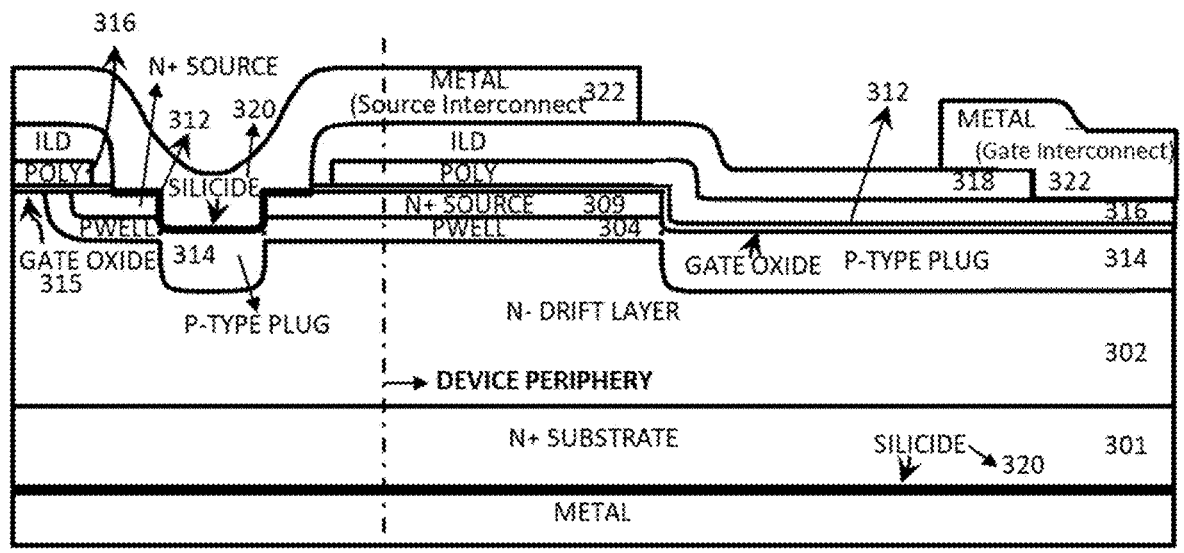

A hard mask 319 is deposited by a CVD deposited layer of silicon dioxide, silicon nitride, silicon oxynitride, or a metallic layer such as nickel, with thickness ranging from 50 nm to 5 μm on the top and patterned on top to define the ILD opening in FIG. 3y. The ILD layer 318 is etched using the hard mask 319 as shown in FIG. 3z. Further the gate oxide 315 is etched using the same mask 319 in FIG. 3aa. The mask 319 is then removed in FIG. 3bb. A nickel silicide region 320 is formed on the exposed SiC surface in FIG. 3cc. A mask layer 321 is formed by a CVD deposited layer of silicon dioxide, silicon nitride, silicon oxynitride, or a metallic layer such as nickel, with thickness ranging from 50 nm to 5 μm on the top and patterned in FIG. 3dd. The ILD layer 318 is etched using mask 321 in FIG. 3ee. The mask layer 321 is removed in FIG. 1ff. Interconnect metal layers 322 of either aluminum or silver or gold is deposited and patterned on the top and bottom of the substrate in. FIG. 3gg.

In the embodiment herein, the same final structure for forming the source trench region and P+ plug region may be alternatively realized using a slightly different approach. As in the above method, the p-well region and the N+ source region are realized using a self-aligned process. However, in the embodiment herein, the P-plug layer may be formed first using deep boron or aluminum implantation as a buried layer that is placed under the N+ source region. The dry etching for the N+ source trench realization may be performed later on in the process. The N+ source trench may be realized preferably after the high-temperature annealing process in one example implementation.

Figure 4:
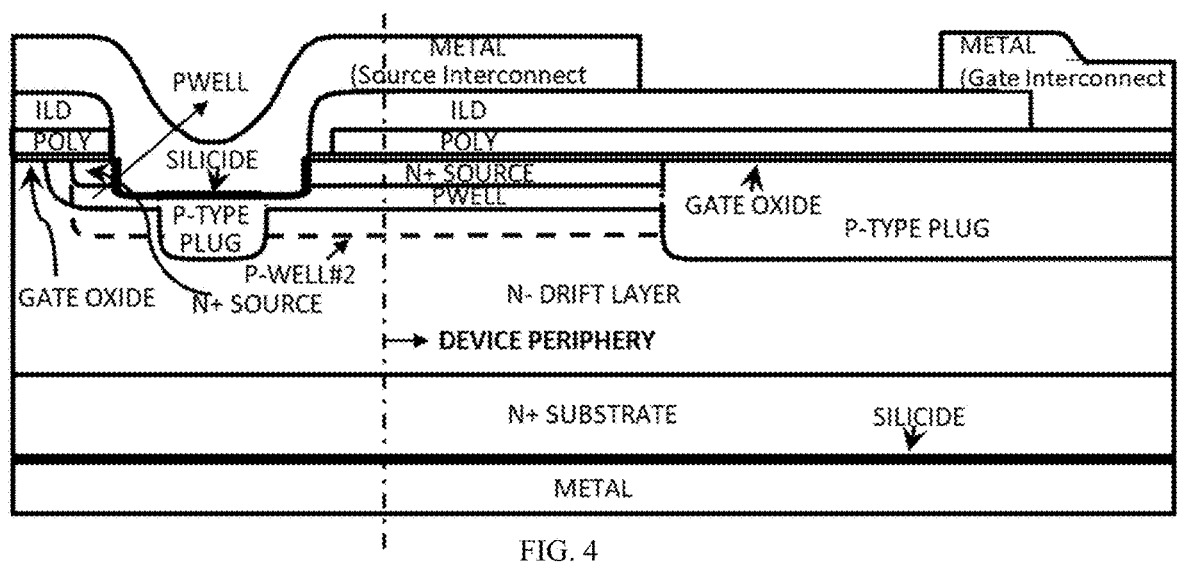
FIG. 4 shows an embodiment of a SiC DMOSFET with a dedicated process step utilized for masking the implantation of the N+ source region in the device periphery.

An embodiment shown in FIG. 4 is the unit cell and the device periphery of a cross-sectional structure of a SiC DMOSFET. The key regions of this device are a p-well region 403, which is formed by ion-implantation or epitaxial re-growth of a p-type species such as aluminum or boron. There is an N+ source region 404, N– drift layer 402, and an N+ substrate 401. In the ON state when a gate voltage is applied to the polysilicon gate 407 the current flows vertically from the drain 401, through the inversion layer which is formed at the top of the p-well layer 403, through the N+ source region 404, and out through the source metallization 412. In the OFF state or the blocking state, a voltage is supported across the p-well 403, N– drift layer 402 junction and there is a PN junction which is formed between the p-well and the N– drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 407. Another feature is an ILD layer 409 which is used to insulate the source interconnect metallization 412 from the polysilicon gate A dedicated masking step is interspersed between the formation of the sidewall spacer after the p-well implant and before the N+ source implant to mask the N+ source implant from the peripheral regions of the MOSFET. A second deeper p-well region (P-Well #2) 405 is formed using the same masking step used for the N+ source implant. P+ plug regions 406 are formed in a later step in both the active regions of the device as well as the device periphery. The P+ plug layer 406 is grounded with the N+ source metallization. The purpose of the P+ plug in SiC DMOSFET is to ground the p-well region with the N+ source contact.

A trench 410 is later etched through the N+ source regions at discrete locations in the active region to contact the P+ plug regions, which get shorted to the N+ source region by the ohmic silicide 411 metallization. The source trench 410 is etched into the SiC at selected regions using the same hard mask used for patterning the interlevel dielectric layer (ILD). In the embodiment herein, the source trench 410 serves two functions. First the source trench reveals the surface of the P+ plug layer that was previously buried under the N+ source region for subsequent contact with the ohmic silicide metal and second the source trench reveals the sidewalls of the N+ source region for subsequent contact with the ohmic silicide metal.

In the embodiment herein, a dedicated hard mask or photoresist layer is applied after the sidewall spacer is formed and before the N+ source implantation. This layer prevents the formation of the N+ source region in the device periphery and parasitic NPN structures in the device periphery are avoided In the embodiment herein, a second p-well region (P-Well #2) 405 is placed under the N+ source region 404 and electrically connected to the main p-well region provides additional electrical dose under the N+ source implant, for preventing reach-through breakdown, especially after the source trench formation. The etching of the source trench may inadvertently etch part of the primary p-well region under the N+ source region, thereby locally reducing the p-well dose in this region, resulting in undesirable reach through breakdown at these locations.

Figure 5A:
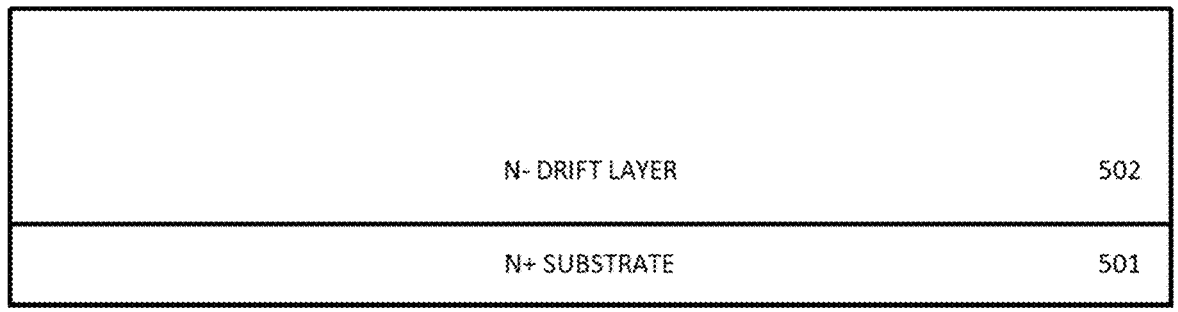
FIG. 5a to FIG. 5gg are cross sectional views showing the process steps for manufacturing the SiC DMOSFET structure in FIG. 4.
Figure 5B:
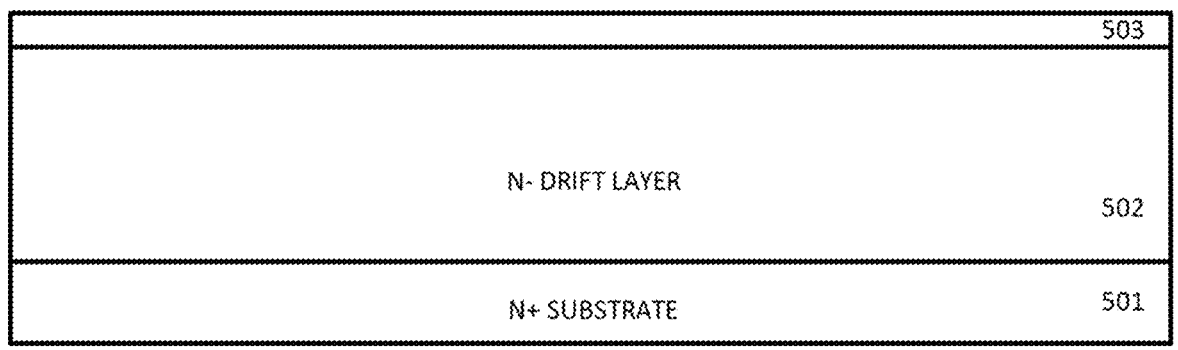
Figure 5C:
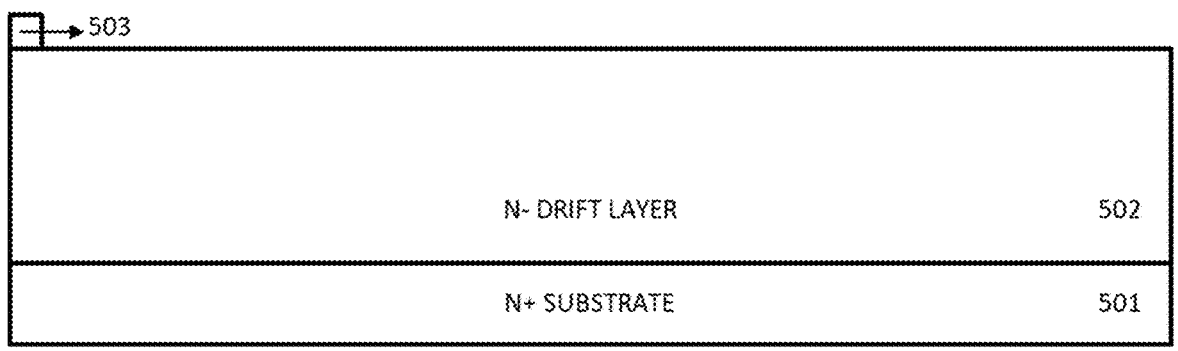
Figure 5D:
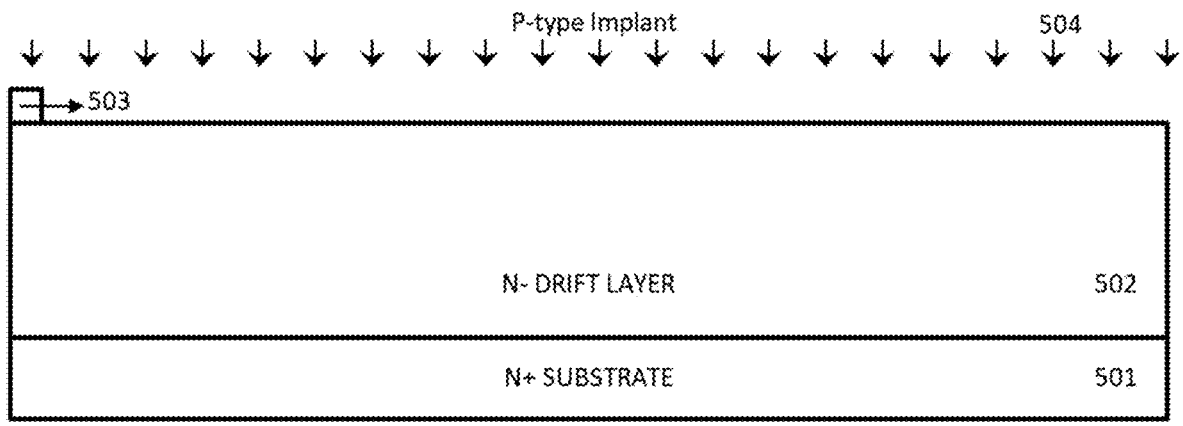
Figure 5E:
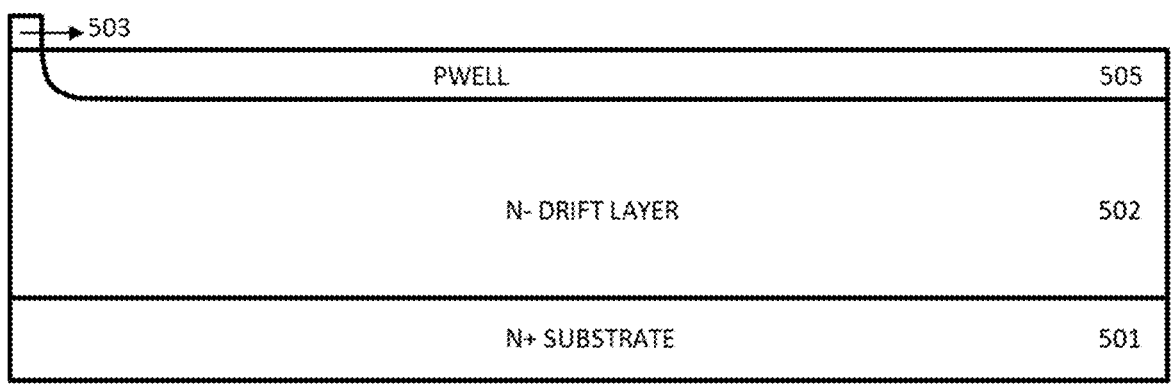

FIG. 5a to FIG. 5gg describes the process of manufacturing the structure shown in FIG. 4. The manufacturing process for a SiC DMOSFET is on a SiC substrate 501 and starts with using a 4H-SiC Si-face epi-wafer with suitable doping ($10^{14}$-$10^{18}$ cm$^{-3}$) and thickness (1 μm to 300 μm) for the epilayer 502 shown in FIG. 5a. A blanket hard mask 503 comprising a CVD deposited layer of silicon dioxide, silicon nitride, silicon oxynitride, or a metallic layer such as nickel, with thickness ranging from 50 nm to 5 μm is deposited in FIG. 5b and then patterned using photolithography followed by a dry etch using RIE for example as shown in FIG. 5c. Then p-well region is first formed by ion-implantation or epitaxial growth using aluminum or boron as the p-type impurity. A p-type implantation 504 comprising boron or aluminum, at energies ranging from 10 keV to 800 keV, at implant doses ranging from $10^{12}$ cm$^{-2}$ to $10^{15}$ cm$^{-2}$ in FIG. 5d is performed to create a p-well 505 in FIG. 5e.

Figure 5F:
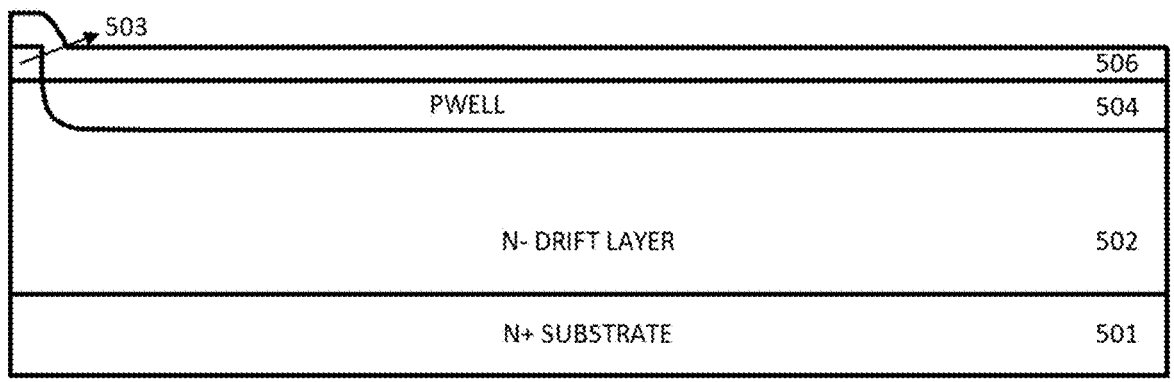
Figure 5G:
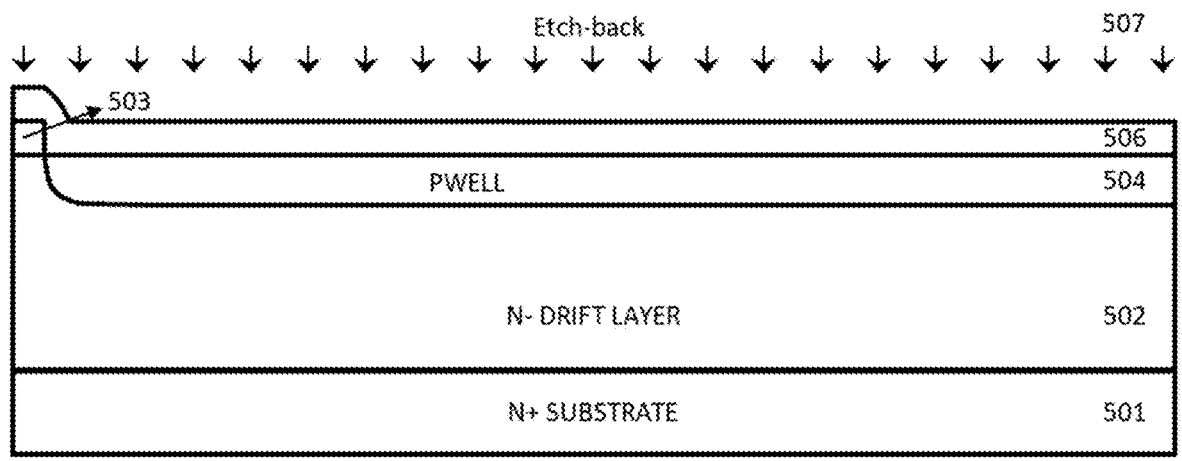
Figure 5H:
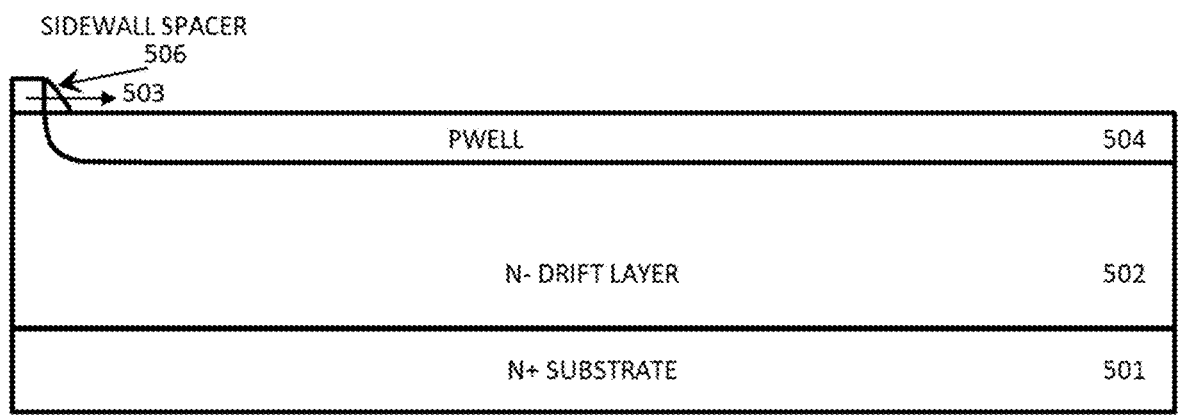
Figure 5I:
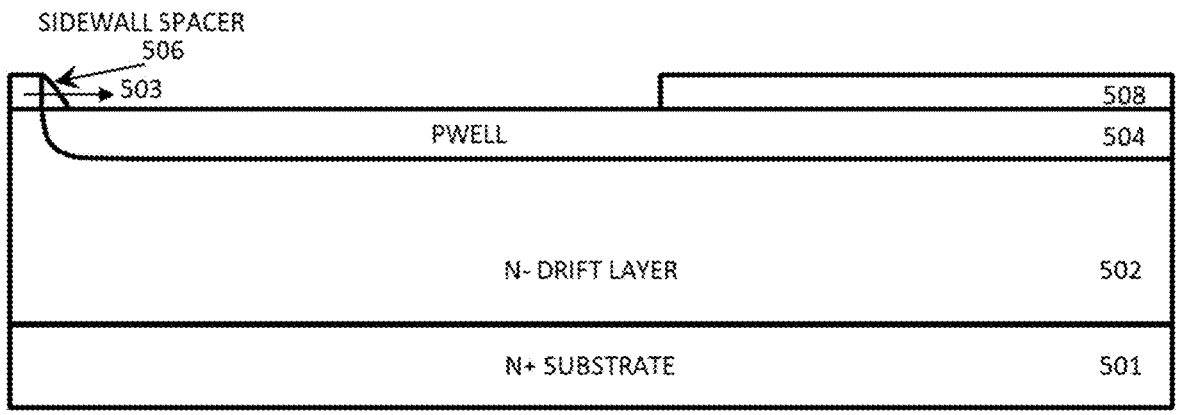

A second hard mask layer 506 is deposited by a CVD deposited layer of silicon dioxide, silicon nitride, silicon oxynitride, or a metallic layer such as nickel, with thickness ranging from 50 nm to 5 μm in FIG. 5f on top of the patterned first hard mask layer 503. This is followed by an anisotropic etching 507 in FIG. 5g to form a sidewall spacer 506 as shown in FIG. 5h. A patterned mask layer 508 is deposited by a CVD deposited layer of silicon dioxide, silicon nitride, silicon oxynitride, or a metallic layer such as nickel, with thickness ranging from 50 nm to 5 μm on the top alongside the patterned mask layer with the sidewall spacer in FIG. 5i. The hard mask layer 508 patterned over the peripheral regions of the device.

Figure 5J:
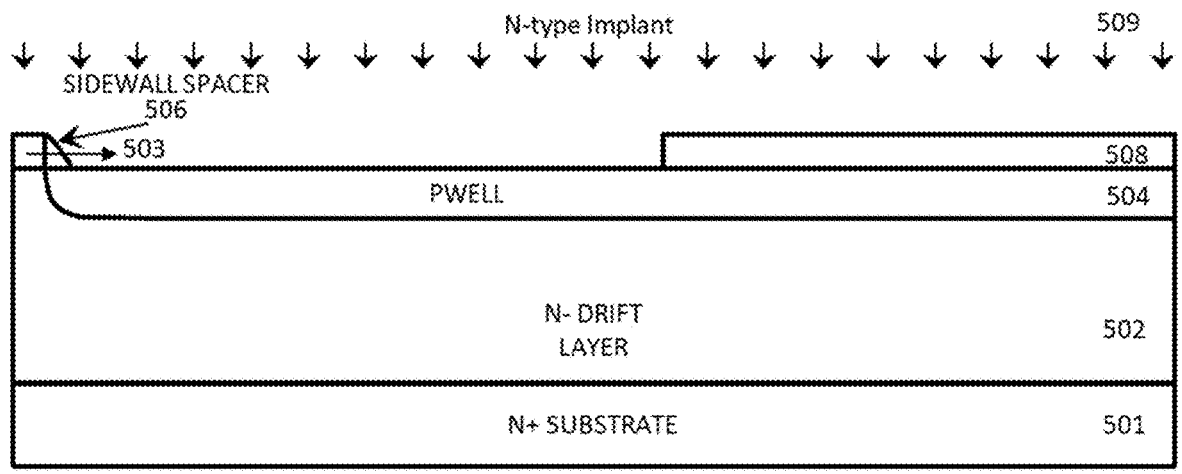
Figure 5K:
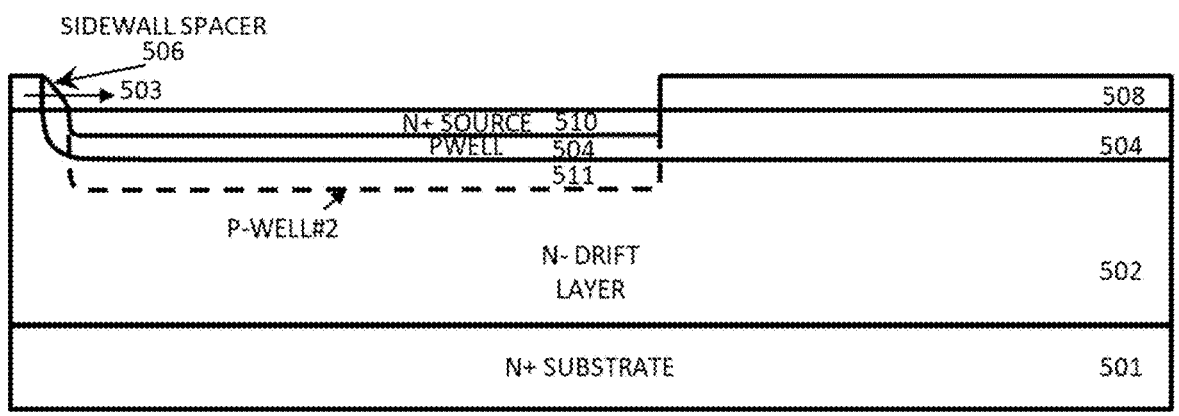

An n-type implant 509 is done in FIG. 5j for creating a N+ source region 510 in FIG. 5j. A N+ source region is formed by ion-implantation or by epitaxial re-growth by an n-type impurity such as nitrogen or phosphorus. The N+ source region 510 is formed in a self-aligned fashion with the p-well region 504. The source region is formed in a self-aligned fashion with the p-well region, while it is masked from the peripheral regions of the device. A deep second p-well region (P-Well #2) 511 may be formed at the same time as the N+ source region in FIG. 5k. The buried P-well #2 region may be formed using aluminum or boron, and placed under the N+ source region in the active area of the device. The P-Well #2 region may be preferably formed using the p-type species boron which has a higher ion-implantation range as compared to aluminum in SiC. It may not be necessary to mask the p-well region #2 from the peripheral regions of the device.

Figure 5L:
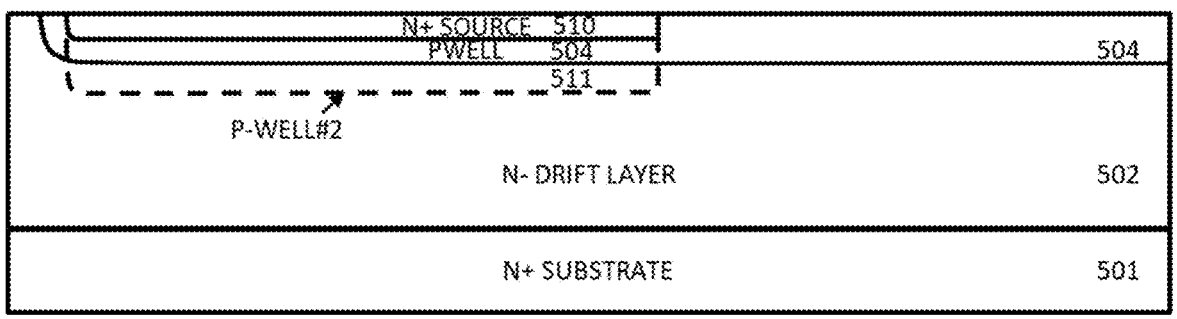
Figure 5M:
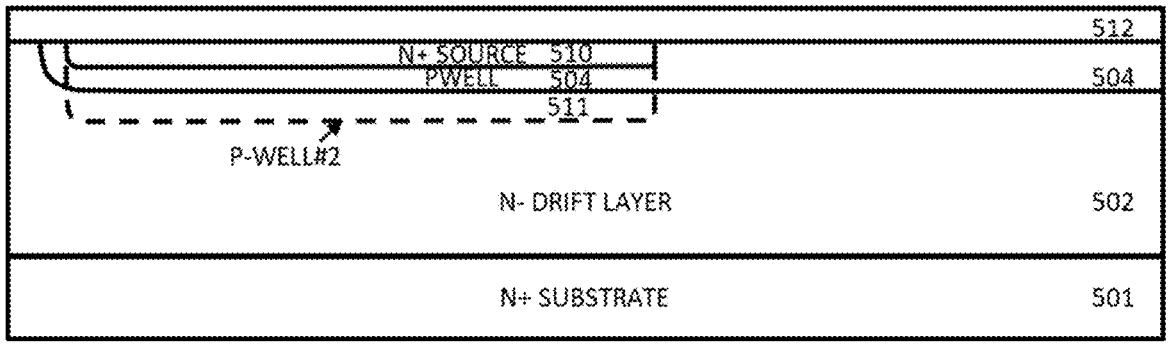
Figure 5N:
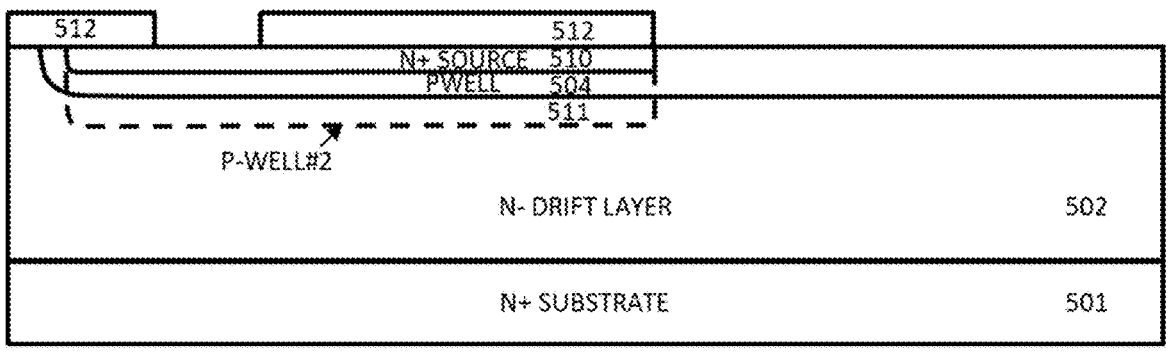
Figure 5O:
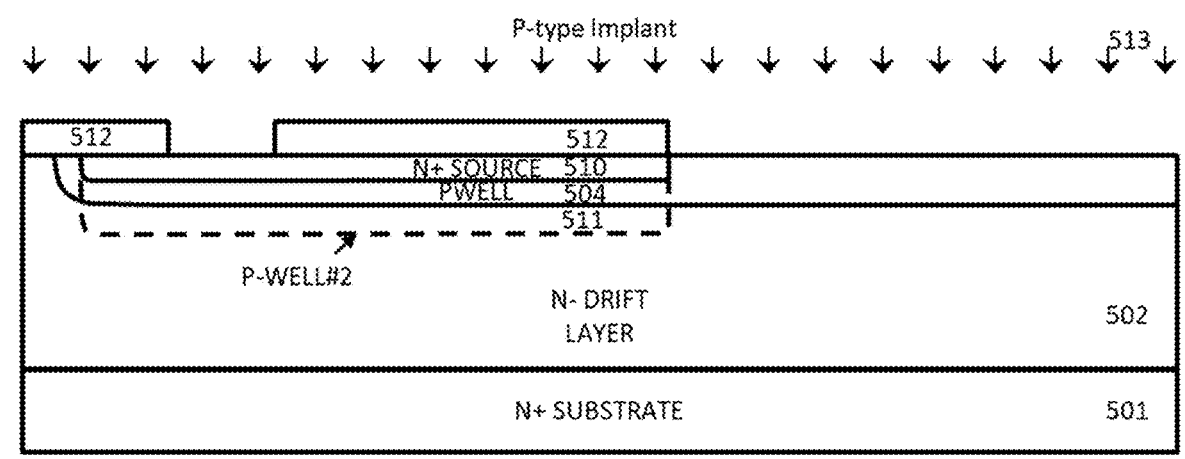
Figure 5P:
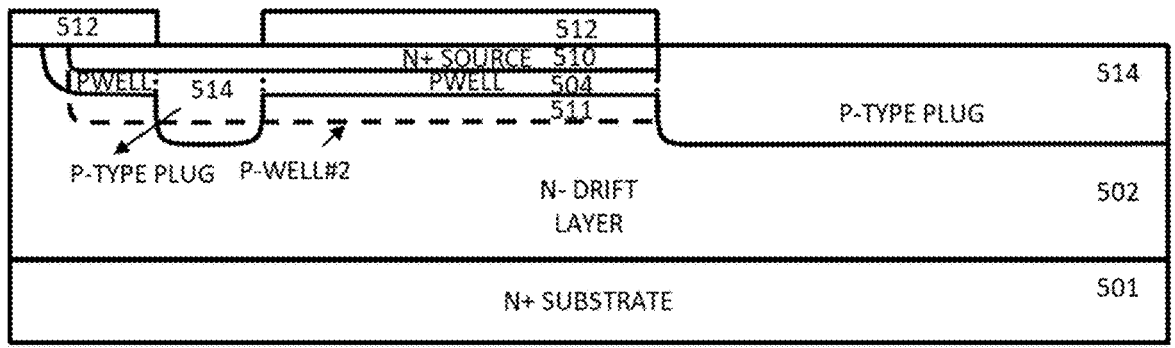
Figure 5Q:
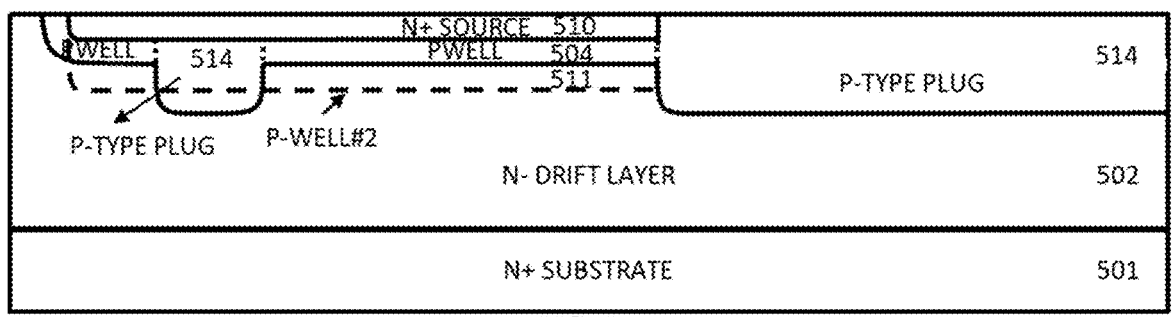

The first and second hard mask layers 503 and 506 respectively, are removed in FIG. 5l. Another mask layer 512 is deposited by a CVD deposited layer of silicon dioxide, silicon nitride, silicon oxynitride, or a metallic layer such as nickel, with thickness ranging from 50 nm to 5 μm on the top in FIG. 5m. The mask layer 512 is patterned in FIG. 5n. By implantation with a controlled dose of a p-type impurity 513 such as aluminum or boron in FIG. 5o a P+ plug region 514 buried under the N+ source region 510 is realized in FIG. 5p. The P+ plug region 514 is electrically connected to the p-well region 504 and the P-well #2 region 511. The P+ plug region may be formed deeper than the p-well and P-Well #2 regions. The mask layer 512 is then removed in FIG. 5q and the implants are activated by high-temperature annealing.

Figure 5R:
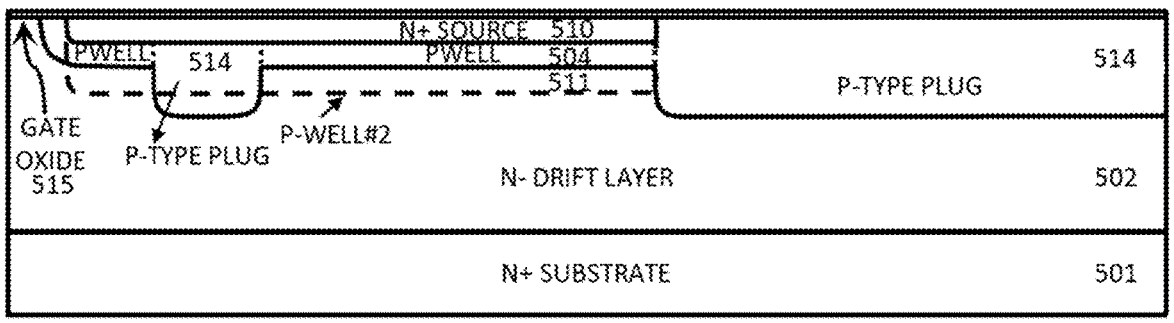
Figure 5S:
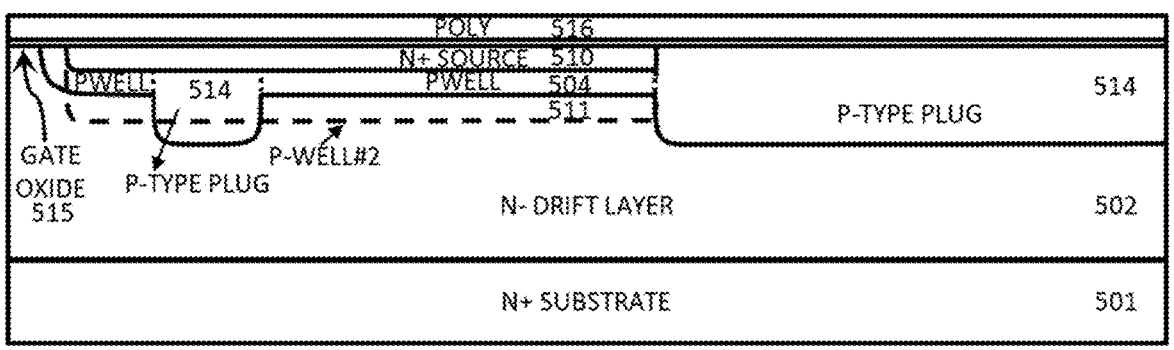
Figure 5T:
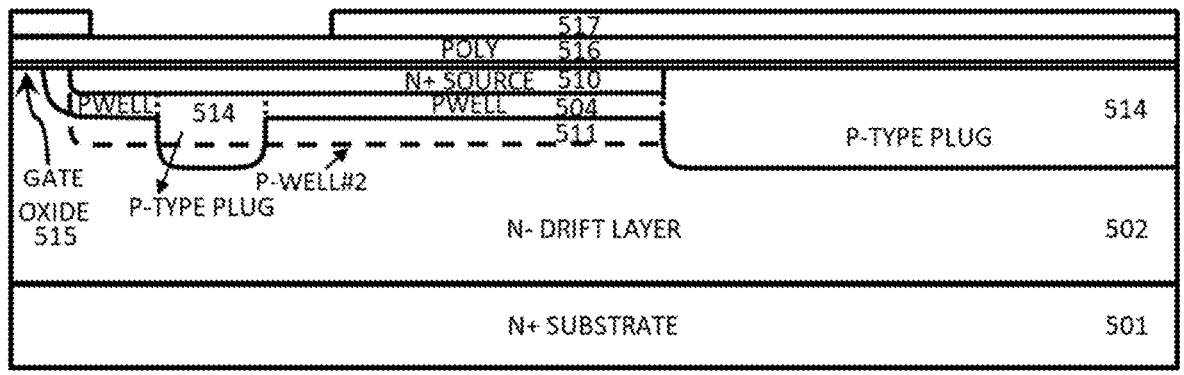
Figure 5U:
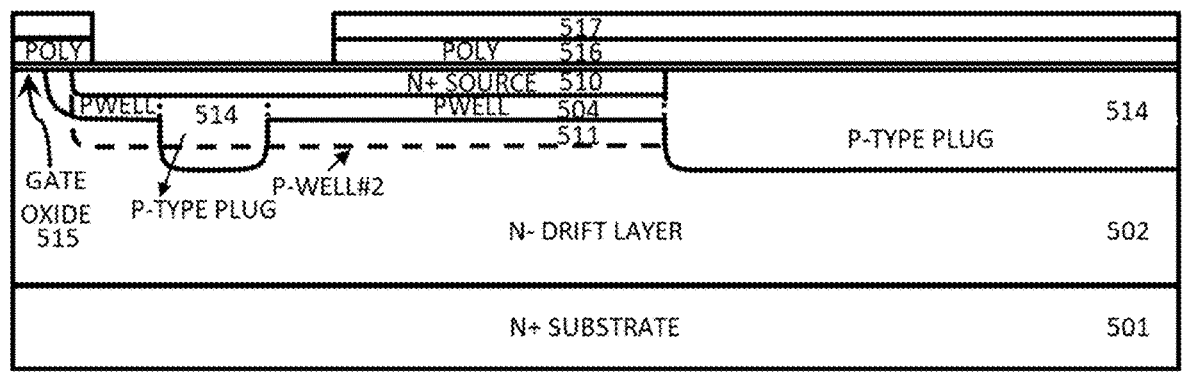
Figure 5V:
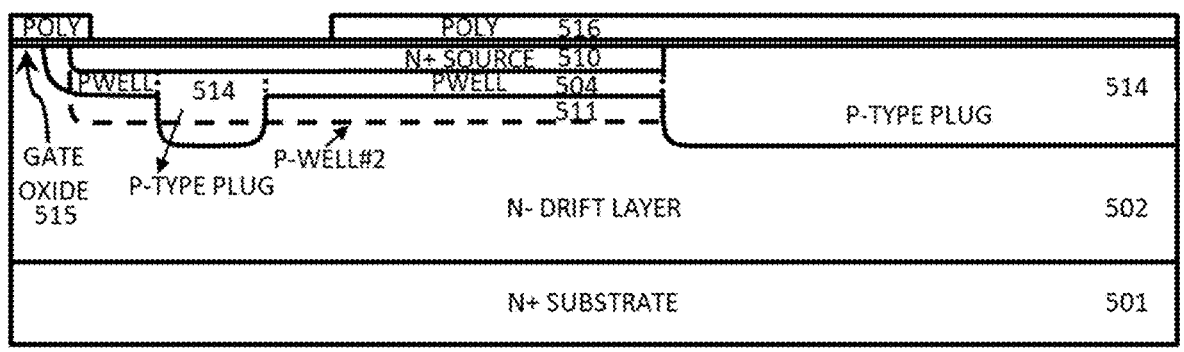
Figure 5W:
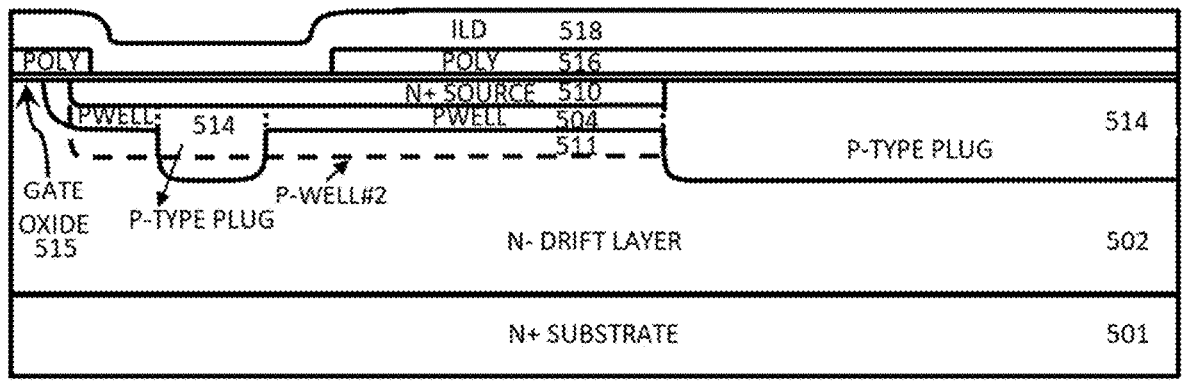
Figure 5X:
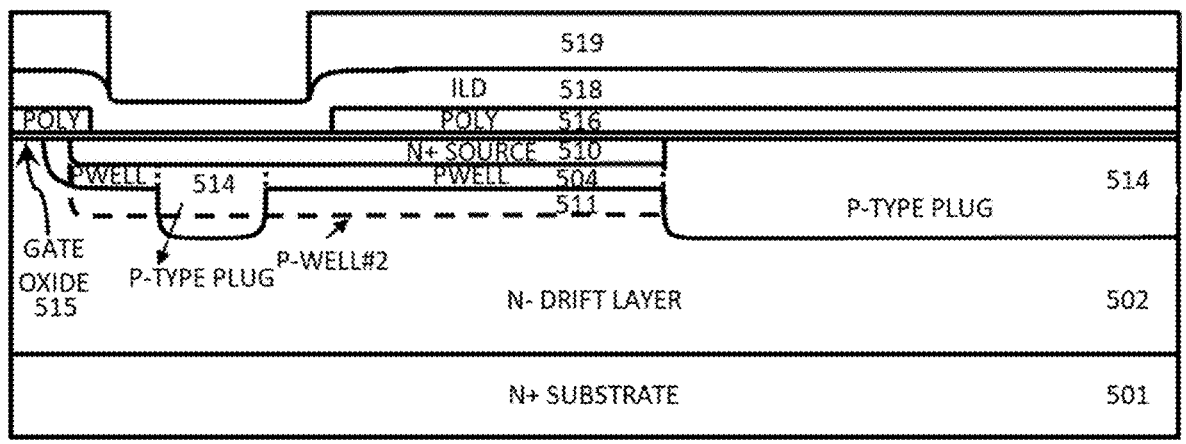
Figure 5Y:
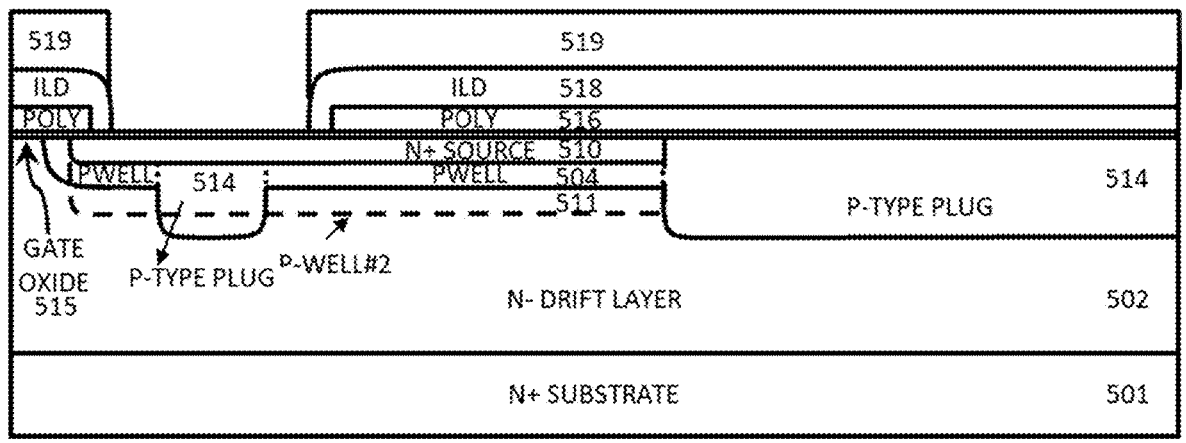
Figure 5Z:
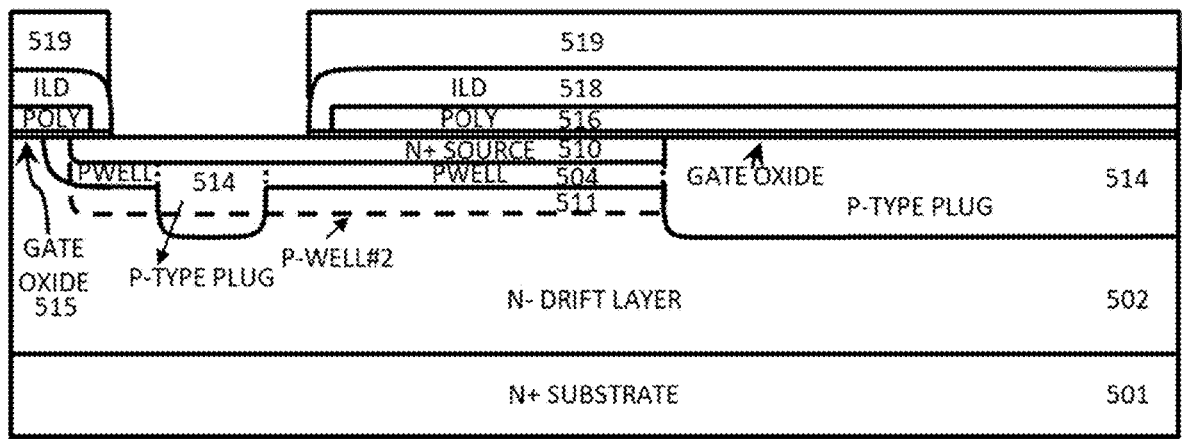
Figure 5A:
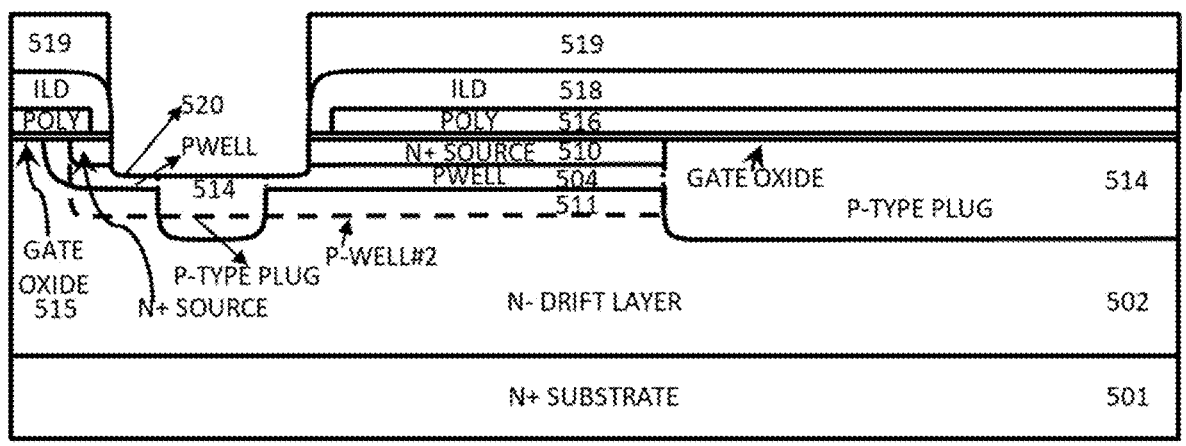
Figure 5B:
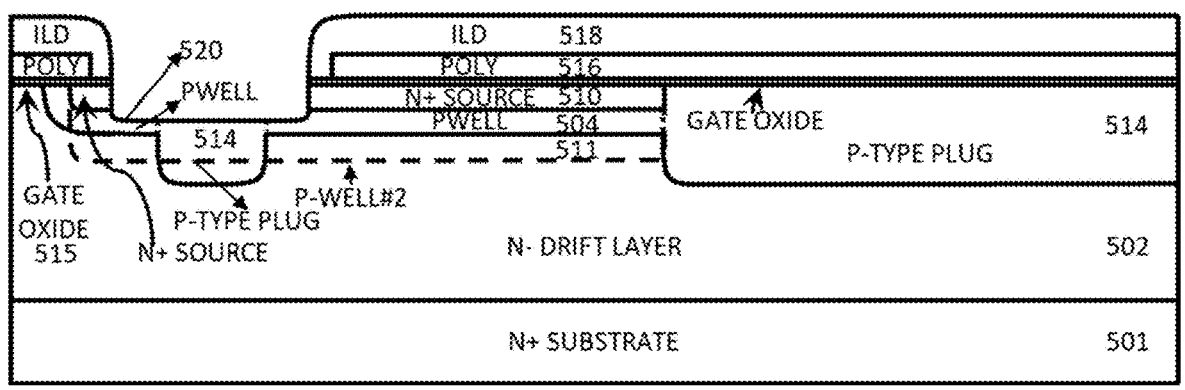
Figure 5C:
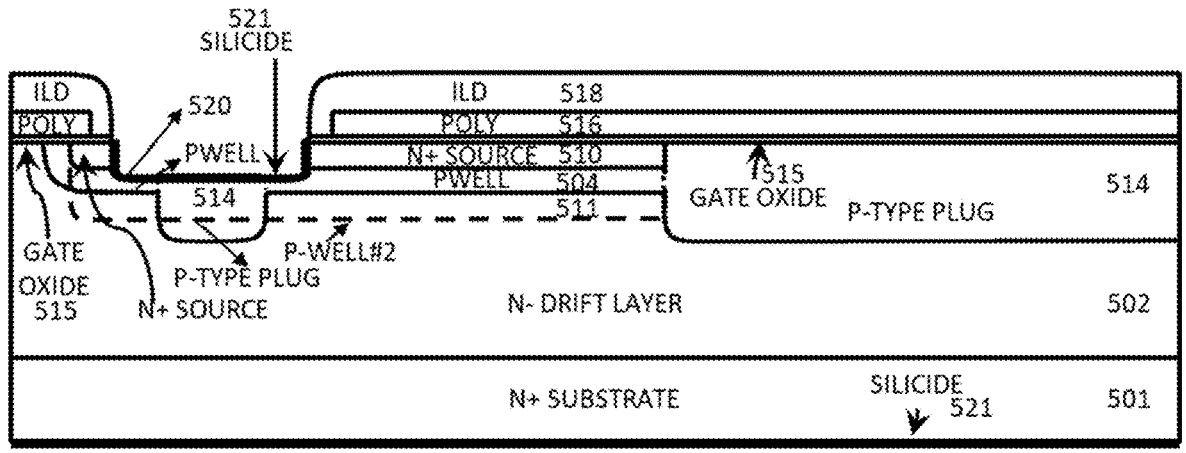
Figure 5D:
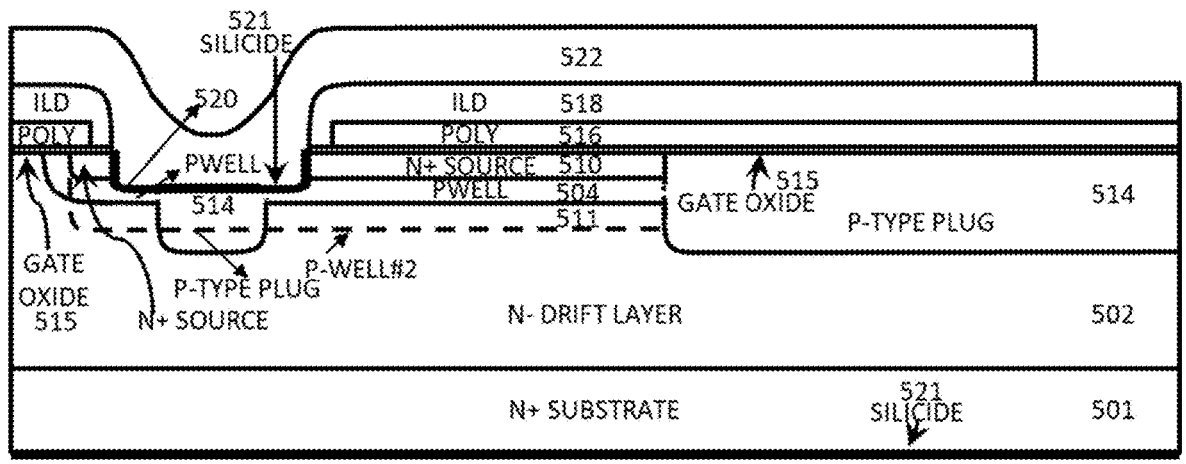
Figure 5E:
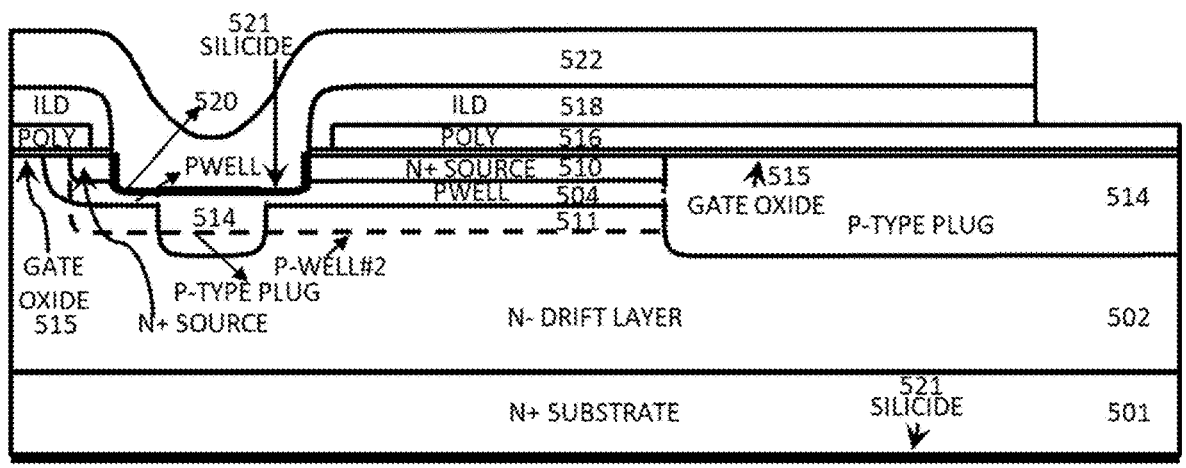
Figure 5F:
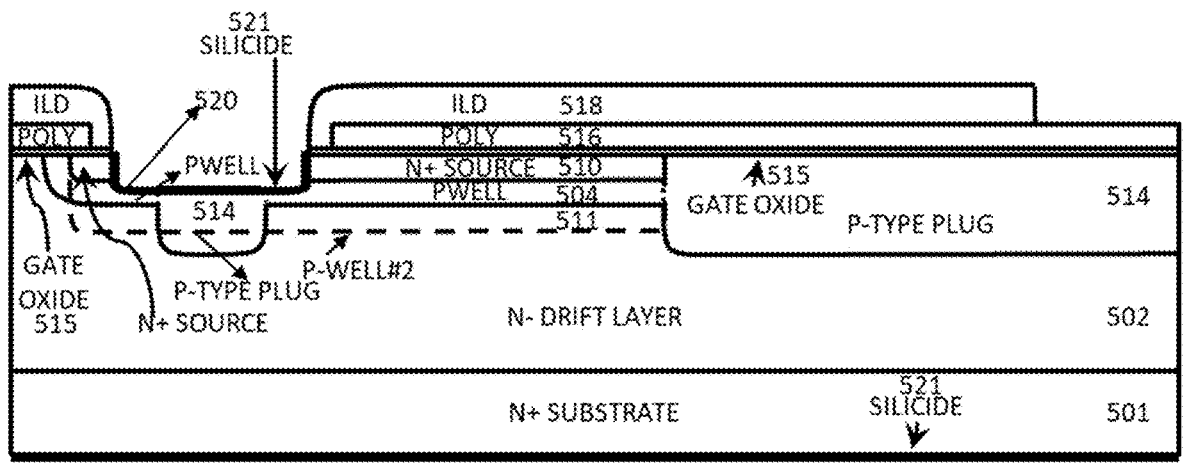
Figure 5G:
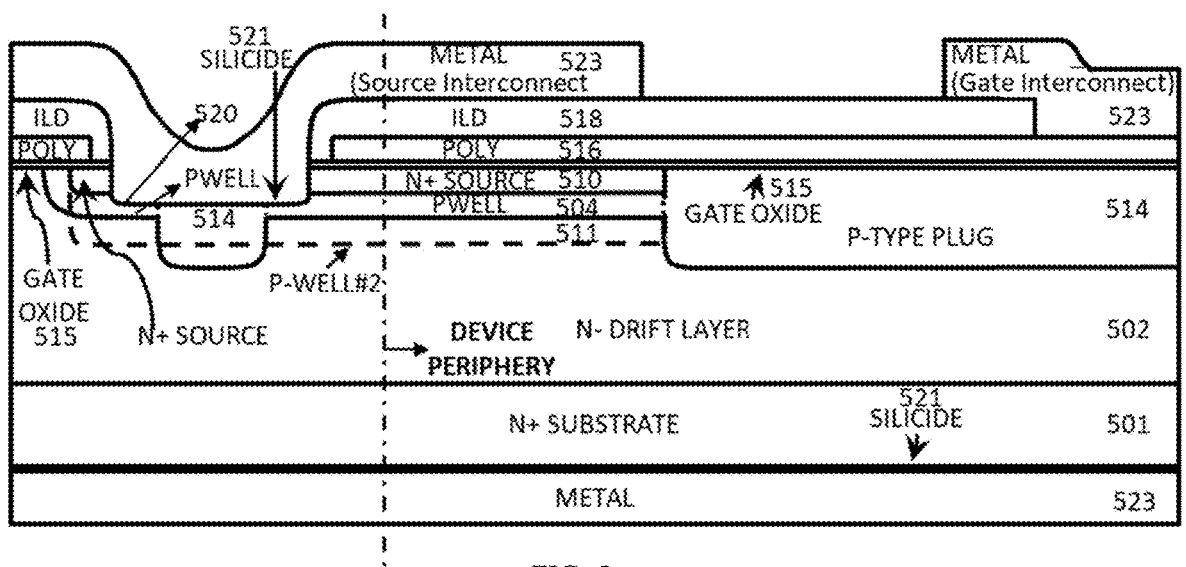

The oxide layer 515, which is the gate oxide, is formed by thermal oxidation or using CVD of a dielectric layer such as silicon dioxide, silicon nitride, silicon oxynitride, etc. in FIG. 5r. The thickness of the gate oxide could range from 10 nm to 100 nm. Either dry or wet thermal oxidation could be used for oxide growth. PECVD or LPCVD could be used for gate oxide deposition. A polysilicon gate layer 516 is then deposited in FIG. 3s. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of $POCl_3$ followed by a drive-in step at temperatures ranging from 700-900° C. A hard mask 517 is deposited by a CVD deposited layer of silicon dioxide, silicon nitride, silicon oxynitride, or a metallic layer such as nickel, with thickness ranging from 50 nm to 5 μm on the top on top and patterned as shown in FIG. 5t. The polysilicon layer 516 is etched by using the patterned mask layer 517 in FIG. 5u. The mask layer 517 is then removed in FIG. 5v. An ILD layer 518 comprising 50 nm-1000 nm thick silicon dioxide, silicon nitride, silicon oxynitride layers or a stacked combination thereof is deposited on the wafer in FIG. 5w. A hard mask 519 is deposited by a CVD deposited layer of silicon dioxide, silicon nitride, silicon oxynitride, or a metallic layer such as nickel, with thickness ranging from 50 nm to 5 μm on the top and patterned on top to define the ILD opening in FIG. 5x. The ILD layer 518 is etched using the hard mask as shown in FIG. 5y. Further the gate oxide 515 is etched using the same mask 519 in FIG. 5z. The hard mask that is used for patterning the ILD layer 519 is used to realize the source trench region 520 by etching completely through the N+ source layer and into the P+ plug layer in FIG. 5aa. The mask 519 is then removed in FIG. 5bb. A nickel silicide region 521 is formed on the exposed SiC surface in FIG. 5cc. A mask layer 522 is formed by a CVD deposited layer of silicon dioxide, silicon nitride, silicon oxynitride, or a metallic layer such as nickel, with thickness ranging from 50 nm to 5 μm on the top which is then patterned in FIG. 5dd. The ILD layer 518 is etched in FIG. 5ee. The mask layer 522 is removed in FIG. 5ff. Interconnect metal layers 523 of either aluminum or silver or gold is deposited and patterned on the top and bottom of the substrate in. FIG. 5gg. The ohmic contact to the N+ source regions is made through the etched sidewalls of the source trench regions in this embodiment, as opposed to the horizontal surfaces of the N+ source regions in conventional MOSFETs.

Figure 6:
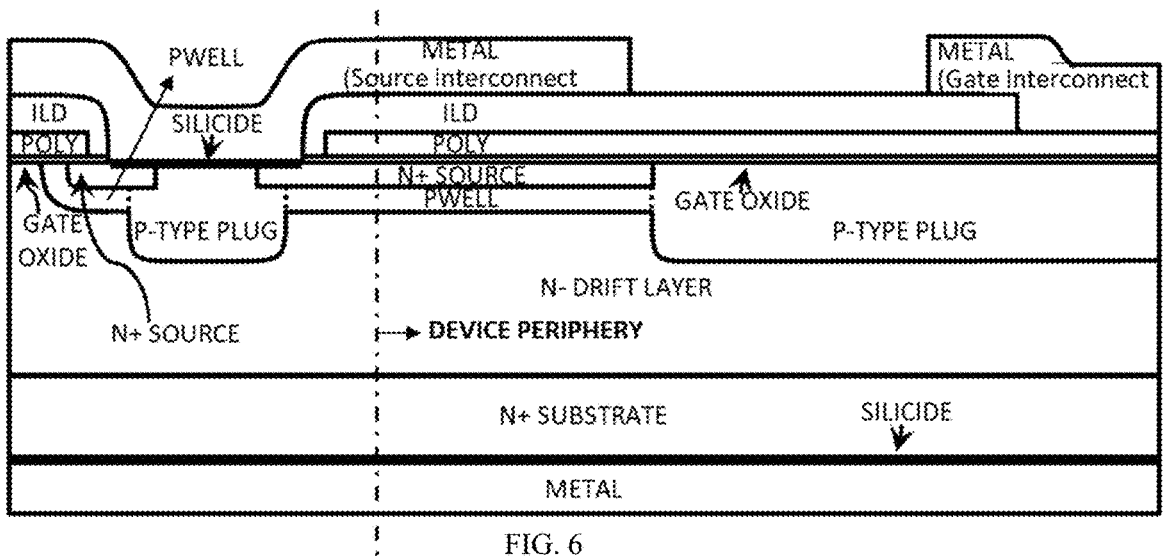
FIG. 6 shows an embodiment of a SiC DMOSFET with a dedicated process step for masking the implantation of the N+ source region in the device periphery as well as the N+ source region in the active region to enable ohmic contact to the p-well region FIG. 7a to FIG. 7ff are cross sectional views showing the process steps for manufacturing the SiC DMOSFET structure in FIG. 6.

An embodiment shown in FIG. 6 is the unit cell and the device periphery of a cross-sectional structure of a SiC DMOSFET. The key regions of this device are a p-well region 603, which is formed by ion-implantation or epitaxial re-growth of a p-type species such as aluminum or boron. There is an N+ source region 604, N– drift layer 602, and an N+ substrate 601. In the ON state when a gate voltage is applied to the polysilicon gate 607 the current flows vertically from the drain 601, through the inversion layer which is formed at the top of the p-well layer 603, through the N+ source region 604, and out through the source metallization 610. In the OFF state or the blocking state, a voltage is supported across the p-well 603, N– drift layer 602 junction and there is a PN junction which is formed between the p-well and the N– drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 606. Another feature is an ILD layer 608 which is used to insulate the source interconnect metallization 610 from the polysilicon gate 607. At the very center of the unit cell, there is a P+ plug layer 605 which is grounded with the N+ source metallization. The purpose of the P+ plug in SiC DMOSFET is to ground the p-well region with the N+ source contact.

In an embodiment herein, a dedicated masking step is interspersed between the formation of the sidewall spacer after the p-well implant and before the N+ source implant to mask the N+ source implant from the peripheral regions of the MOSFET. This also masks the N+ source implant from selected regions in the active area of the device, which enables ohmic contact to the p-well or P+ plug region. This embodiment obviates the need for a source trench that is present in earlier embodiments.

In the embodiment herein, a dedicated hard mask or photoresist layer is applied after the sidewall spacer is formed and before the N+ source implantation which prevents the formation of the N+ source region in the device periphery and parasitic NPN structures in the device periphery are avoided. The implantation of the N+ source region is avoided in selected areas in the active region and this enables ohmic contact to the p-well or P+ plug regions without an intervening N+ source region.

Figure 7A:
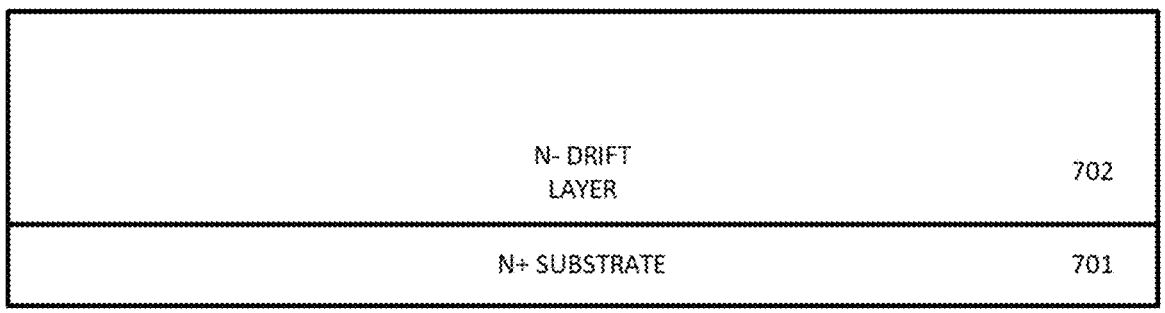
Figure 7B:
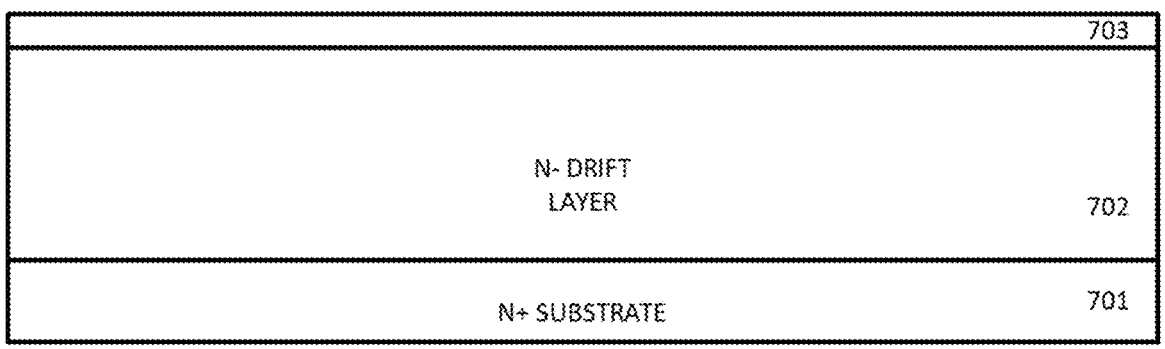
Figure 7C:
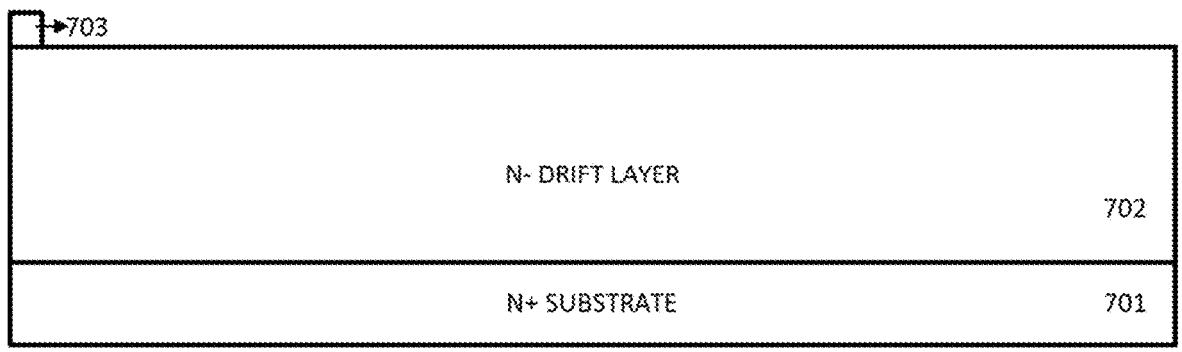
Figure 7D:
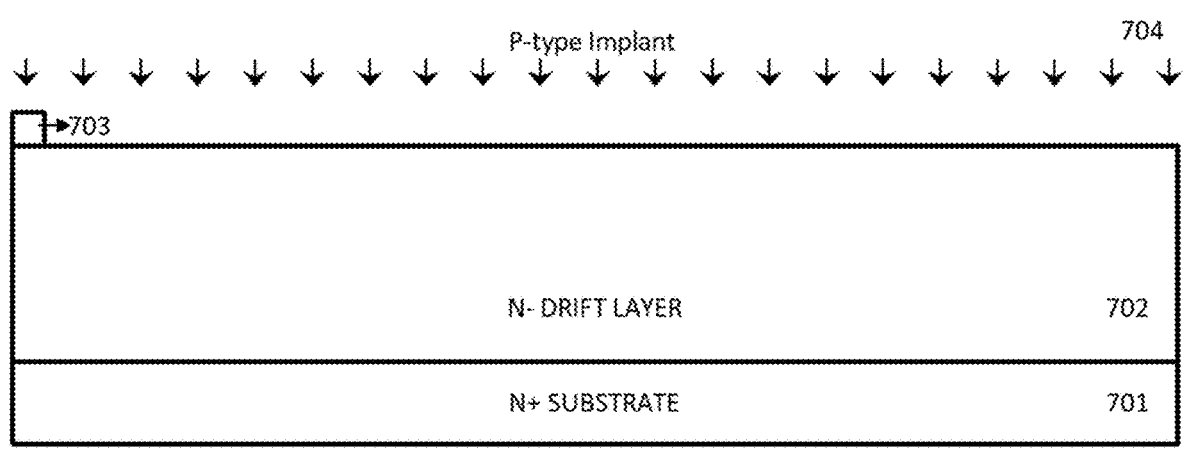
Figure 7E:
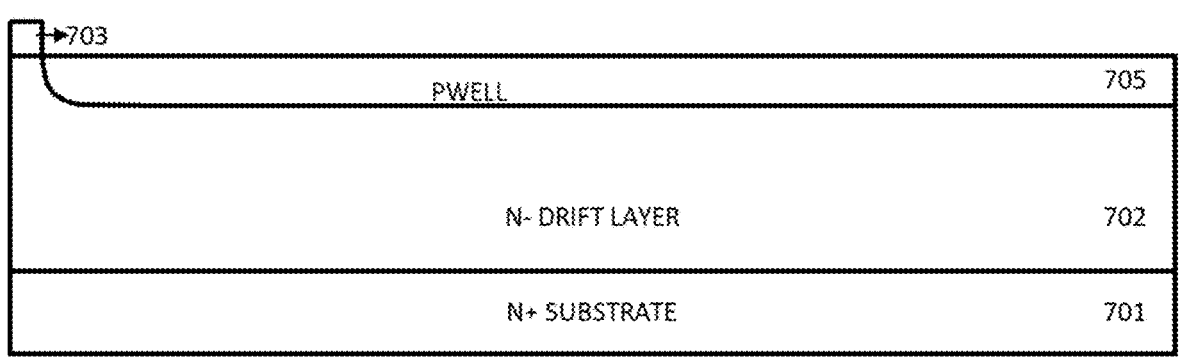

FIG. 7a to FIG. 7ff describes the process of manufacturing the structure shown in FIG. 6. The manufacturing process for a SiC DMOSFET is on a SiC substrate 701 and starts with using a 4H-SiC Si-face epi-wafer with suitable doping ($10^{14}$-$10^{18}$ $cm^{-3}$) and thickness (1 μm to 300 μm) for the epilayer 702 shown in FIG. 7a. A blanket hard mask 703 comprising a CVD deposited layer of silicon dioxide, silicon nitride, silicon oxynitride, or a metallic layer such as nickel, with thickness ranging from 50 nm to 5 μm is deposited in FIG. 7b and then patterned using photolithography followed by a dry etch using RIE for example as shown in FIG. 7c. Then p-well region is first formed by ion-implantation or epitaxial growth using aluminum or boron as the p-type impurity. A p-type implantation 704 comprising boron or aluminum, at energies ranging from 10 keV to 800 keV, at implant doses ranging from $10^{12}$ $cm^{-2}$ to $10^{15}$ $cm^{-2}$ in FIG. 7d is performed to create a p-well 705 in FIG. 7e.

Figure 7F:
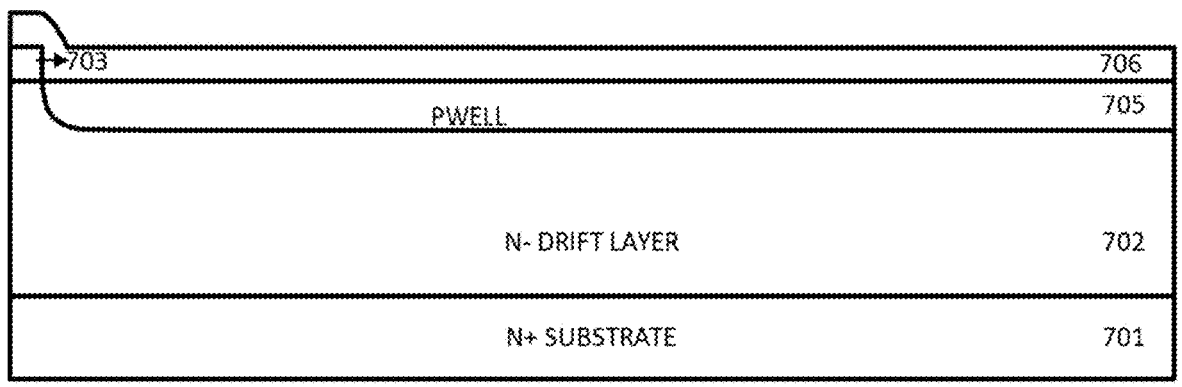
Figure 7G:
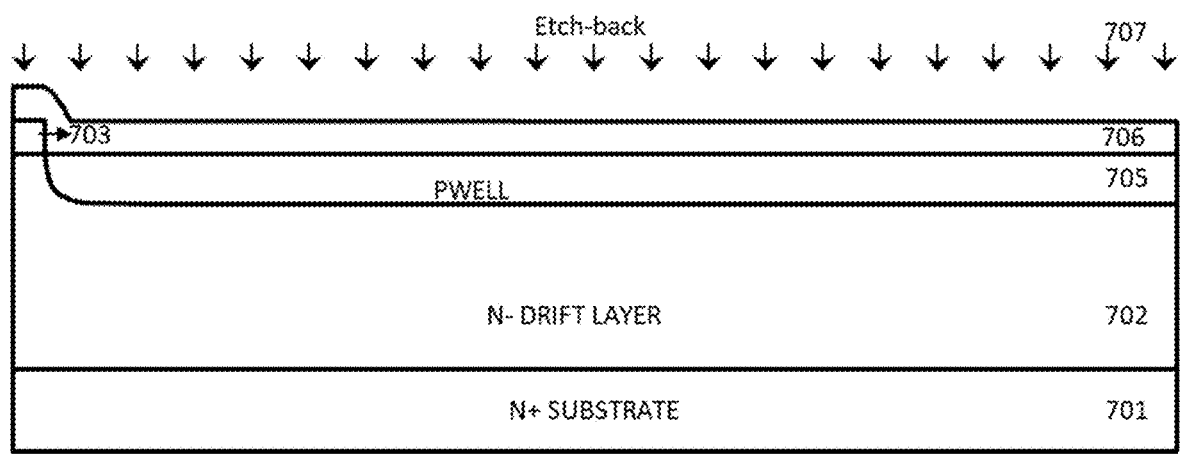
Figure 7H:
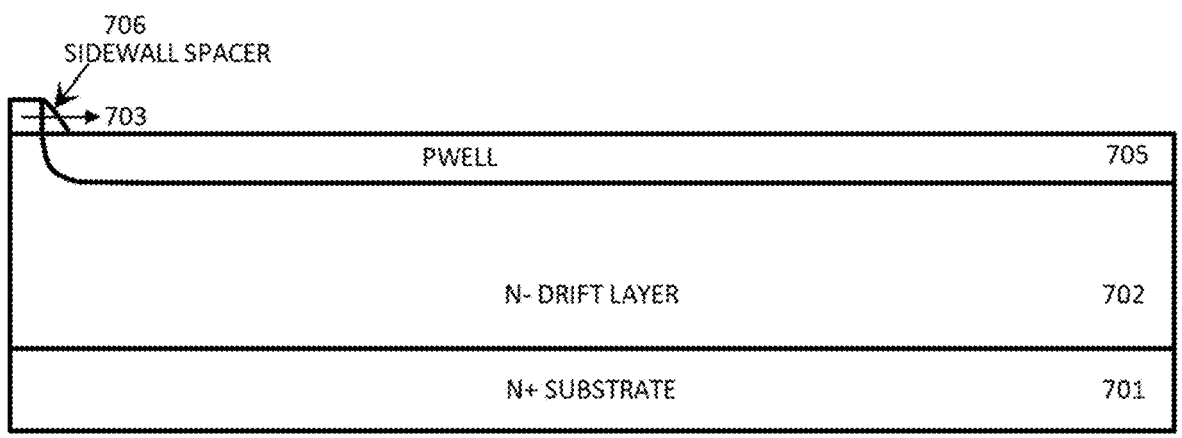
Figure 7I:
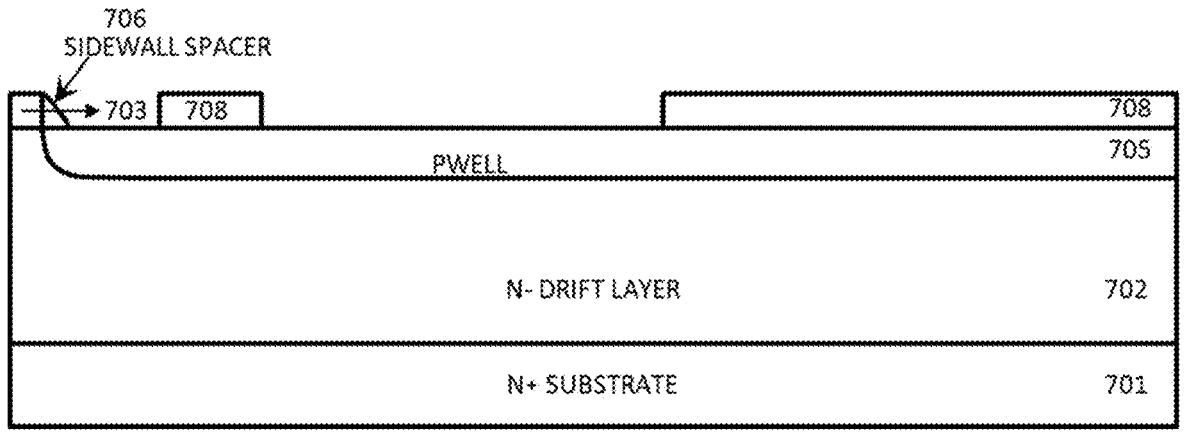
Figure 7J:
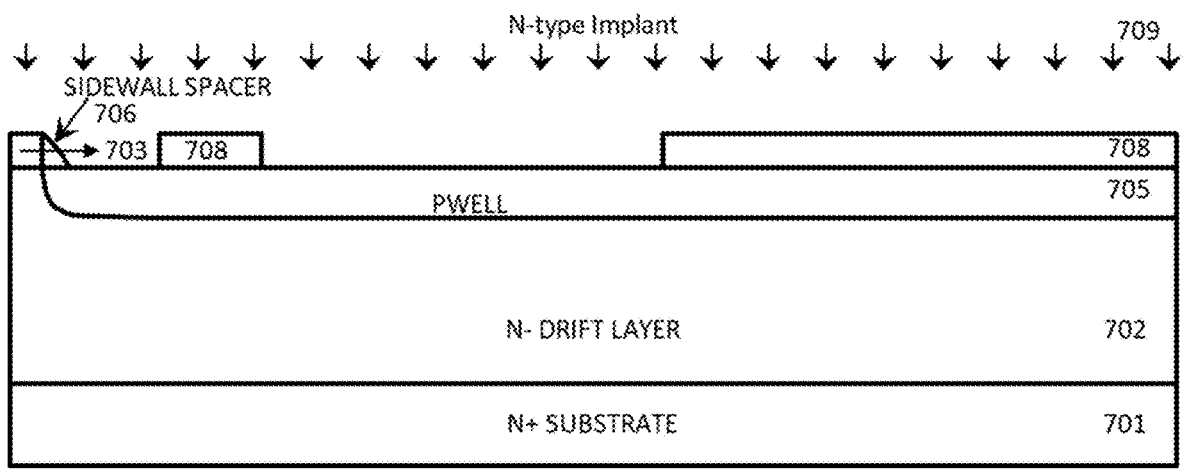
Figure 7K:
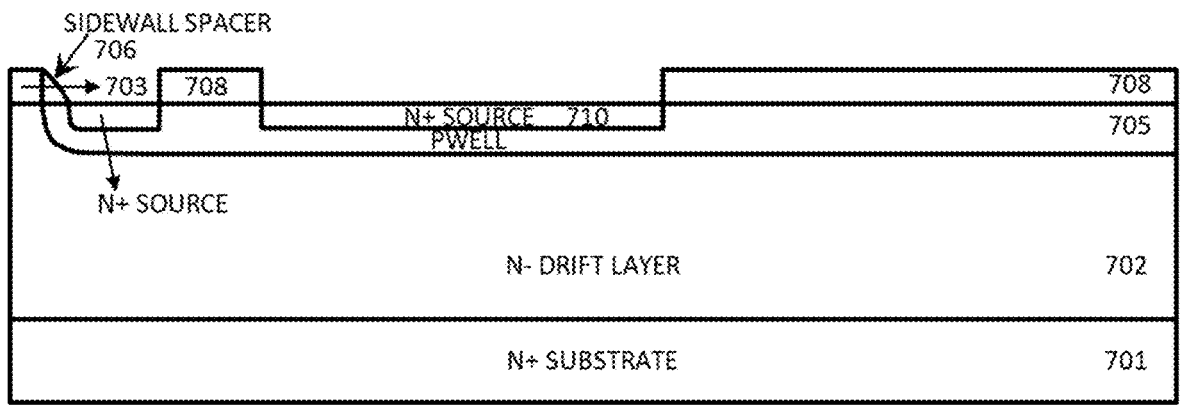
Figure 7L:
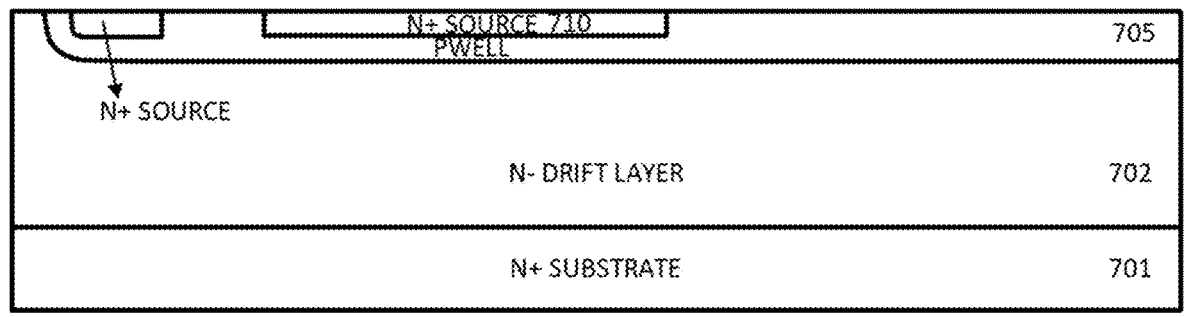
Figure 7M:
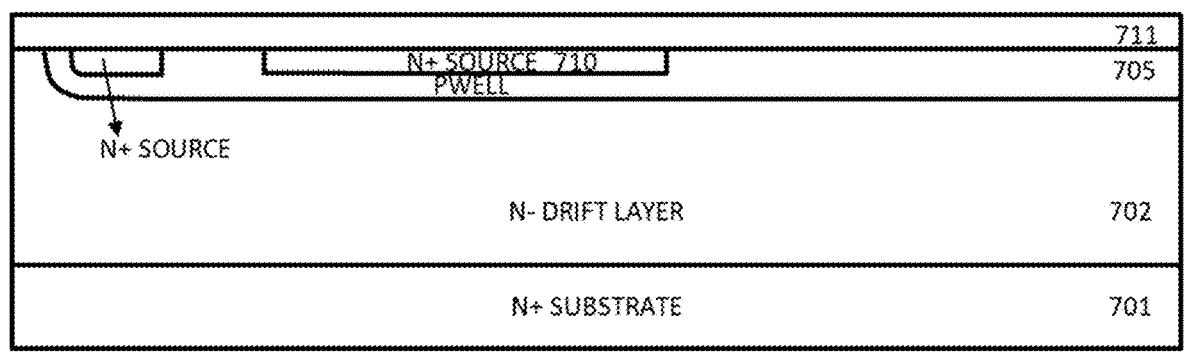
Figure 7N:
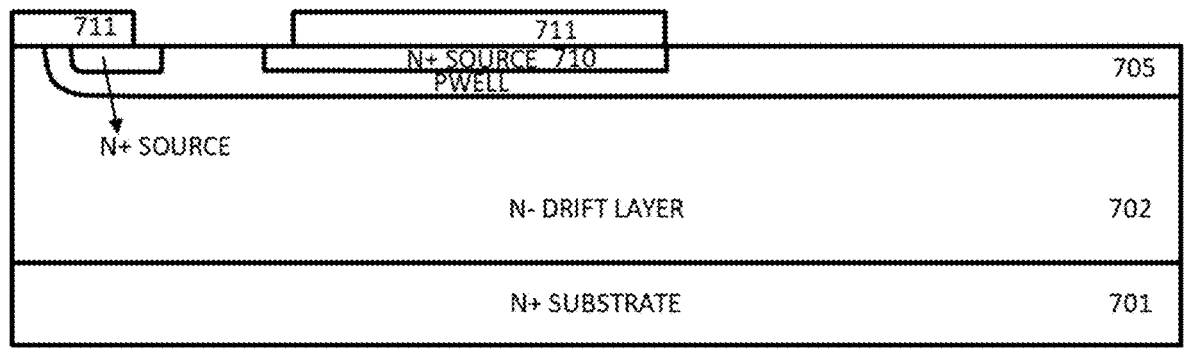

A second hard mask layer 706 is deposited by a CVD deposited layer of silicon dioxide, silicon nitride, silicon oxynitride, or a metallic layer such as nickel, with thickness ranging from 50 nm to 5 μm in FIG. 7f on top of the patterned first hard mask layer 703. This is followed by an anisotropic etching 707 in FIG. 7g to form a sidewall spacer 706 as shown in FIG. 7h. A hard mask layer 708 is deposited by a CVD deposited layer of silicon dioxide, silicon nitride, silicon oxynitride, or a metallic layer such as nickel, with thickness ranging from 50 nm to 5 μm and pattered in FIG. 7i. The patterned mask layer is formed on the top alongside the patterned mask layer with the sidewall spacer 706. An n-type implant 709 is done in FIG. 7j for creating a N+ source region 710 in FIG. 7k. A N+ source region is formed by ion-implantation or by epitaxial re-growth by an n-type impurity such as nitrogen or phosphorus. Thus, the source region 710 is formed in a self-aligned fashion with the p-well region 705 while it is masked from the peripheral regions of the device, as well as selected areas of the active region of the device, to enable contact with the source ohmic metallization. The first and second hard mask layers 703 and 708 respectively, are removed in FIG. 7l. Another mask layer 711 is deposited by a CVD deposited layer of silicon dioxide, silicon nitride, silicon oxynitride, or a metallic layer such as nickel, with thickness ranging from 50 nm to 5 µm on the top in FIG. 7*m*. The mask layer 711 is patterned in FIG. 7*n*.

Figure 7O:
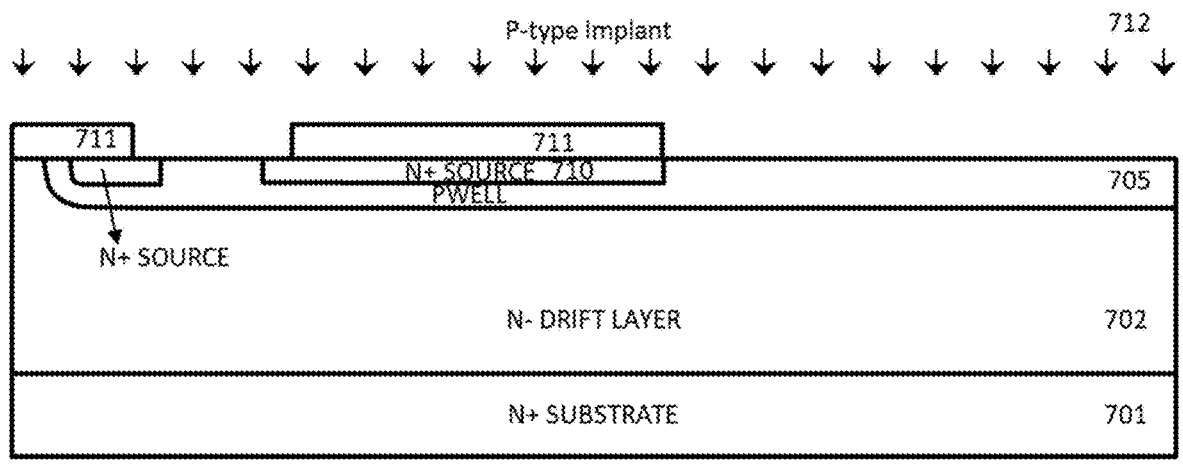
Figure 7P:
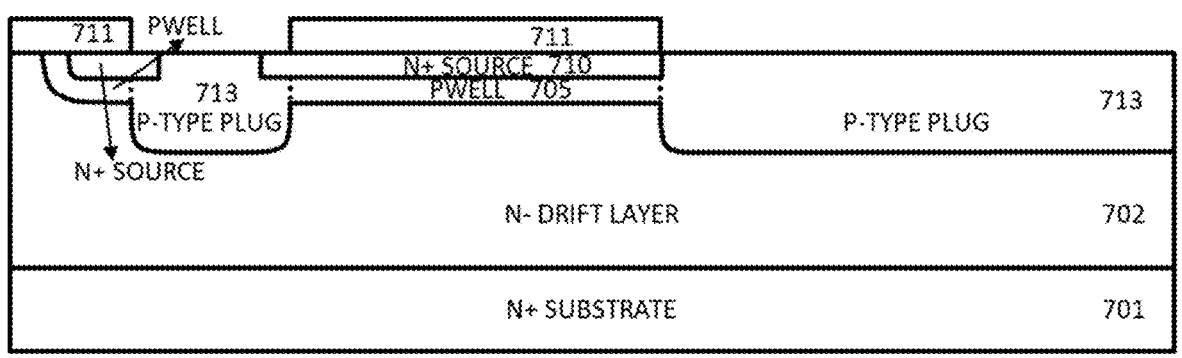
Figure 7Q:
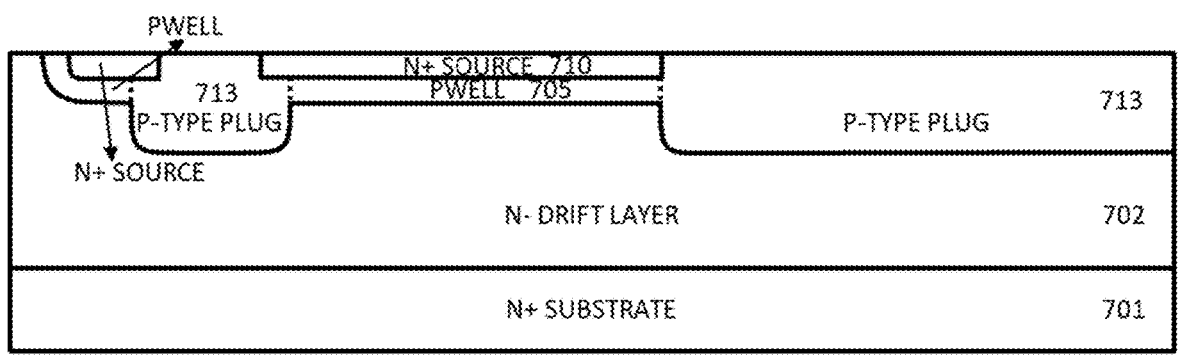

Using the hard mask 711, by implantation of a controlled dose of a p-type impurity 712 such as aluminum or boron in FIG. 7*o* a P+ plug region is realized in FIG. 7*p*. The depth of the P+ plug layer 713 may preferably exceed the depth of the N+ source implant and may even exceed the depth of the p-well region, in a particular implementation. The mask layer 711 is removed in FIG. 7*q*. The wafer is annealed for activating the implanted impurities.

Figure 7R:
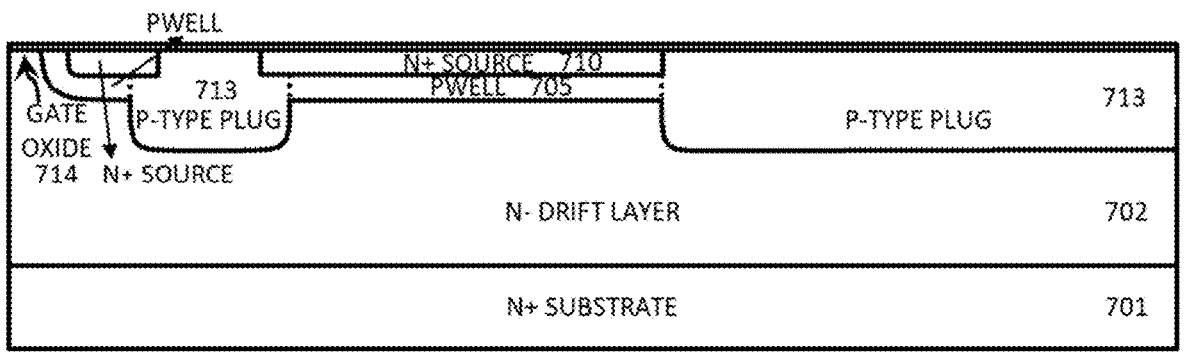
Figure 7S:
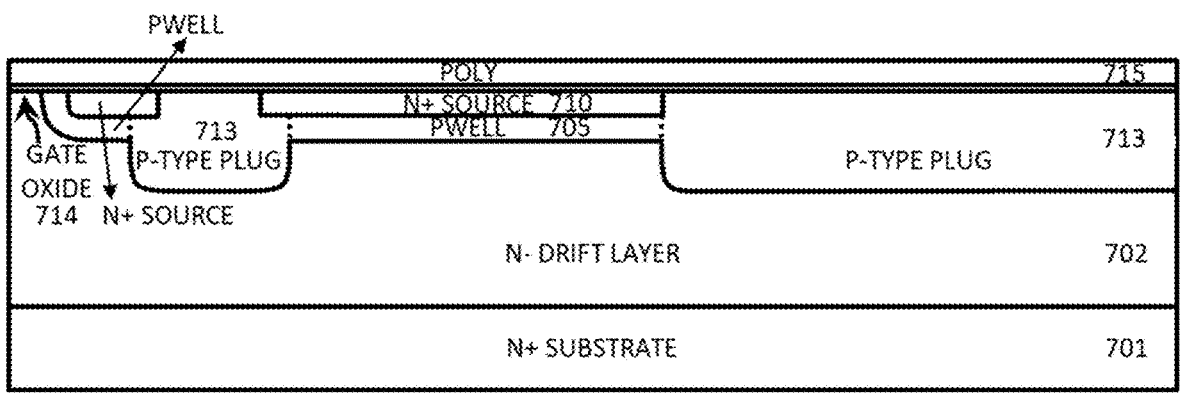
Figure 7T:
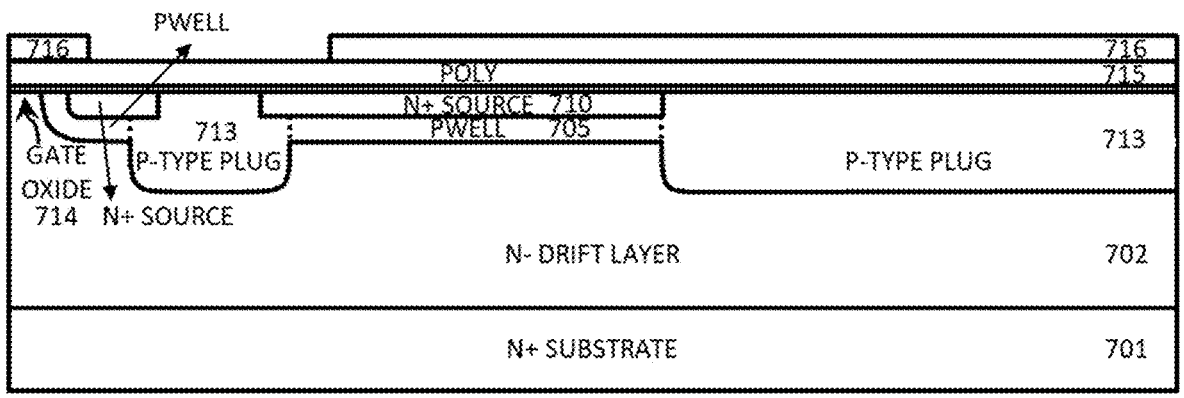
Figure 7U:
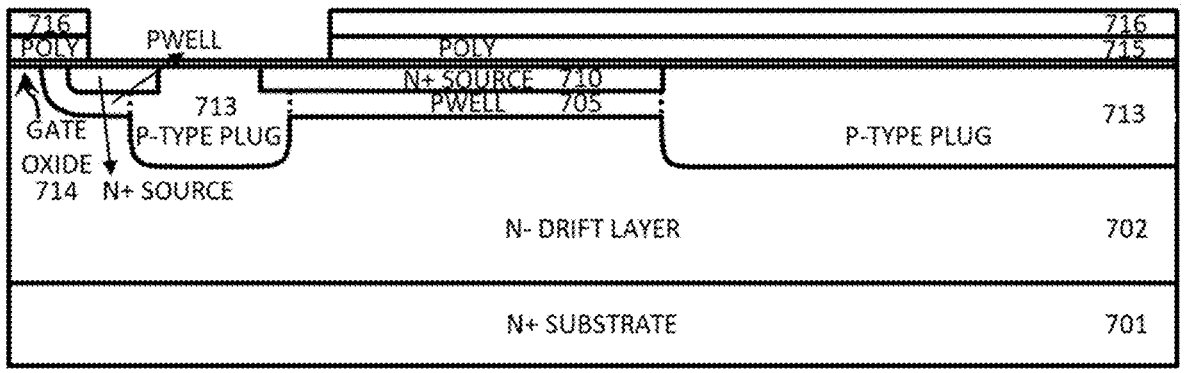
Figure 7V:
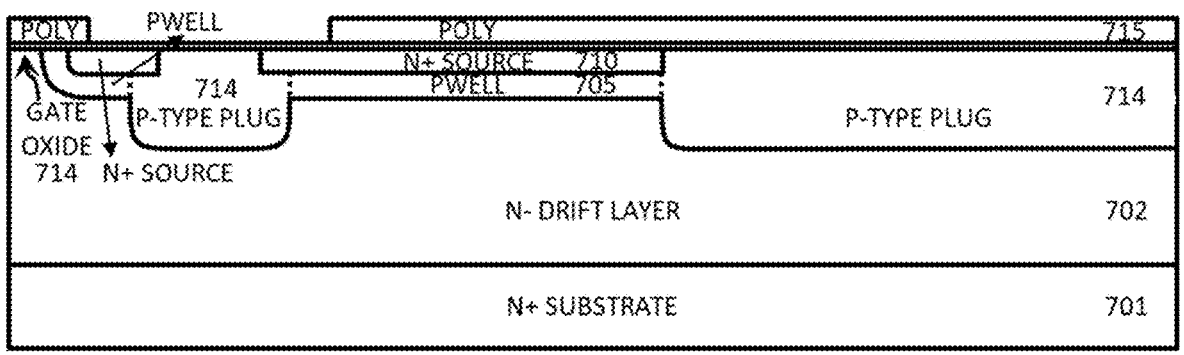
Figure 7W:
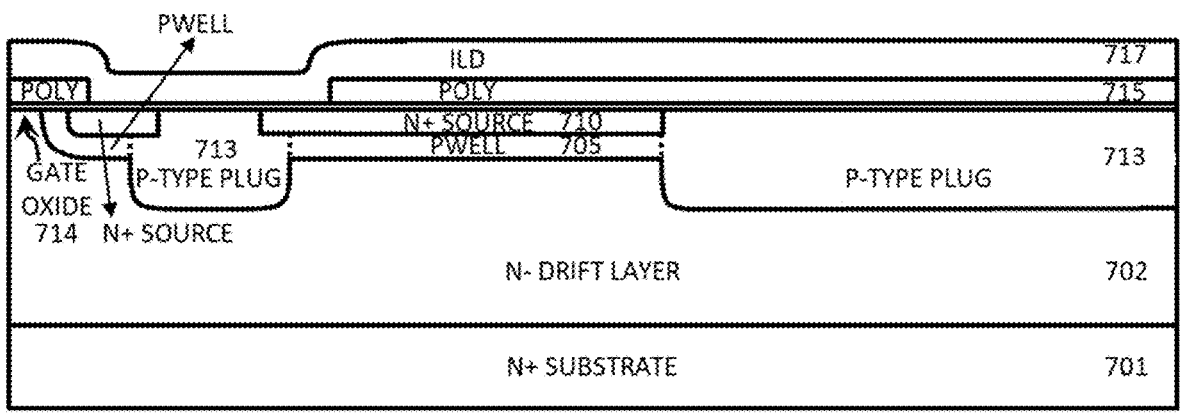

The oxide layer 714 which is the gate oxide is formed by thermal oxidation or using CVD of a dielectric layer such as silicon dioxide, silicon nitride, silicon oxynitride, etc. in FIG. 7*r*. The thickness of the gate oxide could range from 10 nm to 100 nm. Either dry or wet thermal oxidation could be used for oxide growth. PECVD or LPCVD could be used for gate oxide deposition. A polysilicon gate layer 715 is then deposited in FIG. 7*s*. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask 716 is deposited by a CVD deposited layer of silicon dioxide, silicon nitride, silicon oxynitride, or a metallic layer such as nickel, with thickness ranging from 50 nm to 5 µm on the top on top and patterned as shown in FIG. 7*t*. The polysilicon layer 715 is etched by using the patterned mask layer 716 in FIG. 7*u*. The mask layer 716 is then removed in FIG. 7*v*. An ILD layer 717 comprising 50 nm-1000 nm thick silicon dioxide, silicon nitride, silicon oxynitride layers or a stacked combination thereof is deposited on the wafer in FIG. 7*w*.

Figure 7X:
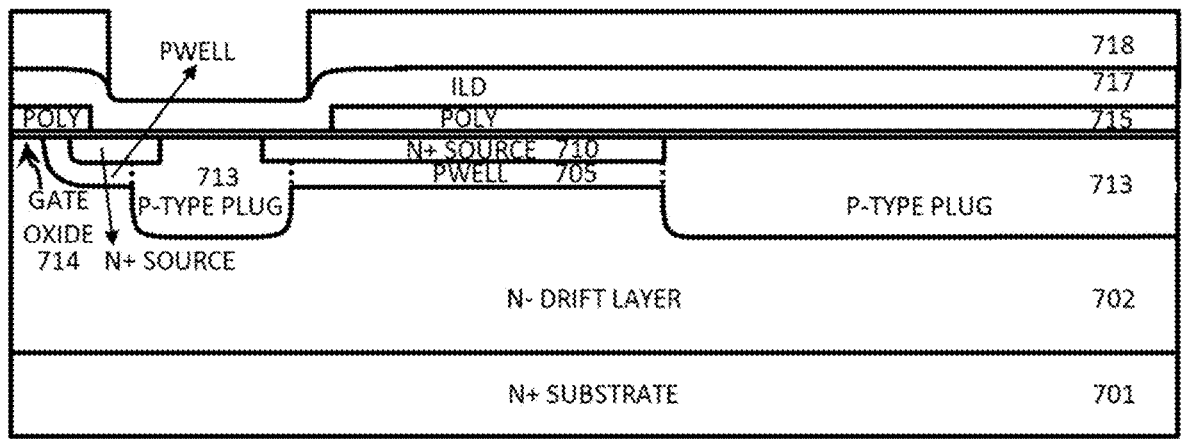
Figure 7Y:
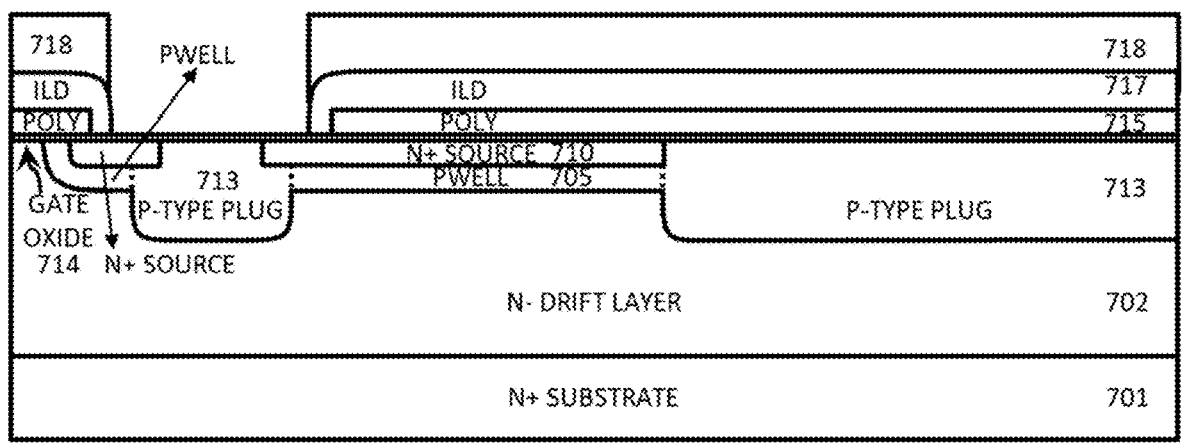
Figure 7Z:
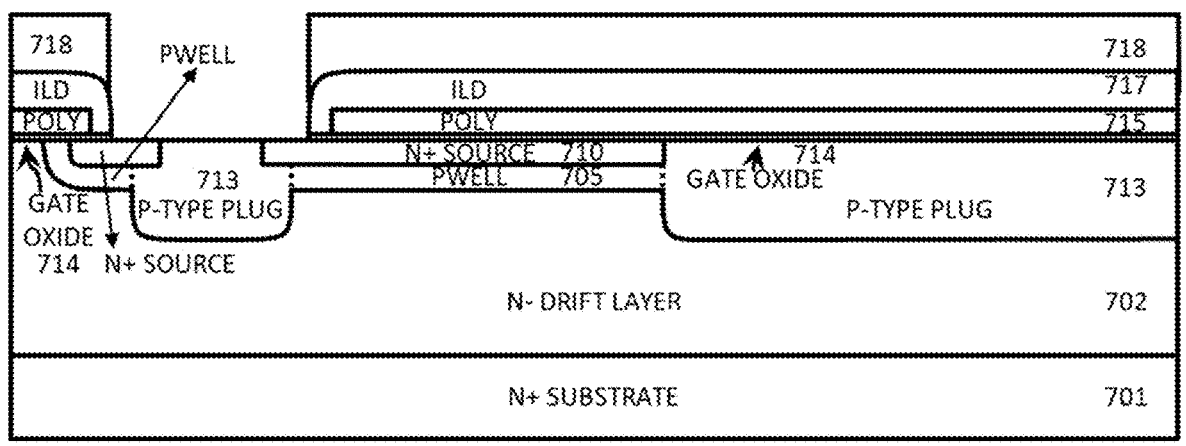
Figure 7A:
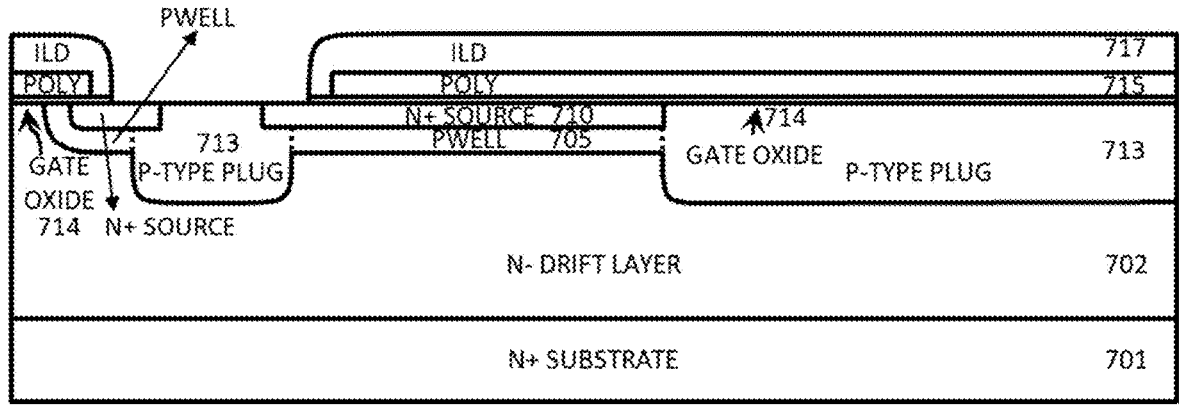
Figure 7B:
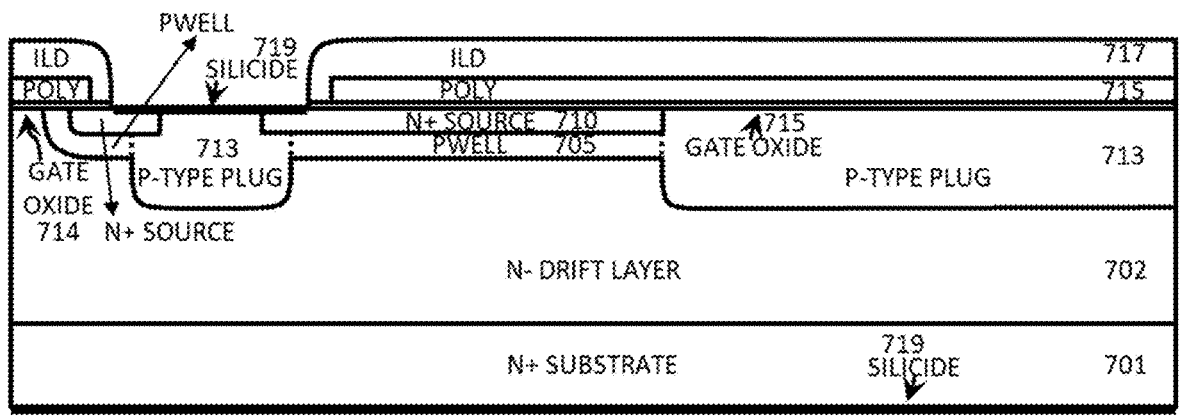
Figure 7C:
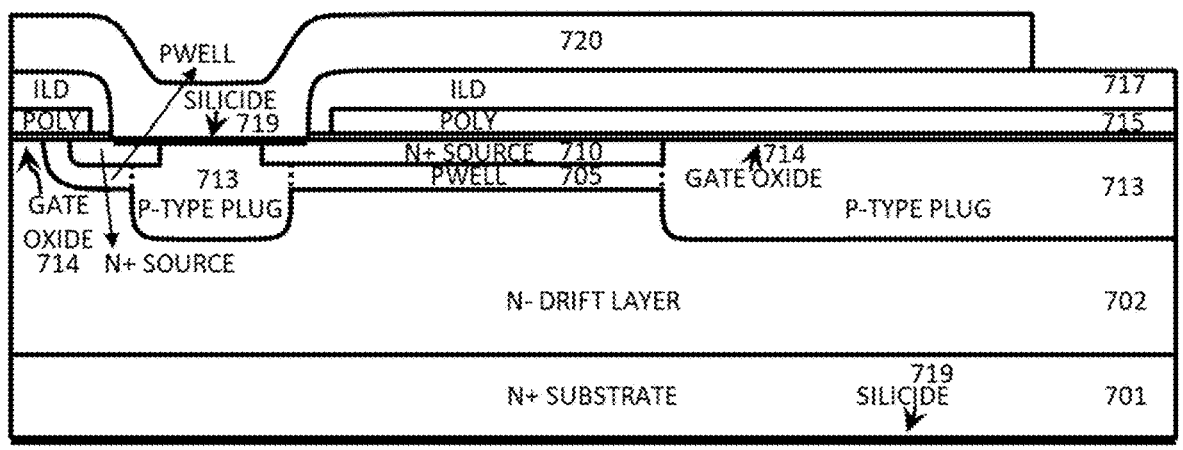
Figure 7D:
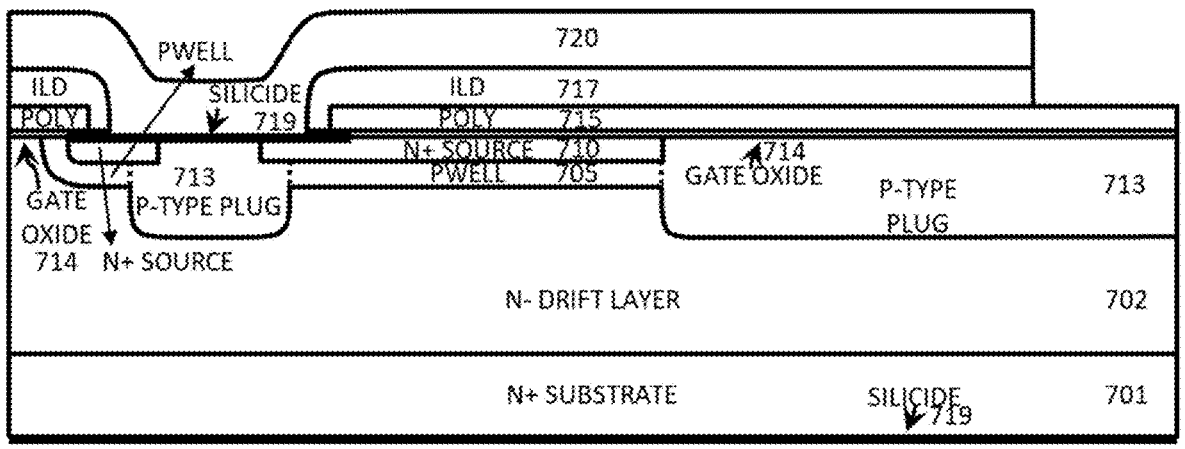
Figure 7E:
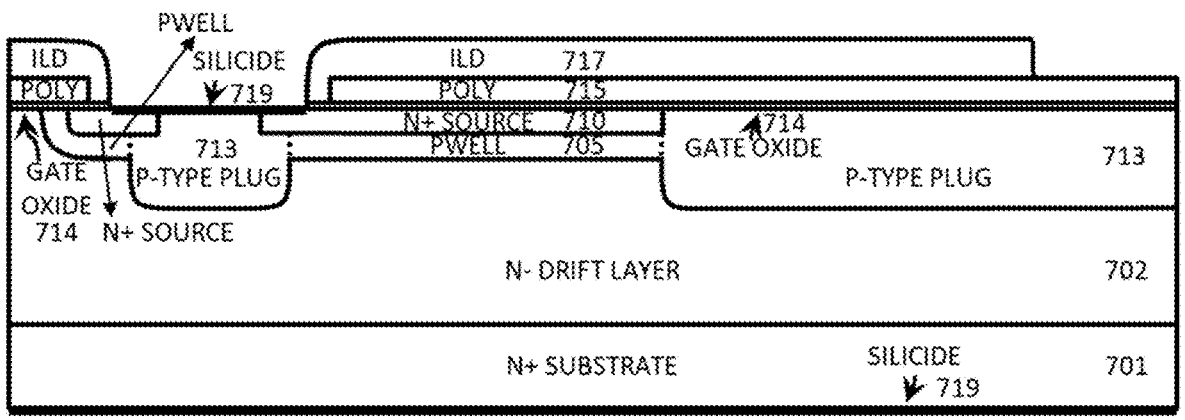
Figure 7F:
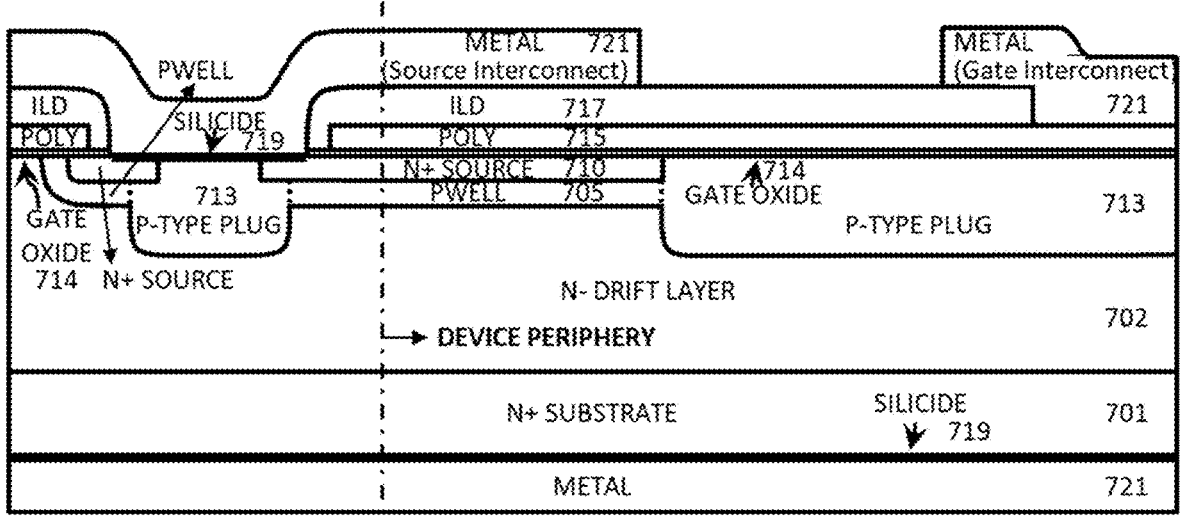

A hard mask 718 is deposited by a CVD deposited layer of silicon dioxide, silicon nitride, silicon oxynitride, or a metallic layer such as nickel, with thickness ranging from 50 nm to 5 µm on the top and patterned on top to define the ILD opening in FIG. 7*x*. The ILD layer 717 is etched using the hard mask as shown in FIG. 7*y*. Further the gate oxide 714 is etched using the same mask 718 in FIG. 7*z*. The mask 718 is then removed in FIG. 7*aa*. A nickel silicide region 719 is formed on the exposed SiC surface in FIG. 7*bb*. A mask layer 720 is formed by a CVD deposited layer of silicon dioxide, silicon nitride, silicon oxynitride, or a metallic layer such as nickel, with thickness ranging from 50 nm to 5 µm on the top which is then patterned in FIG. 7*cc*. The ILD layer 717 is etched in FIG. 7*dd*. The mask layer 720 is removed in FIG. 1*ee*. Interconnect metal layers 721 of either aluminum or silver or gold is deposited and patterned on the top and bottom of the substrate in FIG. 7*ff*.

Figure 8:
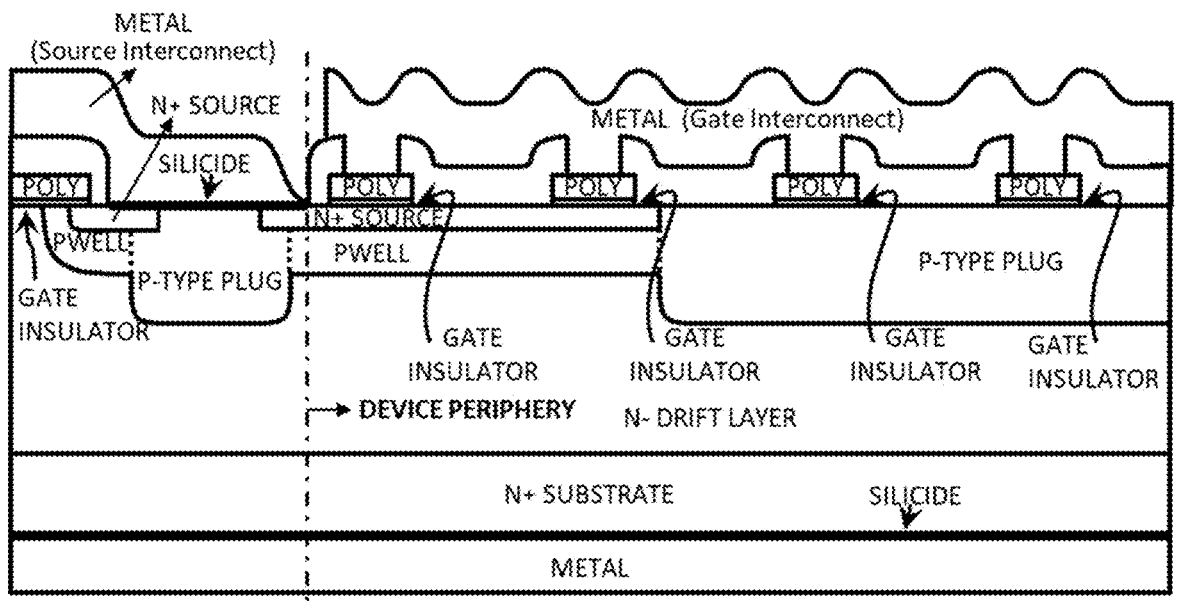
FIG. 8 shows an embodiment of a SiC DMOSFET where the polysilicon gate metallization layers are segmented in the peripheral region.

An embodiment shown in FIG. 8 is the unit cell and the device periphery of a cross-sectional structure of a SiC DMOSFET. The key regions of this device are a p-well region 803, which is formed by ion-implantation or epitaxial re-growth of a p-type species such as aluminum or boron. There is an N+ source region 804, N− drift layer 802, and an N+ substrate 801. In the ON state when a gate voltage is applied to the polysilicon gate 807 the current flows vertically from the drain 801, through the inversion layer which is formed at the top of the p-well layer 803, through the N+ source region 804, and out through the source metallization 810. In the OFF state or the blocking state, a voltage is supported across the p-well 803, N− drift layer 802 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 806. Another feature is an ILD layer 808 which is used to insulate the source interconnect metallization 810 from the polysilicon gate 807. At the very center of the unit cell, there is a P+ plug layer 805 which is grounded with the N+ source metallization. The purpose of the P+ plug in SiC DMOSFET is to ground the p-well region with the N+ source contact.

In an embodiment herein, a dedicated masking step is interspersed between the formation of the sidewall spacer after the p-well implant and before the N+ source implant to mask the N+ source implant from the peripheral regions of the MOSFET. This also masks the N+ source implant from selected regions in the active area of the device, which enables ohmic contact to the p-well or P+ plug region. This embodiment obviates the need for a source trench that is present in some earlier embodiments.

In the embodiment herein, a dedicated hard mask or photoresist layer is applied after the sidewall spacer is formed and before the N+ source implantation which prevents the formation of the N+ source region in the device periphery and parasitic NPN structures in the device periphery are avoided. The implantation of the N+ source region is avoided in selected areas in the active region and this enables ohmic contact to the p-well or P+ plug regions without an intervening N+ source region.

In the embodiment herein, the polysilicon metallization in the peripheral regions of the device 807 are segmented and not a contiguous layer. In the embodiment herein, the formation of the segmented gate metallization in the periphery of the device instead of a contiguous gate bus could significantly decrease the gate-body capacitance of the MOSFET. This could result in a significant increase of the switching speed of the MOSFET.

Figure 9A:
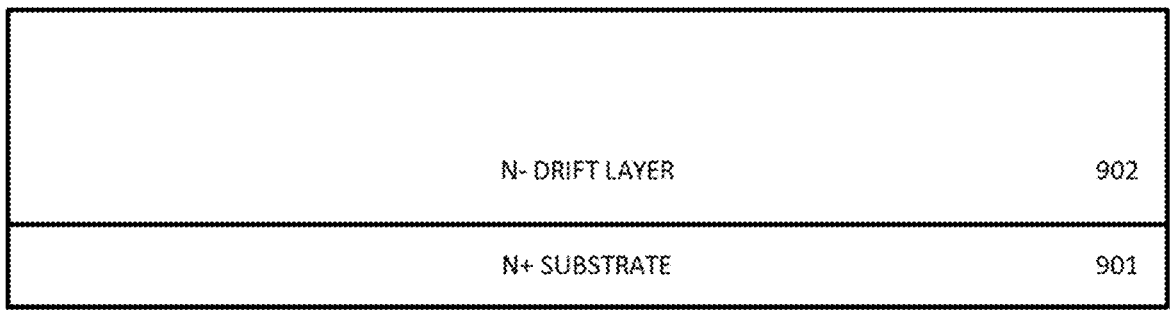
FIG. 9a to FIG. 9ff are cross sectional views showing the process steps for manufacturing the SiC DMOSFET structure in FIG. 8.
Figure 9B:
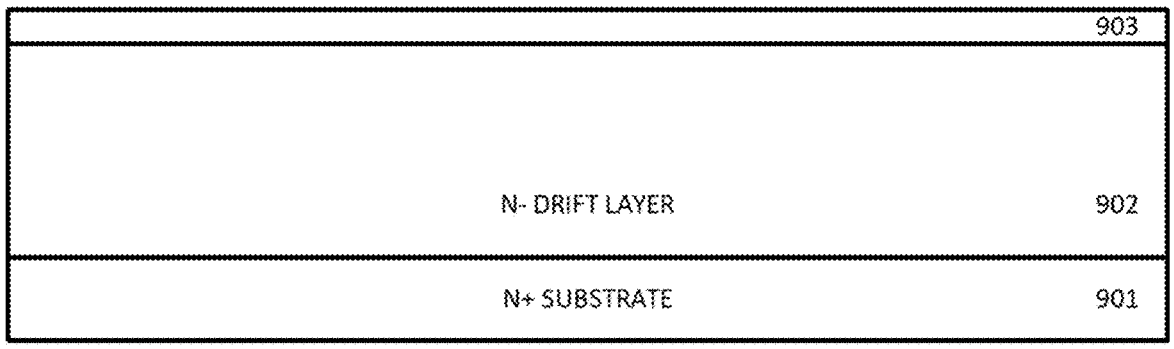
Figure 9C:
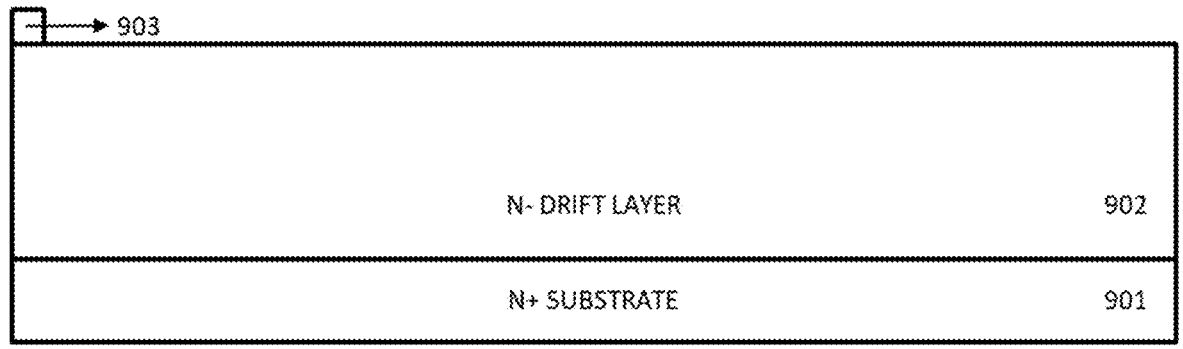
Figure 9D:
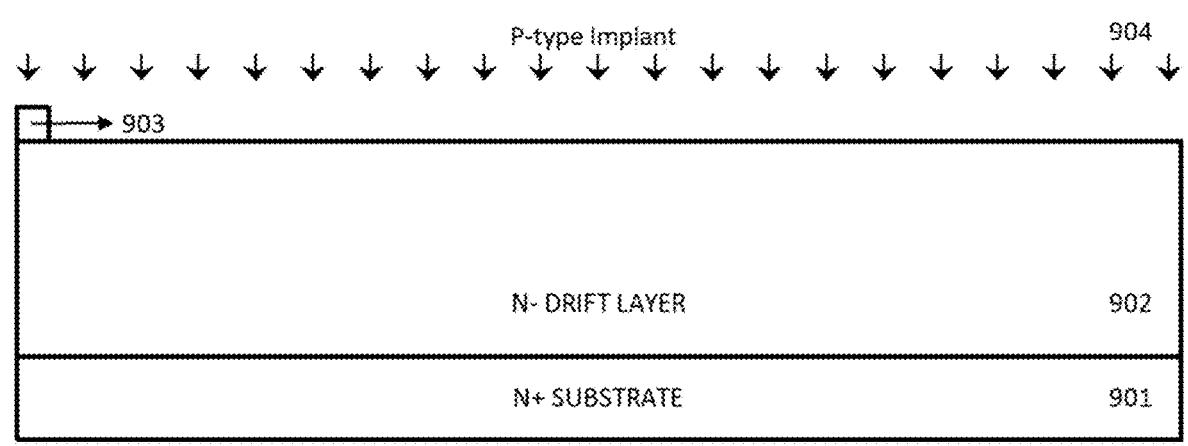
Figure 9E:
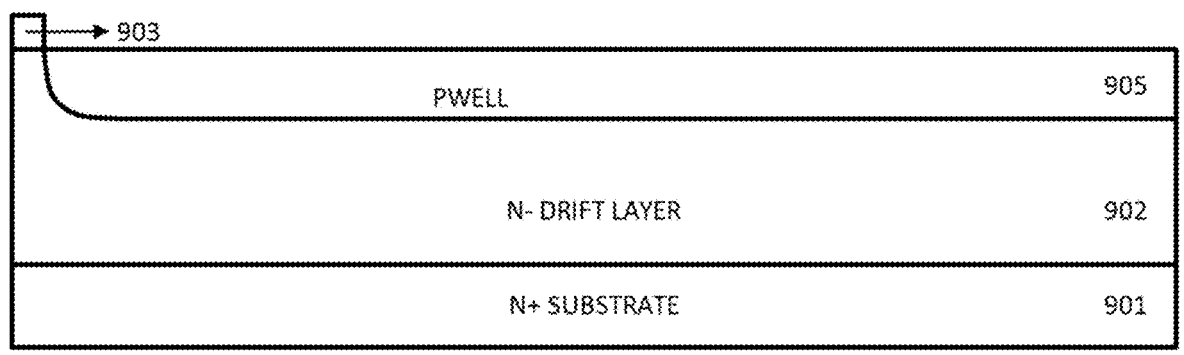

FIG. 9*a* to FIG. 9*ff* describes the process of manufacturing the structure shown in FIG. 8. The manufacturing process for a SiC DMOSFET is on a SiC substrate 901 and starts with using a 4H-SiC Si-face epi-wafer with suitable doping ($10^{14}$-$10^{18}$ cm$^{-3}$) and thickness (1 µm to 300 µm) for the epilayer 902 shown in FIG. 9*a*. A blanket hard mask 903 comprising a CVD deposited layer of silicon dioxide, silicon nitride, silicon oxynitride, or a metallic layer such as nickel, with thickness ranging from 50 nm to 5 µm is deposited in FIG. 9*b* and then patterned using photolithography followed by a dry etch using RIE for example as shown in FIG. 9*c*. Then p-well region is first formed by ion-implantation or epitaxial growth using aluminum or boron as the p-type impurity. A p-type implantation 904 comprising boron or aluminum, at energies ranging from 10 keV to 800 keV, at implant doses ranging from $10^{12}$ cm$^{-2}$ to $10^{15}$ cm$^{-2}$ in FIG. 9*d* is performed to create a p-well 905 in FIG. 9*e*.

Figure 9F:
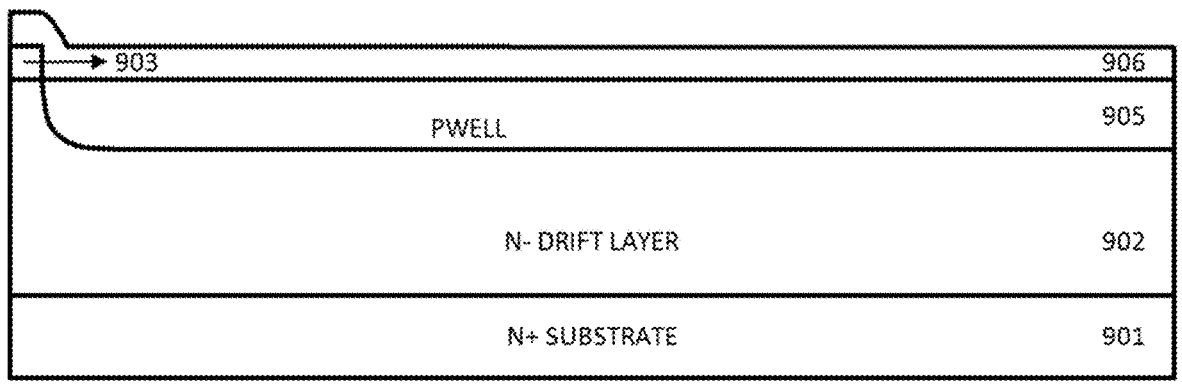
Figure 9G:
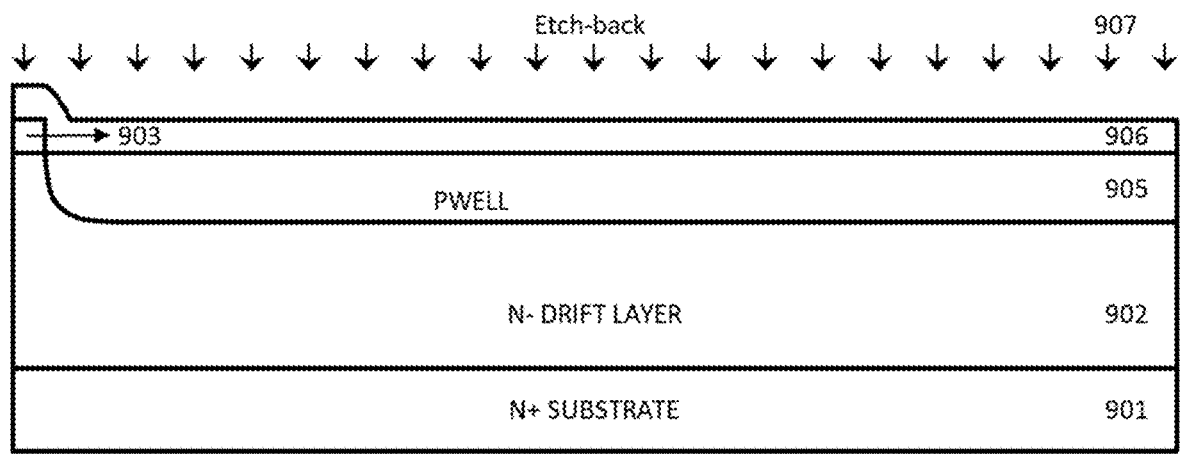
Figure 9H:
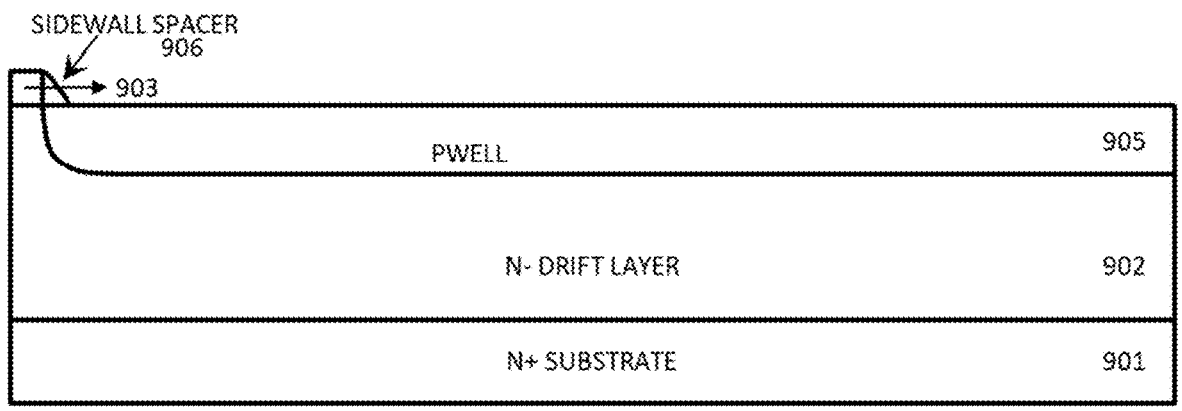
Figure 9I:
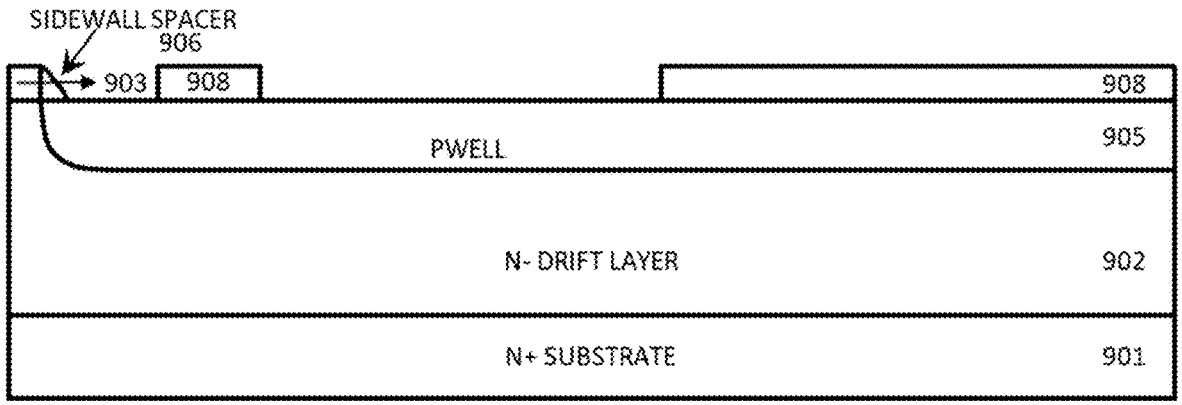
Figure 9J:
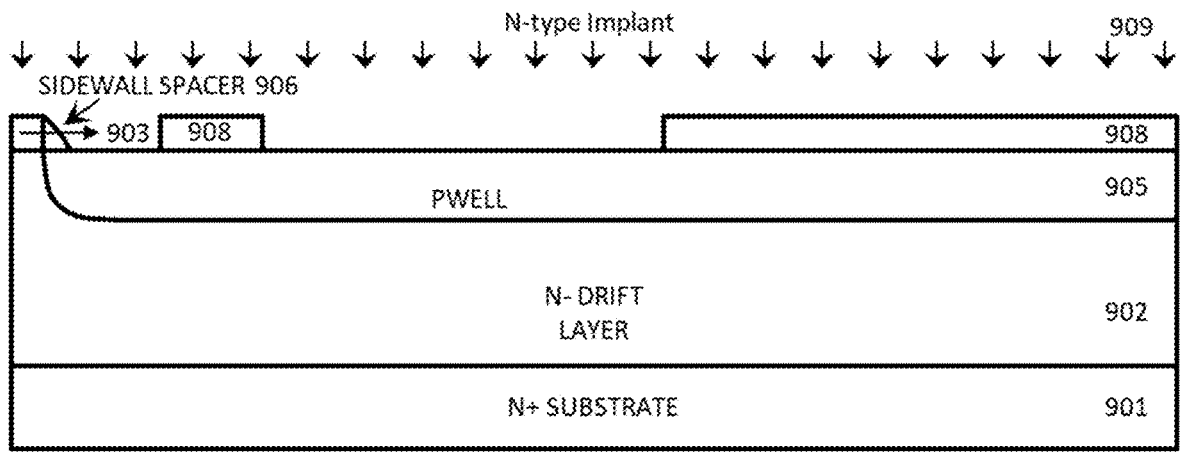
Figure 9K:
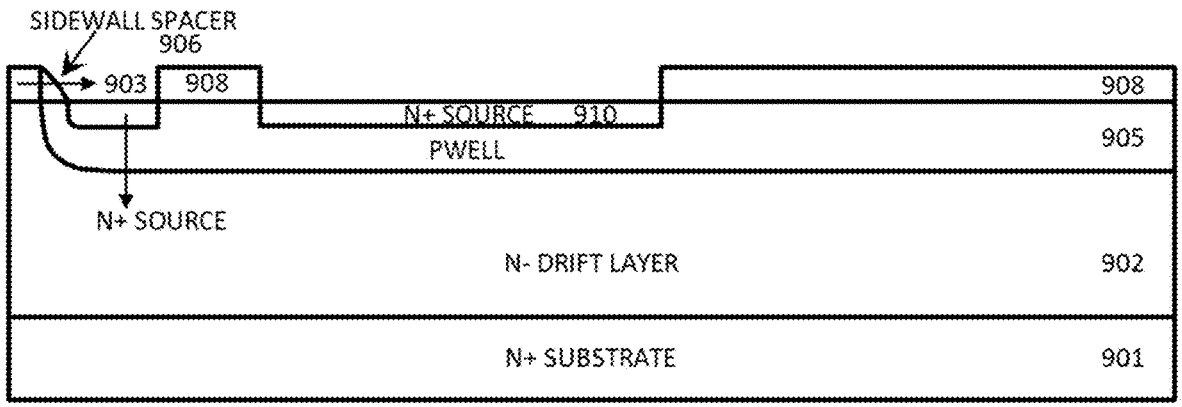
Figure 9L:
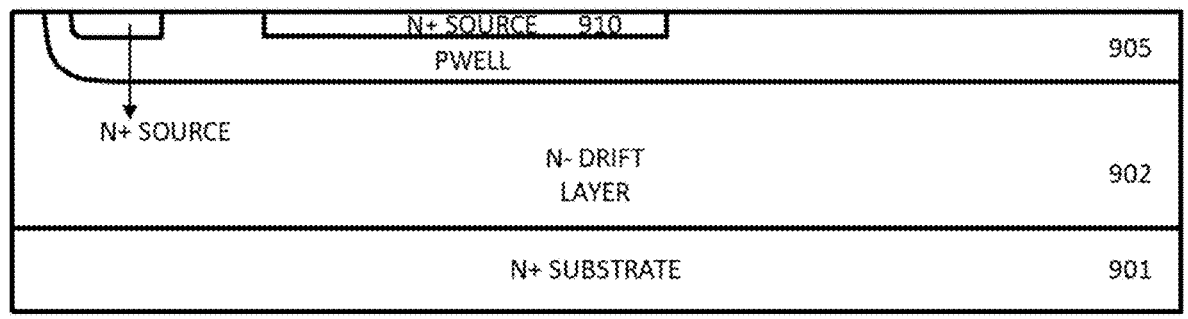
Figure 9M:
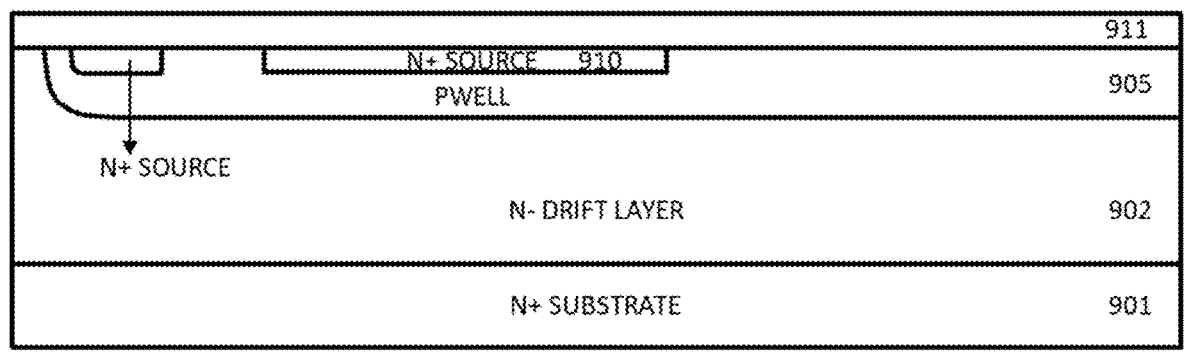
Figure 9N:
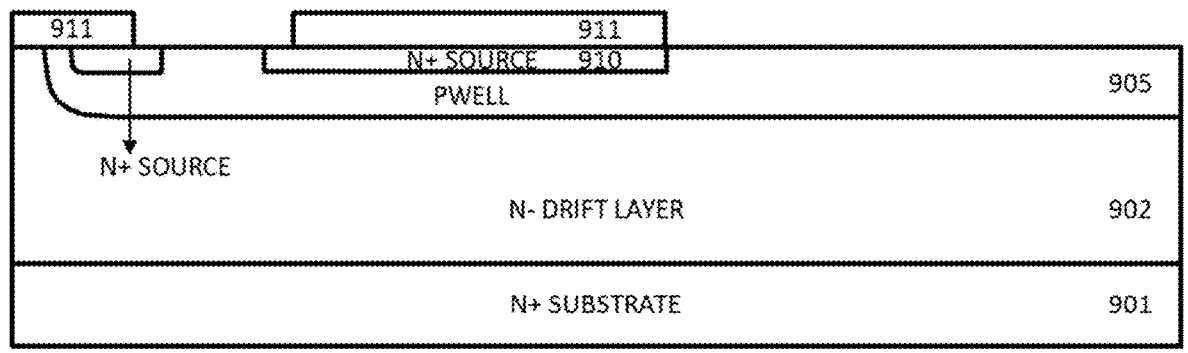

A second hard mask layer 906 is deposited by a CVD deposited layer of silicon dioxide, silicon nitride, silicon oxynitride, or a metallic layer such as nickel, with thickness ranging from 50 nm to 5 µm in FIG. 9*f* on top of the patterned first hard mask layer 903. This is followed by an anisotropic etching 907 in FIG. 9*g* to form a sidewall spacer 906 as shown in FIG. 9*h*. A hard mask layer 908 is deposited by a CVD deposited layer of silicon dioxide, silicon nitride, silicon oxynitride, or a metallic layer such as nickel, with thickness ranging from 50 nm to 5 μm and pattered in FIG. 9i. The patterned mask layer 908 is formed on the top alongside the patterned mask layer with the sidewall spacer. An n-type implant 909 is done in FIG. 9j for creating a N+ source region 910 in FIG. 9k. A N+ source region is formed by ion-implantation or by epitaxial re-growth by an n-type impurity such as nitrogen or phosphorus. Thus, the source region 910 is formed in a self-aligned fashion with the p-well region 905 while it is masked from the peripheral regions of the device, as well as selected areas of the active region of the device, to enable contact with the source ohmic metallization. The first and second hard mask layers 903 and 908 respectively, are removed in FIG. 9l. Another mask layer 911 is deposited by a CVD deposited layer of silicon dioxide, silicon nitride, silicon oxynitride, or a metallic layer such as nickel, with thickness ranging from 50 nm to 5 μm on the top in FIG. 9m. The mask layer 911 is patterned in FIG. 9n.

Figure 9O:
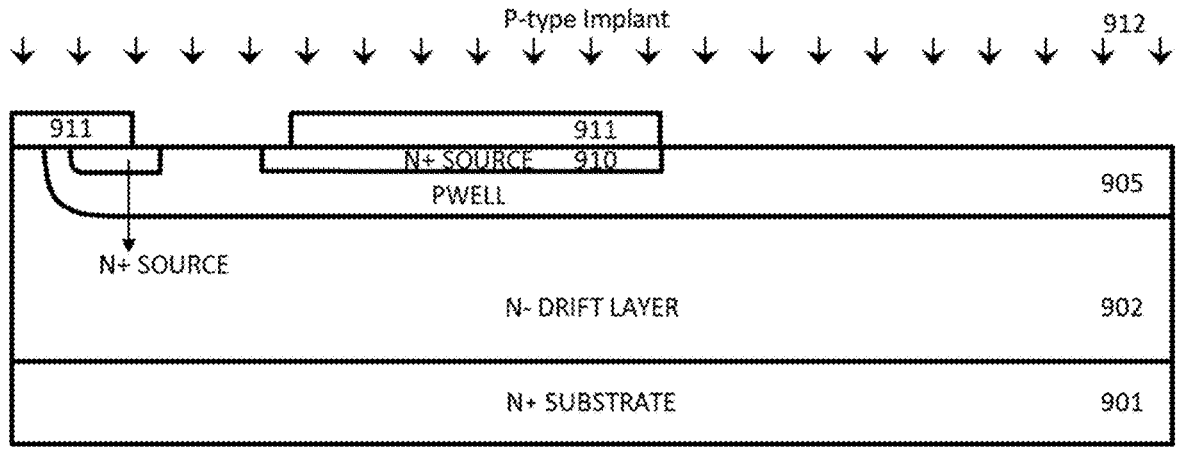
Figure 9P:
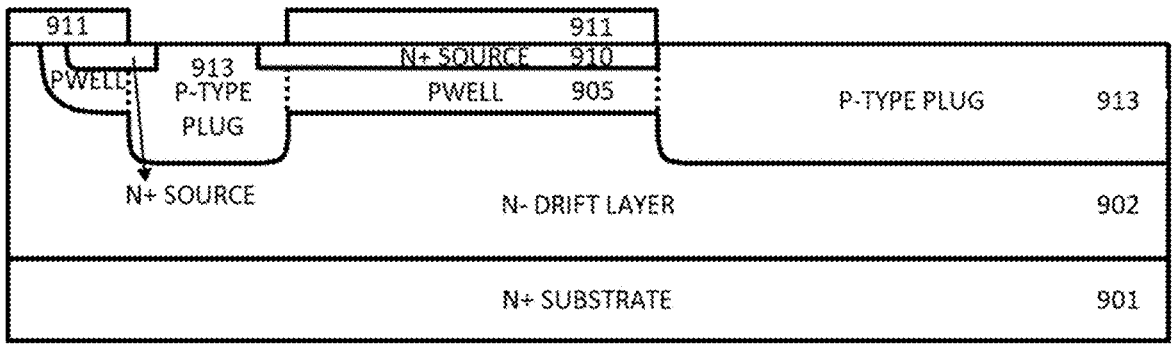
Figure 9Q:
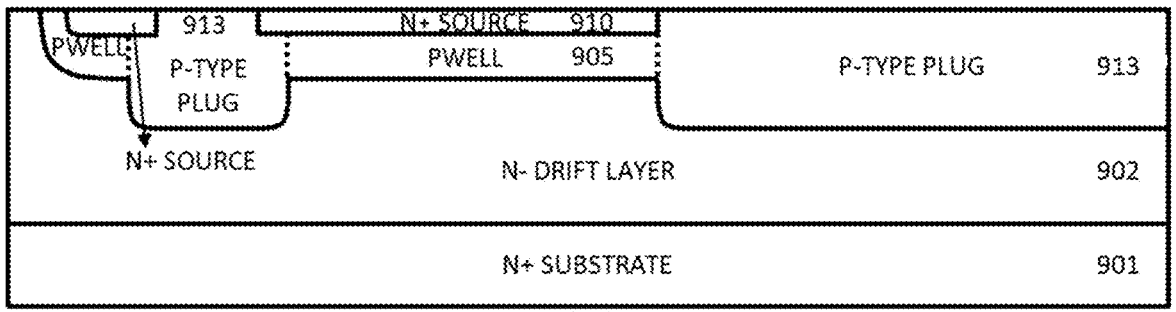

Using the hard mask 911 and by implantation of a controlled dose of a p-type impurity 912 like aluminum or boron in FIG. 9o a P+ plug region 913 is realized in FIG. 9p. The mask layer 911 is removed in FIG. 9q. The wafer is annealed for activating the implanted impurities.

Figure 9R:
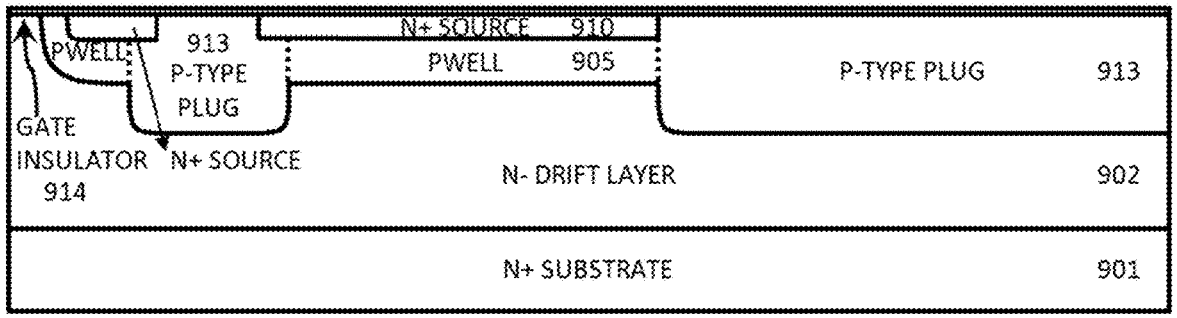
Figure 9S:
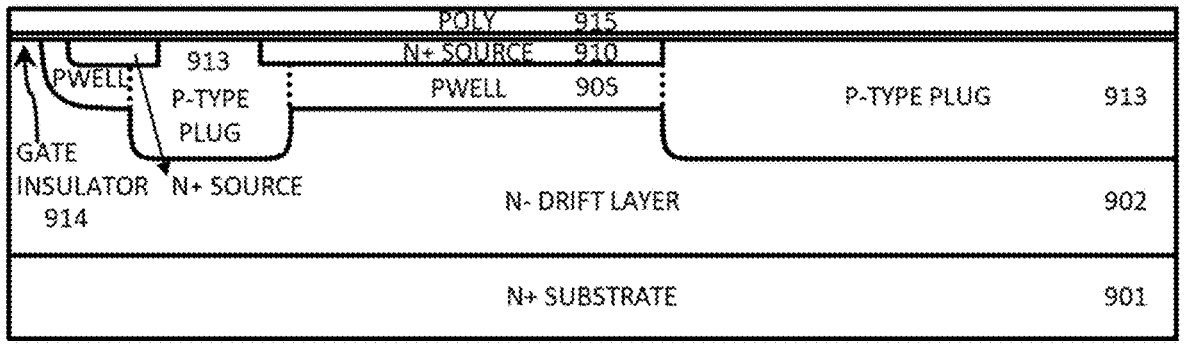
Figure 9T:
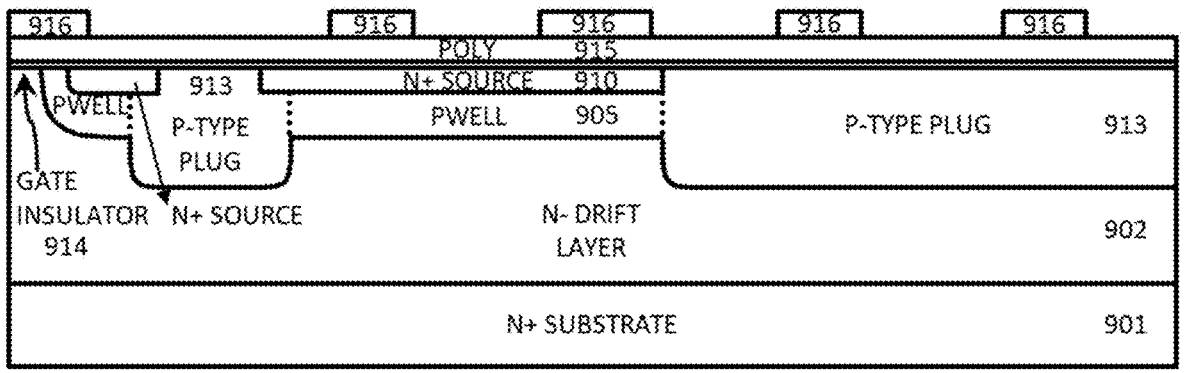
Figure 9U:
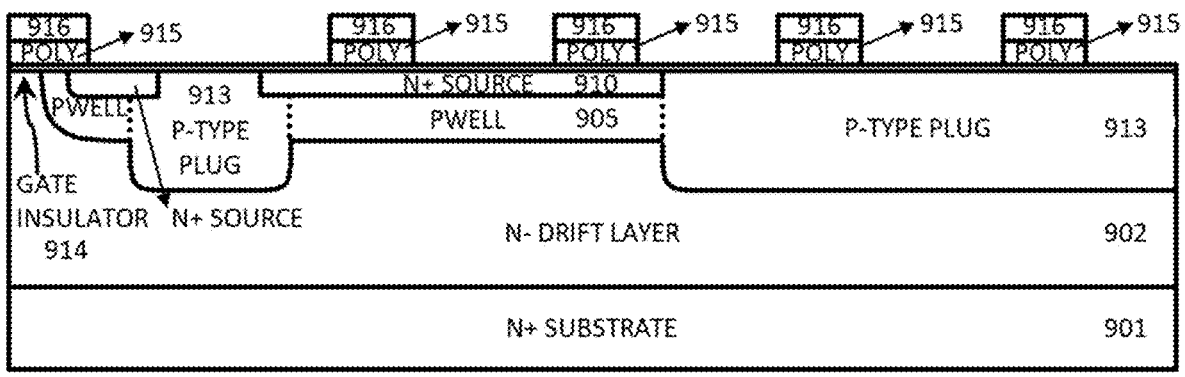
Figure 9V:
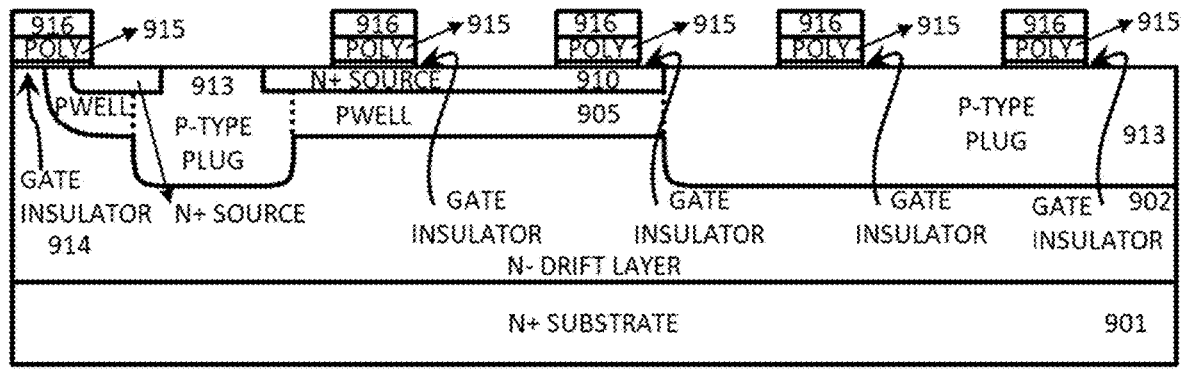
Figure 9W:
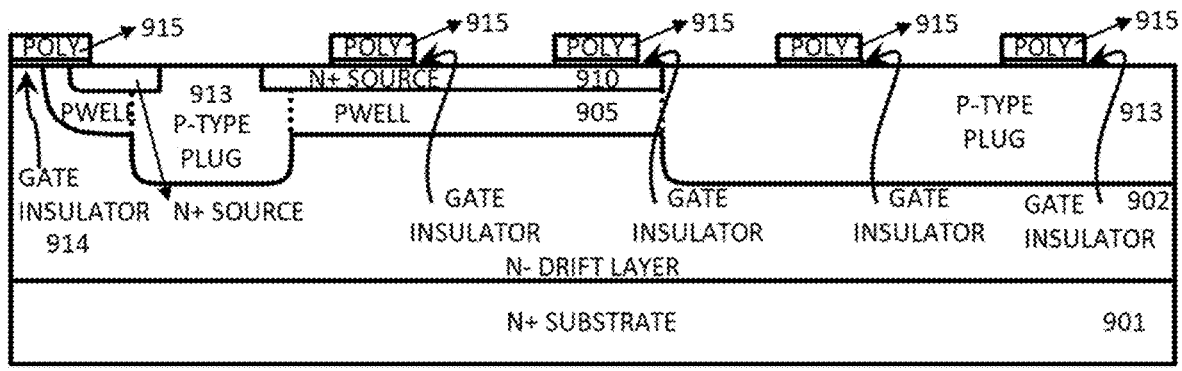
Figure 9X:
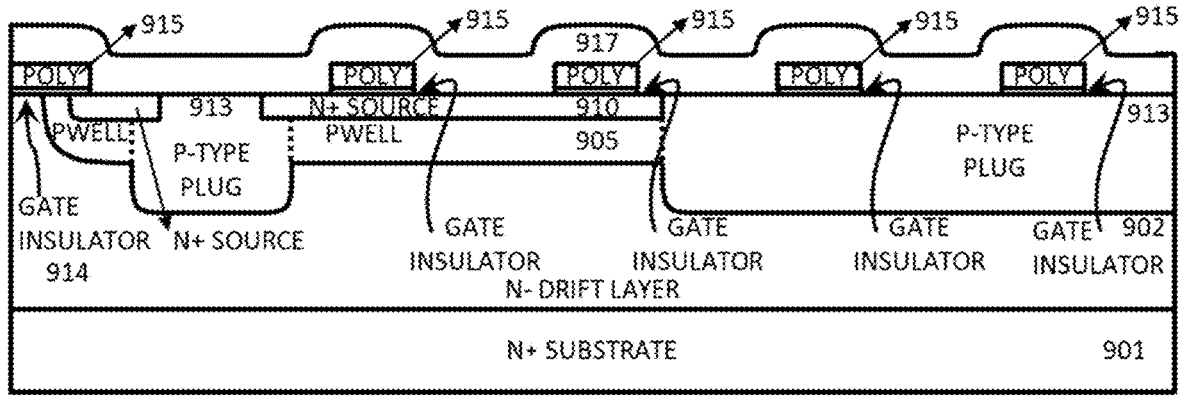

The oxide layer 914, which is the gate oxide, is formed by thermal oxidation or using CVD of a dielectric layer such as silicon dioxide, silicon nitride, silicon oxynitride, etc. in FIG. 9r. The thickness of the gate oxide could range from 10 nm to 100 nm. Either dry or wet thermal oxidation could be used for oxide growth. PECVD or LPCVD could be used for gate oxide deposition. A polysilicon gate layer 915 is then deposited in FIG. 9s. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl₃ followed by a drive-in step at temperatures ranging from 700-900° C. A hard mask 916 is deposited by a CVD deposited layer of silicon dioxide, silicon nitride, silicon oxynitride, or a metallic layer such as nickel, with thickness ranging from 50 nm to 5 μm on the top on top and patterned as shown in FIG. 9t. The polysilicon layer 915 is etched by using the patterned mask layer 916 in FIG. 9u. In the embodiment described herein, the masking step used to pattern the polysilicon gate metal, results in a partially segmented polysilicon pattern. While not apparent in the cross-sectional schematic, the disjointed gate fingers would be connected at a position orthogonal to the plane of the drawing. The gate insulator 914 is etched in FIG. 9v using the patterned mask 916. The mask layer 916 is then removed in FIG. 9w. An ILD layer 917 comprising 50 nm-1000 nm thick silicon dioxide, silicon nitride, silicon oxynitride layers or a stacked combination thereof is deposited on the wafer in FIG. 9x.

Figure 9Y:
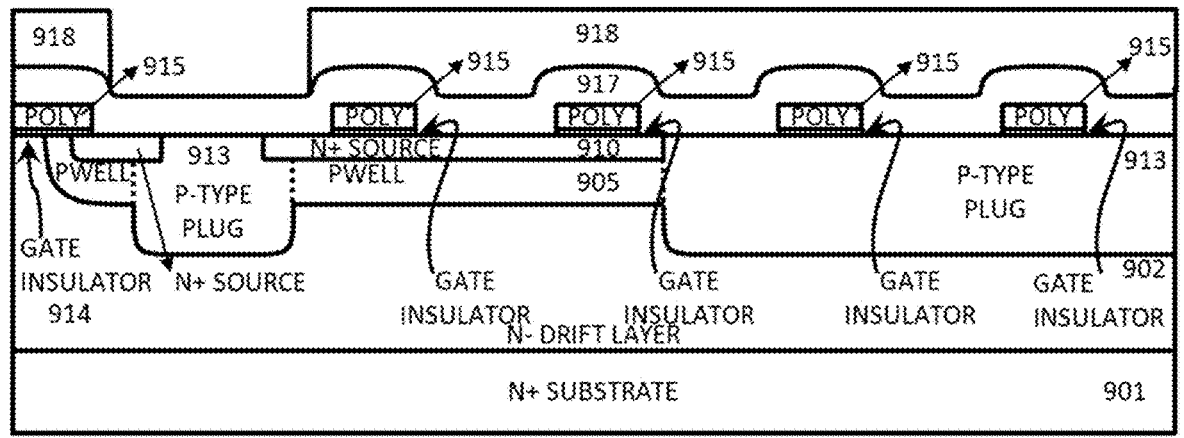
Figure 9Z:
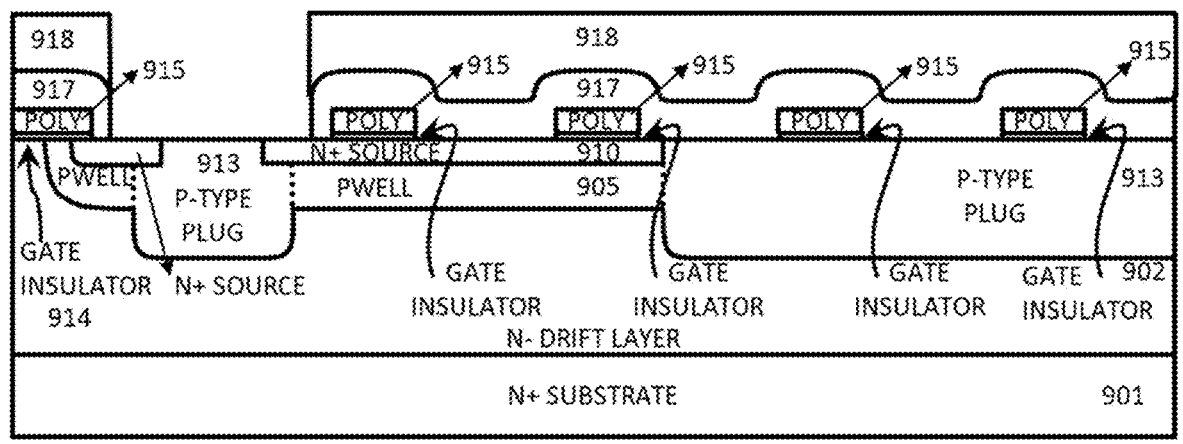
Figure 9A:
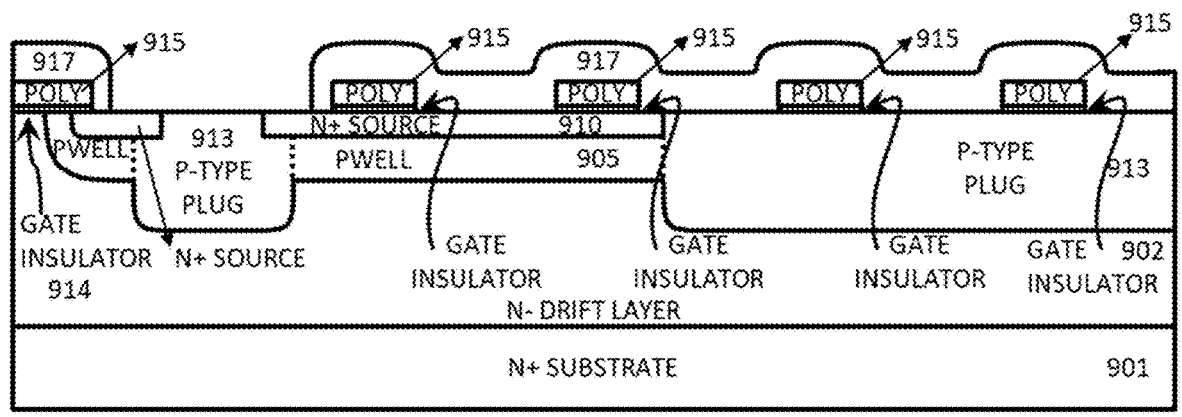
Figure 9B:
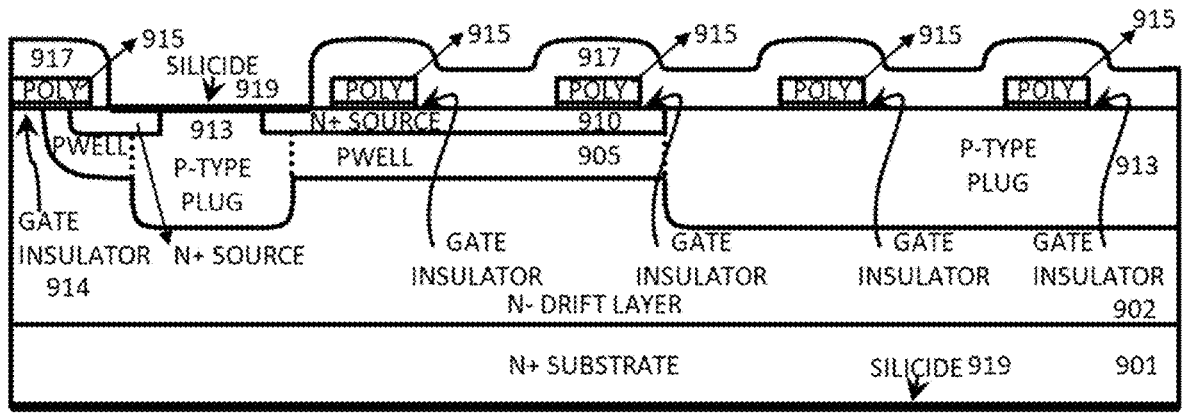
Figure 9C:
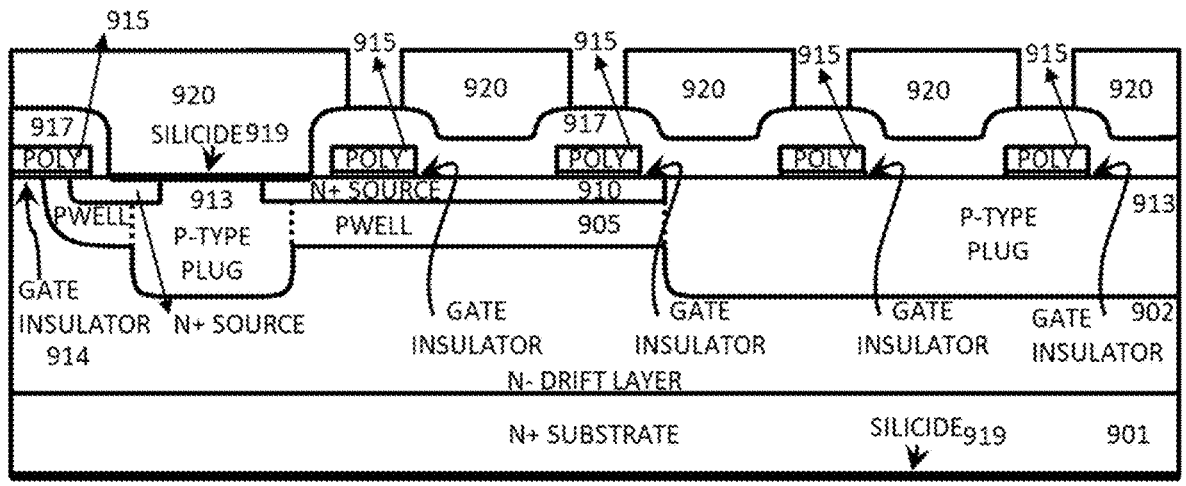
Figure 9D:
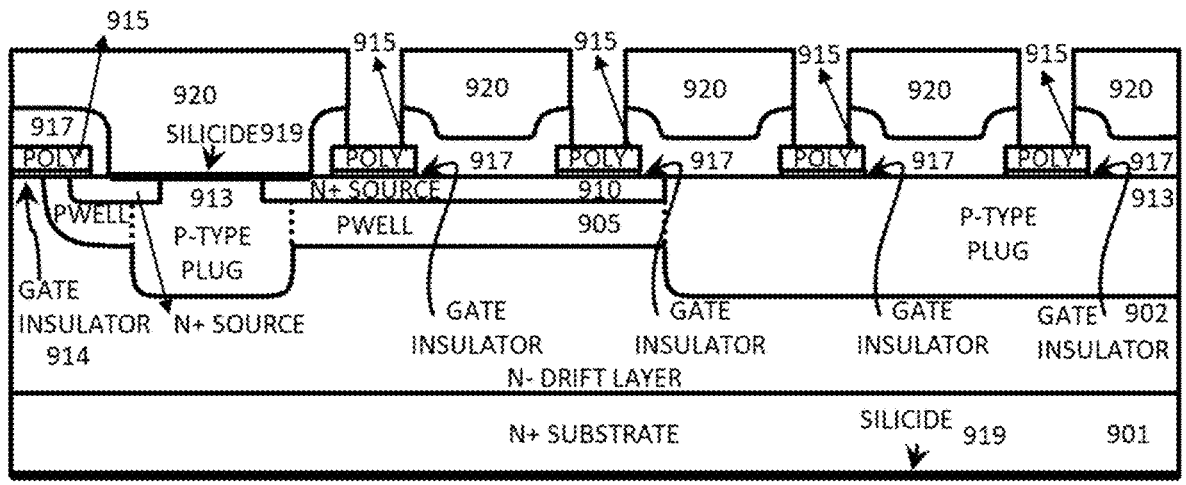
Figure 9E:
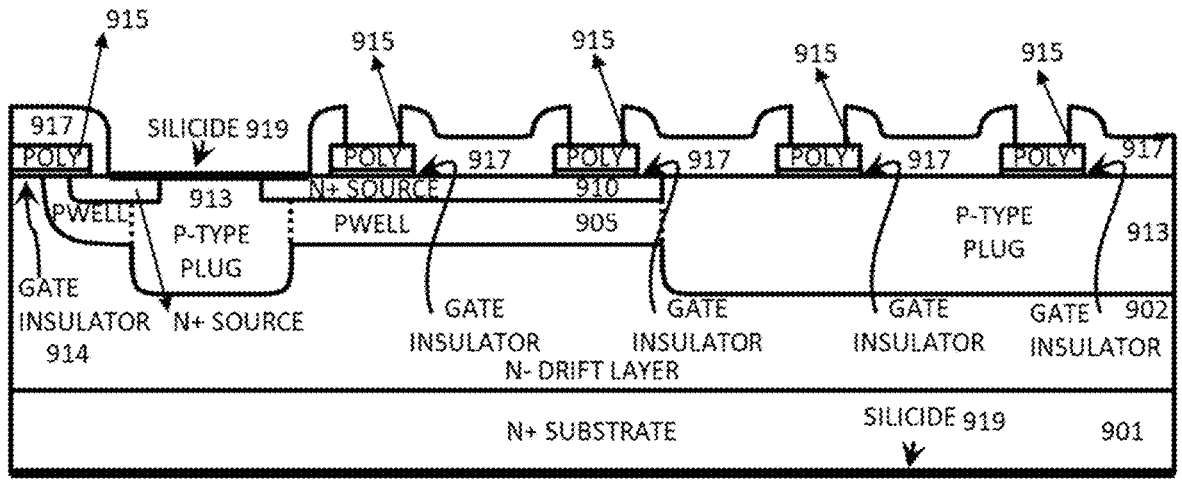
Figure 9F:
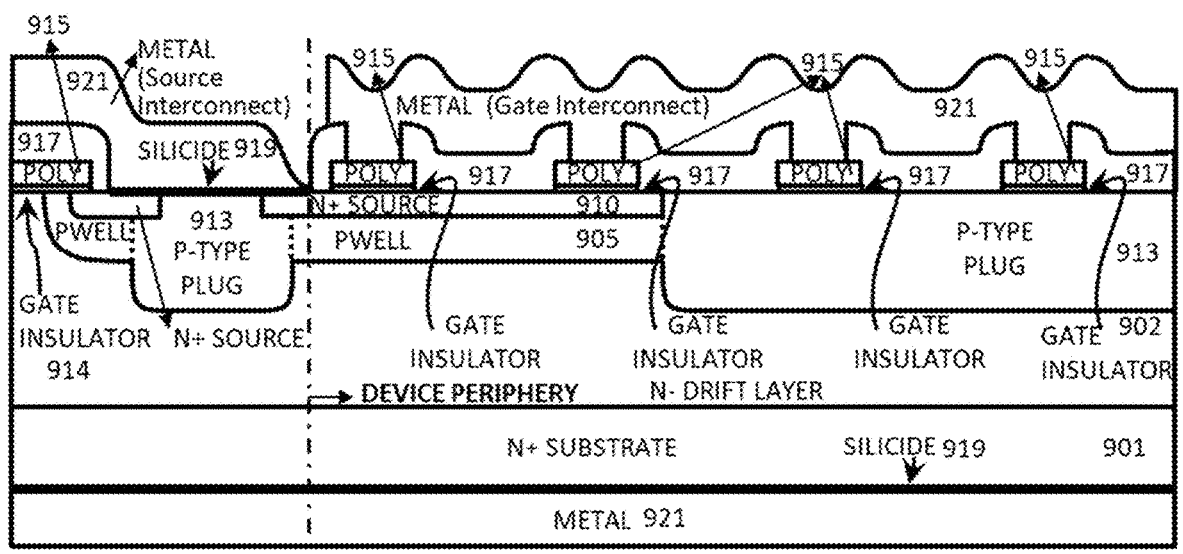

A hard mask 918 is deposited by a CVD deposited layer of silicon dioxide, silicon nitride, silicon oxynitride, or a metallic layer such as nickel, with thickness ranging from 50 nm to 5 μm on the top and patterned on top to define the ILD opening in FIG. 9y. The ILD layer 917 is etched using the hard mask as shown in FIG. 9z. The mask 918 is then removed in FIG. 9aa. A nickel silicide region 919 is formed on the exposed SiC surface in FIG. 9bb. A mask layer 920 is formed by a CVD deposited layer of silicon dioxide, silicon nitride, silicon oxynitride, or a metallic layer such as nickel, with thickness ranging from 50 nm to 5 μm on the top which is then patterned in FIG. 9cc. The ILD layer 917 is etched in FIG. 9dd. The mask layer 920 is removed in FIG. 9ee. Interconnect metal layers 921 of either aluminum or silver or gold is deposited and patterned on the top and bottom of the substrate in. FIG. 9ff.

Other embodiments are also within the scope of the following claims.

Although various embodiments which incorporate the teachings are described in detail herein, those skilled in the art can readily devise many other varied embodiments that still incorporate these teachings. For example, a complementary SiC MOSFET device with a P+ substrate, P– drift layer and P+ source can be created in a N-well region. The embodiments described are all applicable to the complementary MOSFET as well.

All documents (patents, patent publications or other publications) mentioned in the specification are incorporated herein in their entirety by reference.

What is claimed is:

1. A semiconductor device comprising a unit cell, the unit cell comprising:
a first conductivity type source region formed self-aligned within a second conductivity type first well region; a source trench extending through the first conductivity type source region and through at least a portion of the second conductivity type first well region, wherein the source trench is defined between a first vertical sidewall and a second vertical sidewall; a second conductivity type plug region positioned below the second conductivity type first well region and defined between a left boundary and a right boundary, wherein the first vertical sidewall is aligned with the left boundary and wherein the second vertical sidewall is aligned with the right boundary; and a silicide layer in contact with the first vertical sidewall and the second vertical sidewall; wherein an active region is defined on a left side of a vertically oriented boundary extending through a thickness of the unit cell and a peripheral region is defined on a right side of the vertically oriented boundary, wherein the active region comprises a channel through which current carriers passes and wherein the source trench is entirely defined within the active region.

2. The semiconductor device of claim 1, further comprising a second conductivity type second well region.

3. The semiconductor device of claim 2, wherein a depth of the second conductivity type second well region is greater than a depth of the second conductivity type first well region.

4. The semiconductor device of claim 2, wherein the second conductivity type second well region is formed below the first conductivity type source region.

5. The semiconductor device of claim 1, further comprising a gate oxide layer and a source interconnect layer, wherein the semiconductor device is a silicon carbide metal oxide semiconductor field effect transistor (MOSFET).

6. The semiconductor device of claim 1, wherein the second conductivity type second well region is below the second conductivity type first well region.

7. The semiconductor device of claim 1, further comprising: a gate insulator layer, and a gate metal layer comprising a heavily doped polysilicon layer.

8. The semiconductor device of claim 1, further comprising a first conductivity type substrate.

9. The semiconductor device of claim 1, further comprising a first conductivity type drift layer.

* * * * *